(12) United States Patent
Huang et al.

(10) Patent No.: US 12,543,566 B2
(45) Date of Patent: Feb. 3, 2026

(54) SEMICONDUCTOR DEVICES AND METHOD FOR FORMING THE SAME

(71) Applicant: TAIWAN SEMICONDUCTOR MANUFACTURING CO., LTD., Hsinchu (TW)

(72) Inventors: Wen-Sheh Huang, Hsinchu (TW); Yung-Shih Cheng, Hsinchu (TW); Jiing-Feng Yang, Hsinchu County (TW); Yu-Hsiang Chen, Hsinchu (TW); Chii-Ping Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 21 days.

(21) Appl. No.: 18/475,076

(22) Filed: Sep. 26, 2023

(65) Prior Publication Data

US 2024/0021494 A1  Jan. 18, 2024

Related U.S. Application Data

(62) Division of application No. 17/217,868, filed on Mar. 30, 2021, now Pat. No. 12,165,947.

(Continued)

(51) Int. Cl.
| | |
|---|---|
| *H01L 23/373* | (2006.01) |
| *H01L 21/02* | (2006.01) |
| *H01L 21/48* | (2006.01) |
| *H01L 21/768* | (2006.01) |
| *H01L 23/522* | (2006.01) |

(Continued)

(52) U.S. Cl.
CPC .... *H01L 23/3731* (2013.01); *H01L 21/02603* (2013.01); *H01L 21/4807* (2013.01); *H01L 21/76895* (2013.01); *H01L 23/5228* (2013.01); *H01L 23/535* (2013.01); *H10D 30/031* (2025.01); *H10D 30/6713* (2025.01); *H10D 30/6729* (2025.01); *H10D 30/6735* (2025.01);

(Continued)

(58) Field of Classification Search
CPC .......... H01L 23/3731; H01L 21/02603; H01L 21/4807; H01L 21/76895; H01L 23/5228; H01L 23/535; H10D 30/031; H10D 30/6713; H10D 30/6729; H10D 30/6735; H10D 30/6757; H10D 62/121
See application file for complete search history.

(56) References Cited

U.S. PATENT DOCUMENTS

2020/0144154 A1   5/2020  Troska et al.
2020/0243455 A1 *  7/2020  Wang ...................... H01L 24/09

(Continued)

*Primary Examiner* — Jay C Kim
*Assistant Examiner* — Woo K Lee
(74) *Attorney, Agent, or Firm* — Maschoff Brennan

(57) ABSTRACT

A method includes forming a transistor over a front side of a substrate, in which the transistor comprises a channel region, a gate region over the channel region, and source/drain regions on opposite sides of the gate region; forming a front-side interconnect structure over the transistor, wherein the front-side interconnect structure includes a dielectric layer and conductive features; and bonding the front-side interconnect structure to a carrier substrate via a bonding layer, in which the bonding layer is between the front-side interconnect structure and the carrier substrate, and the bonding layer has a higher thermal conductivity than the dielectric layer of the front-side interconnect structure.

20 Claims, 54 Drawing Sheets

Related U.S. Application Data

(60) Provisional application No. 63/057,219, filed on Jul. 27, 2020.

(51) Int. Cl.
    *H01L 23/535*     (2006.01)
    *H10D 30/01*     (2025.01)
    *H10D 30/67*     (2025.01)
    *H10D 62/10*     (2025.01)

(52) U.S. Cl.
    CPC ....... *H10D 30/6757* (2025.01); *H10D 62/121* (2025.01)

(56) References Cited

U.S. PATENT DOCUMENTS

| | | | |
|---|---|---|---|
| 2021/0028087 A1* | 1/2021 | Kothari | ................. H01L 23/367 |
| 2022/0013430 A1* | 1/2022 | Liao | ................... H01L 23/3735 |

\* cited by examiner

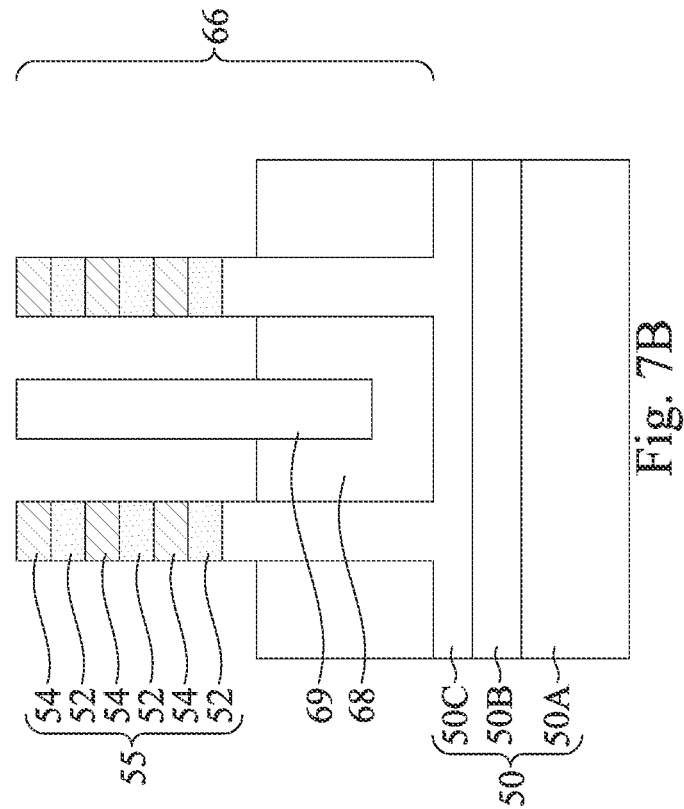
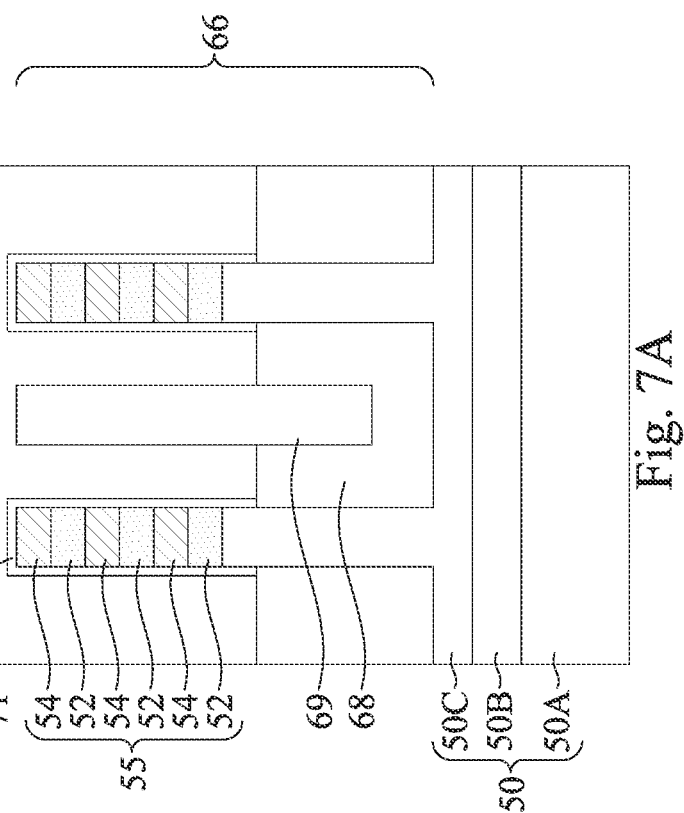

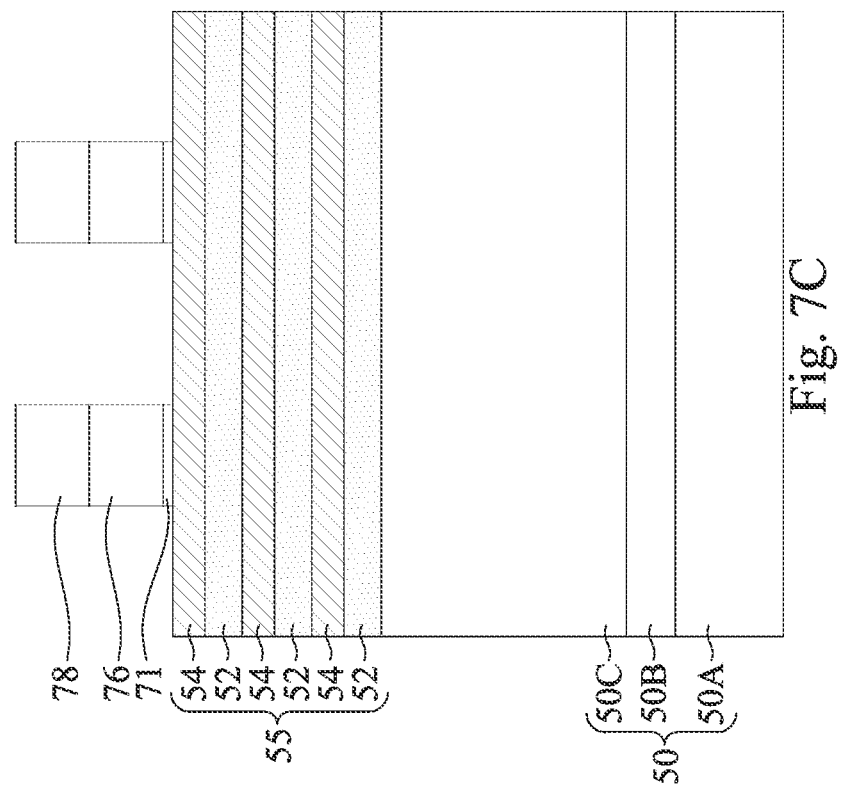

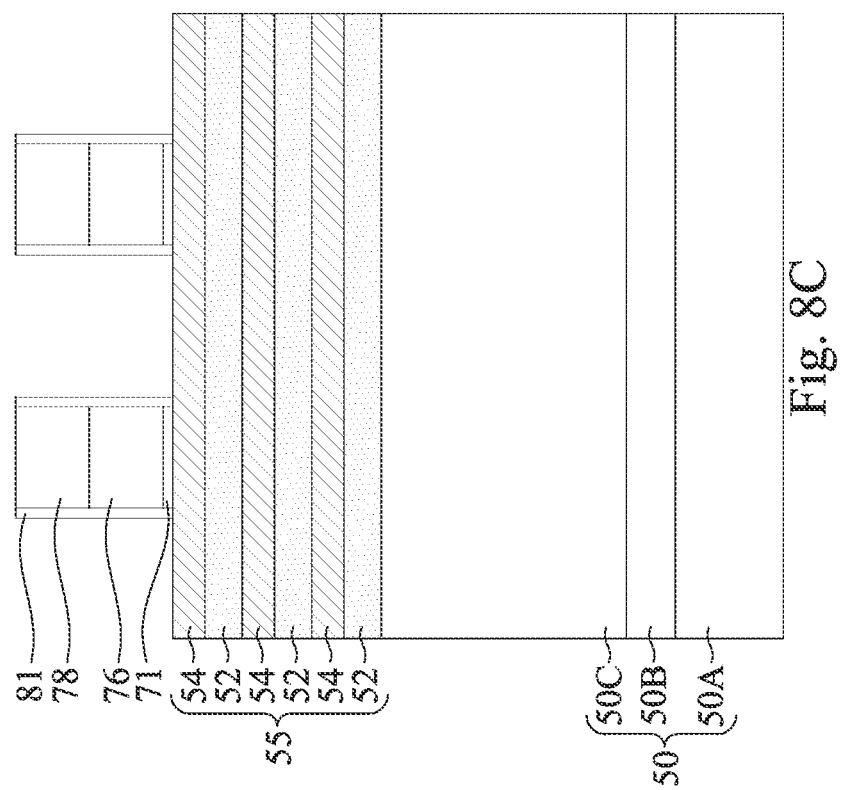

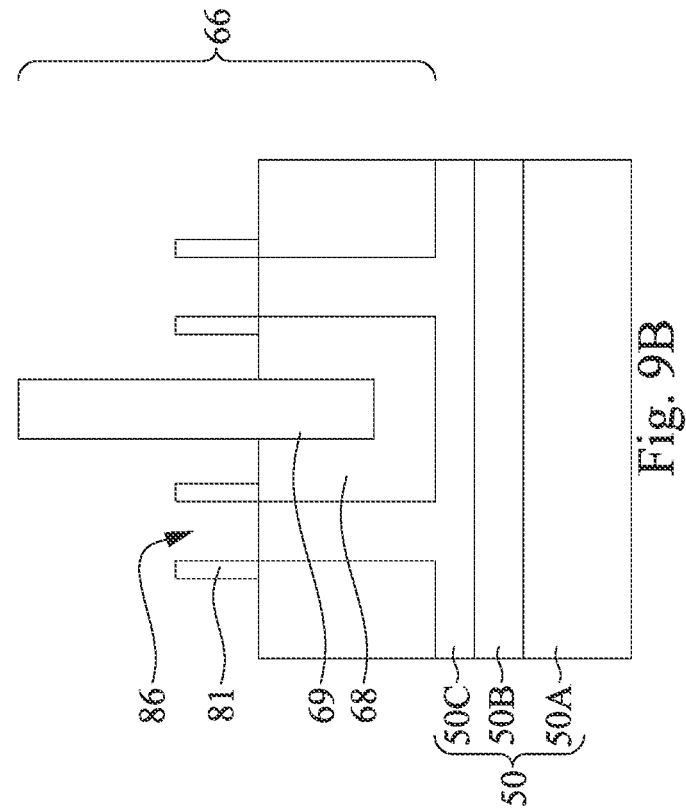
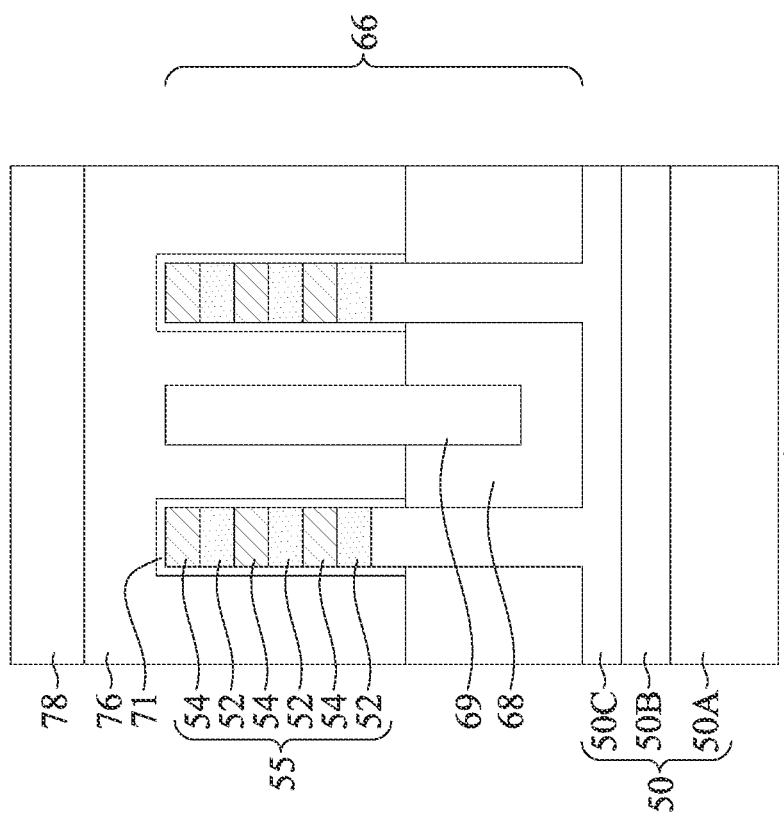

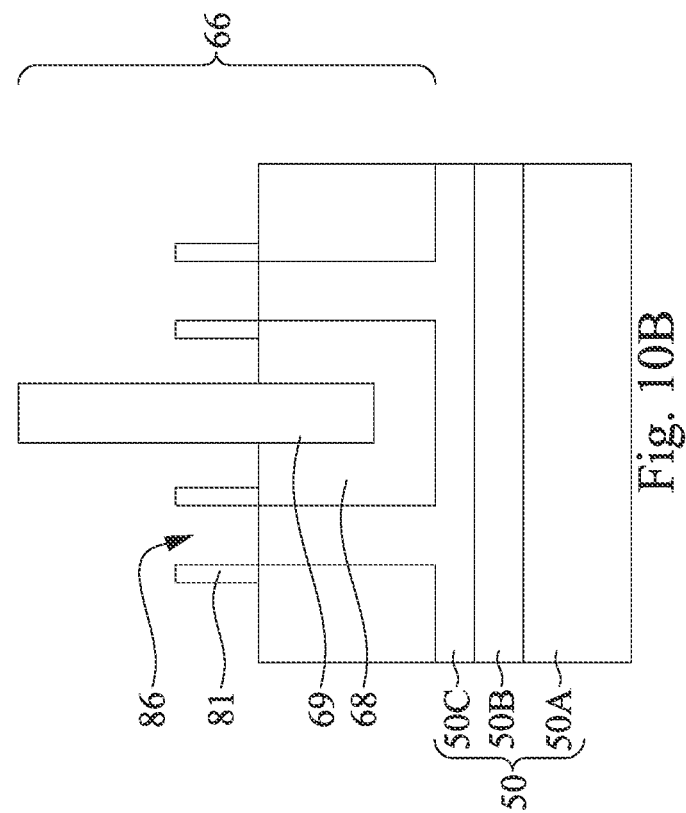
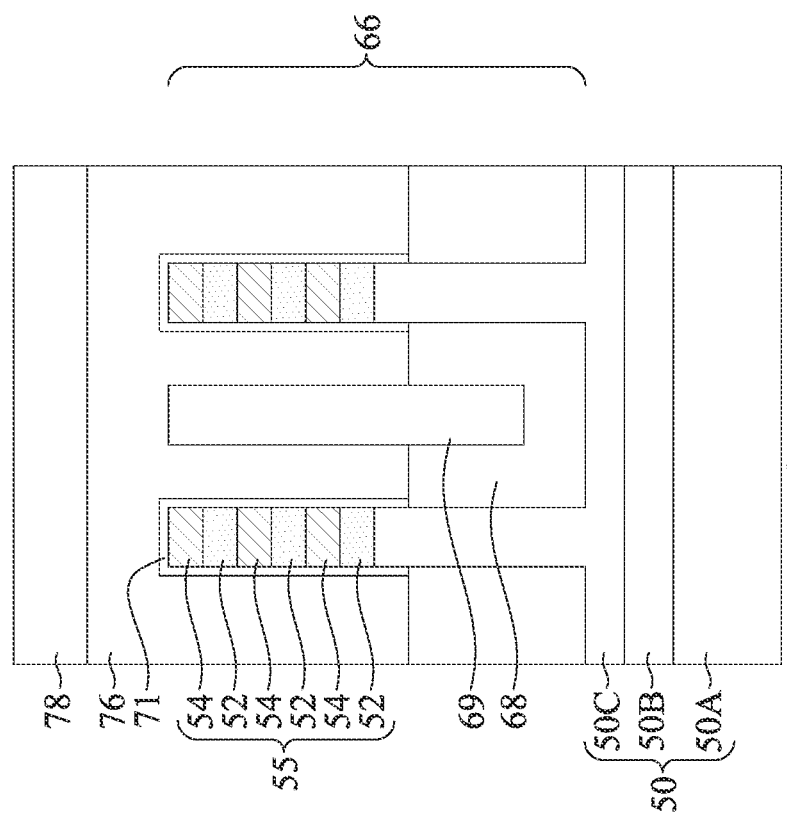

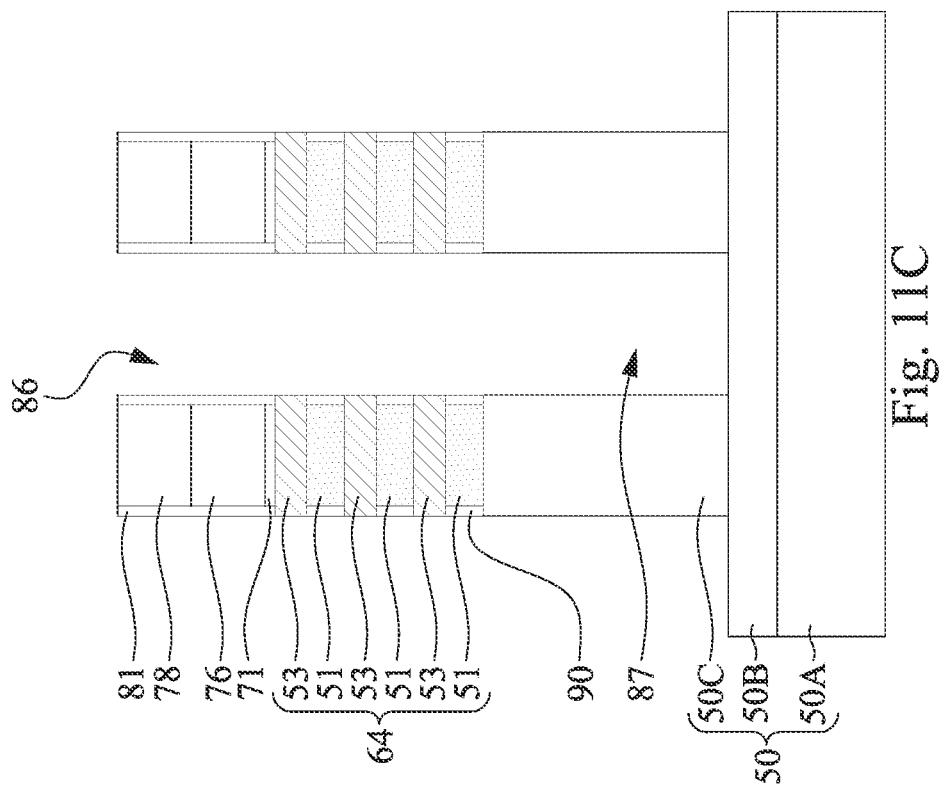

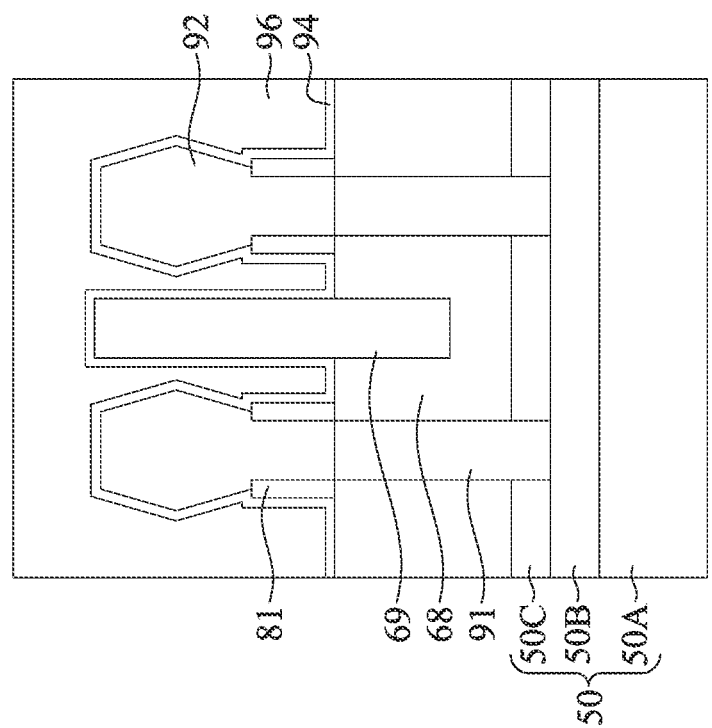
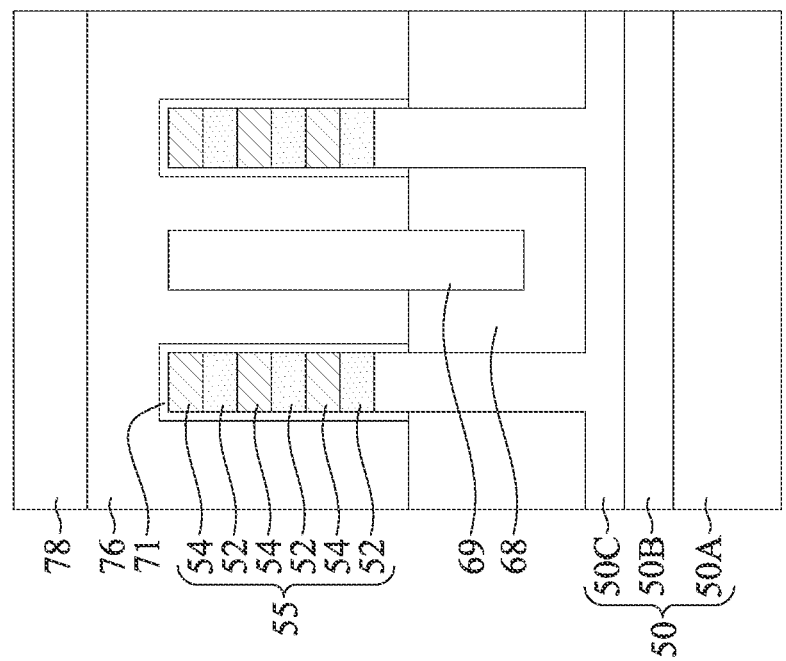
Fig. 14A
Fig. 14B

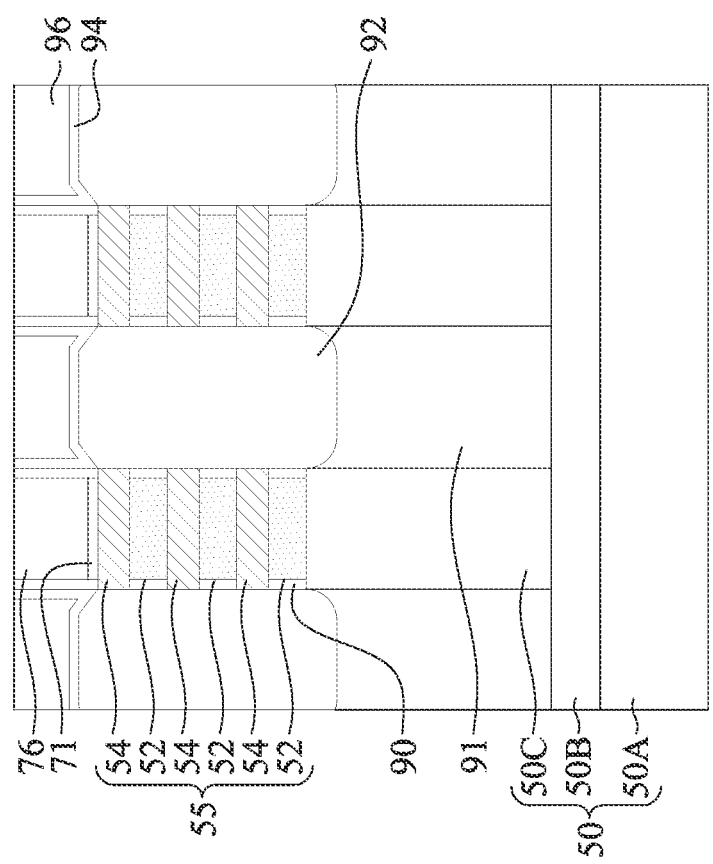

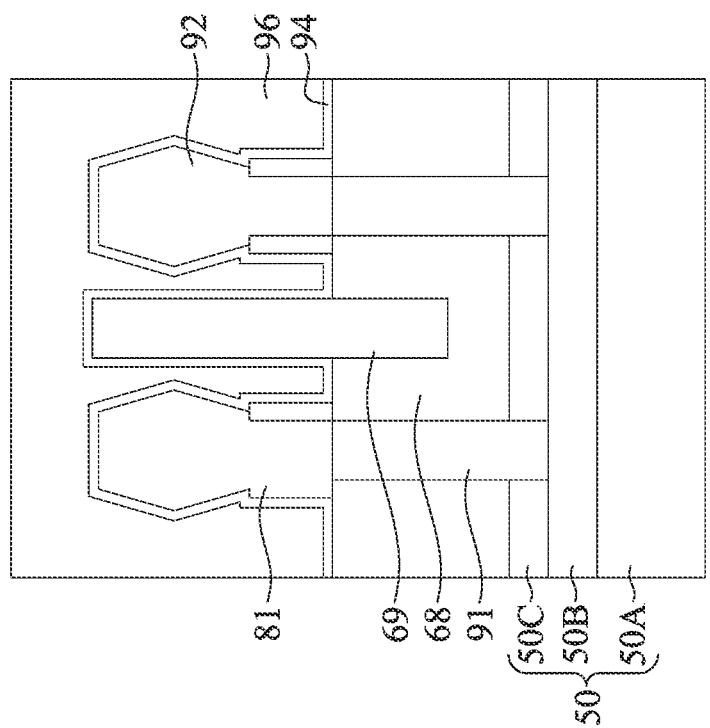
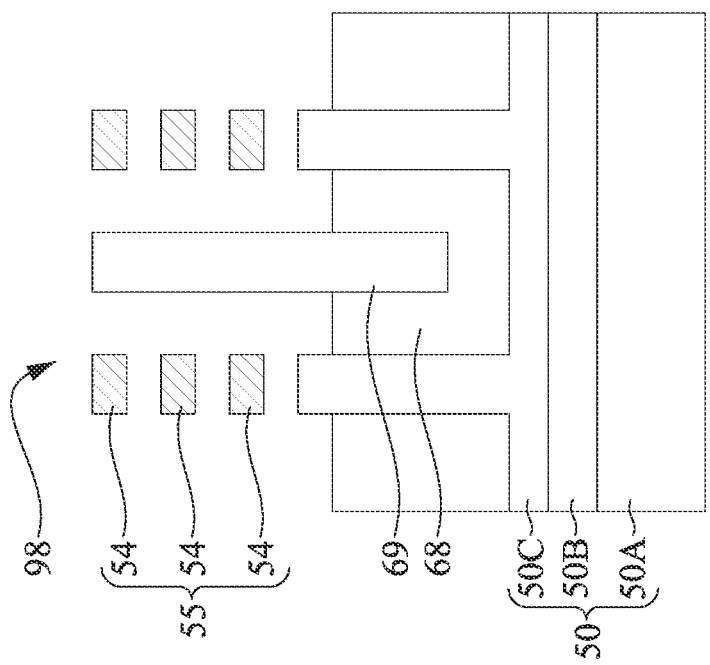

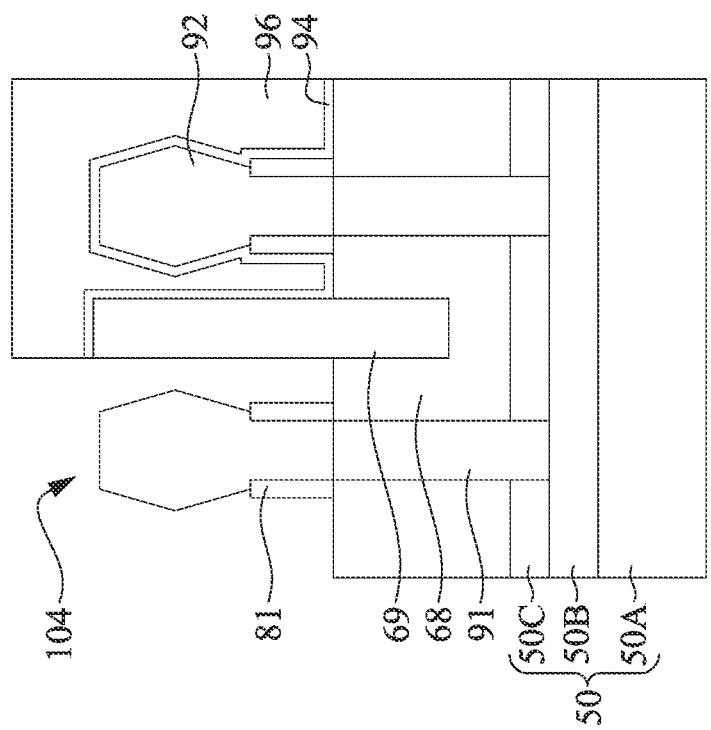
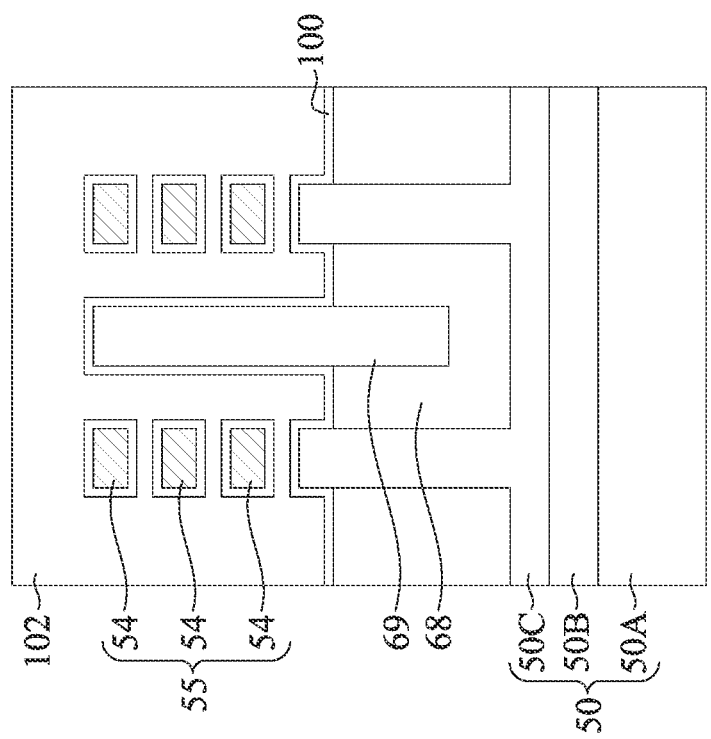
Fig. 17A
Fig. 17B

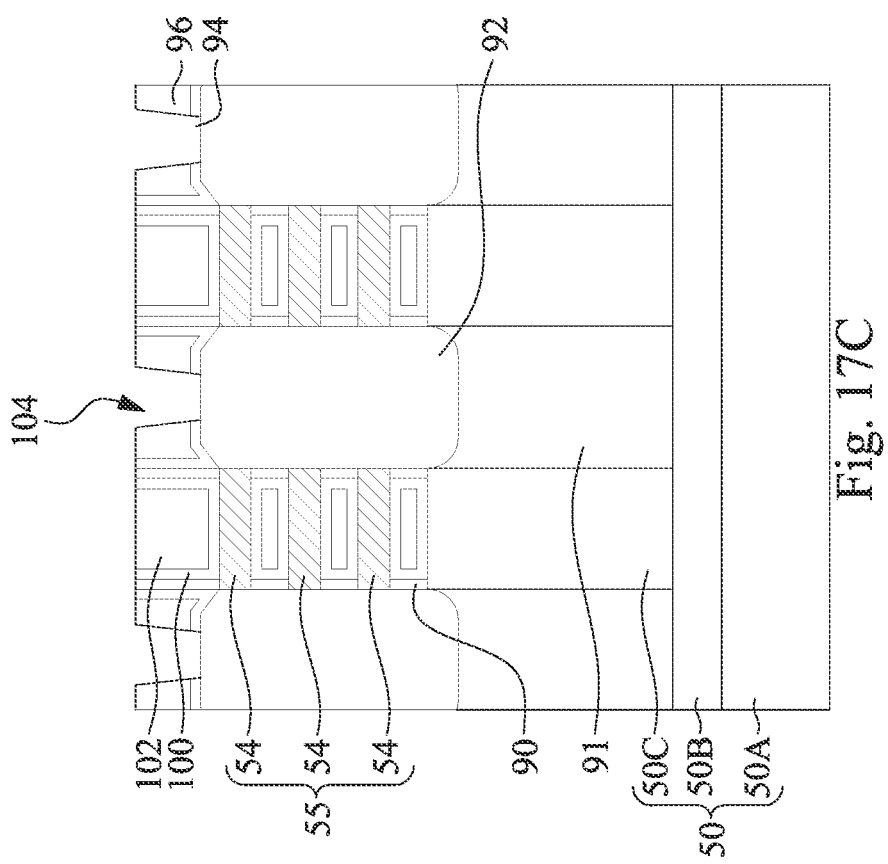

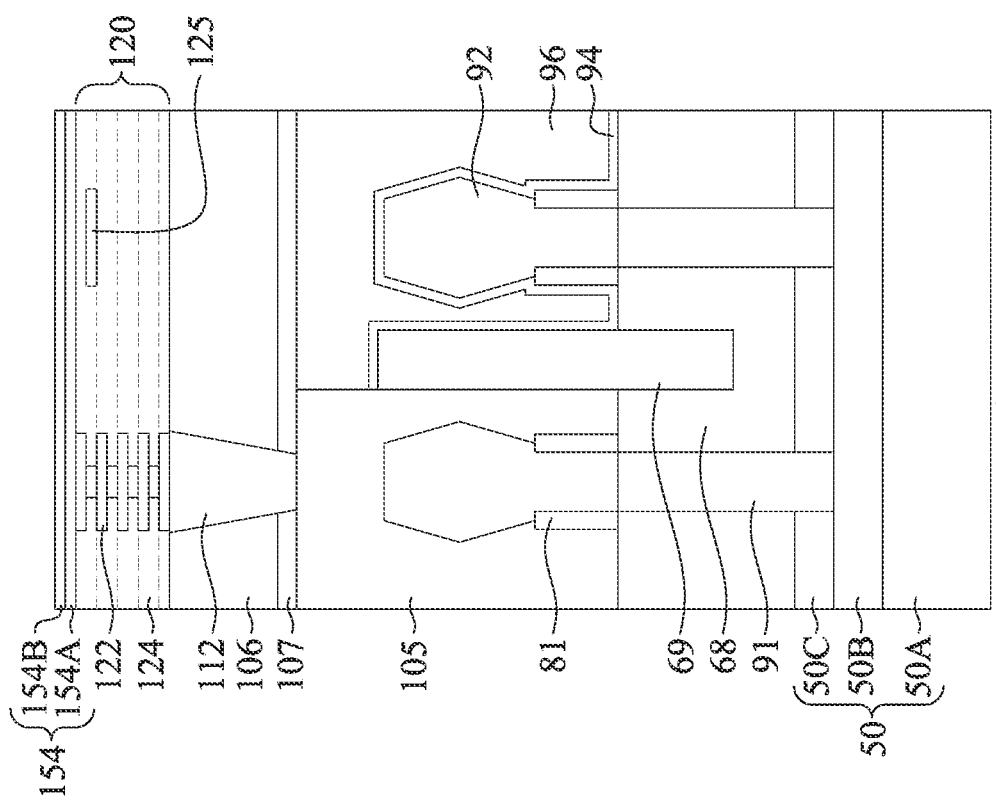
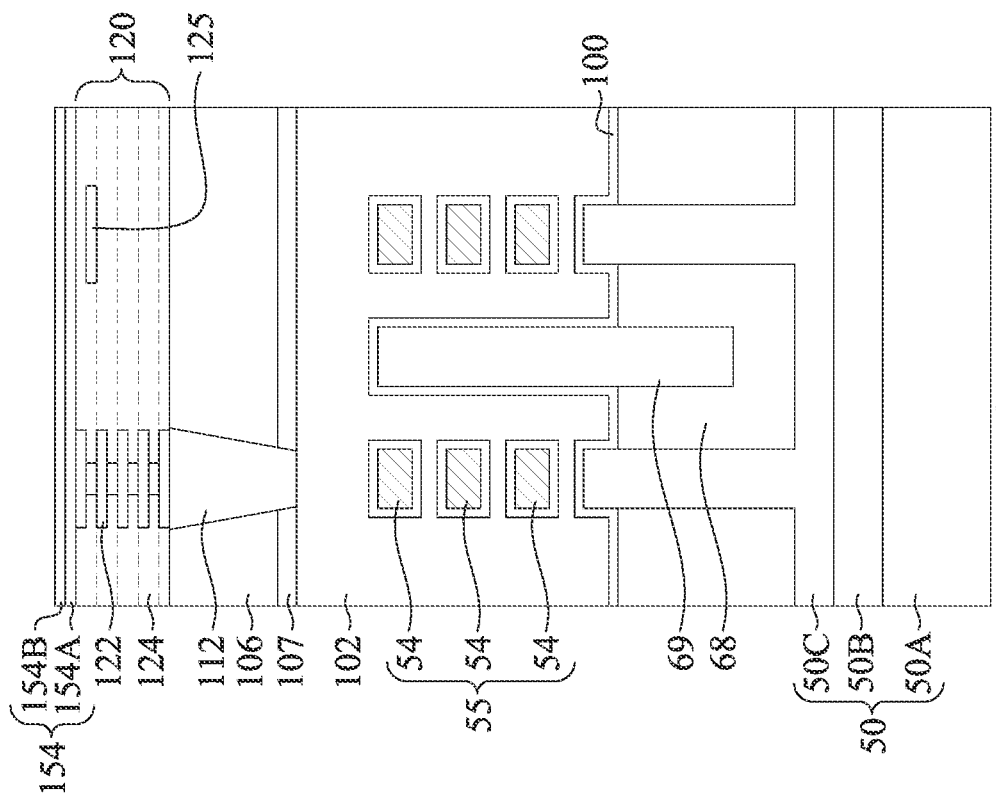

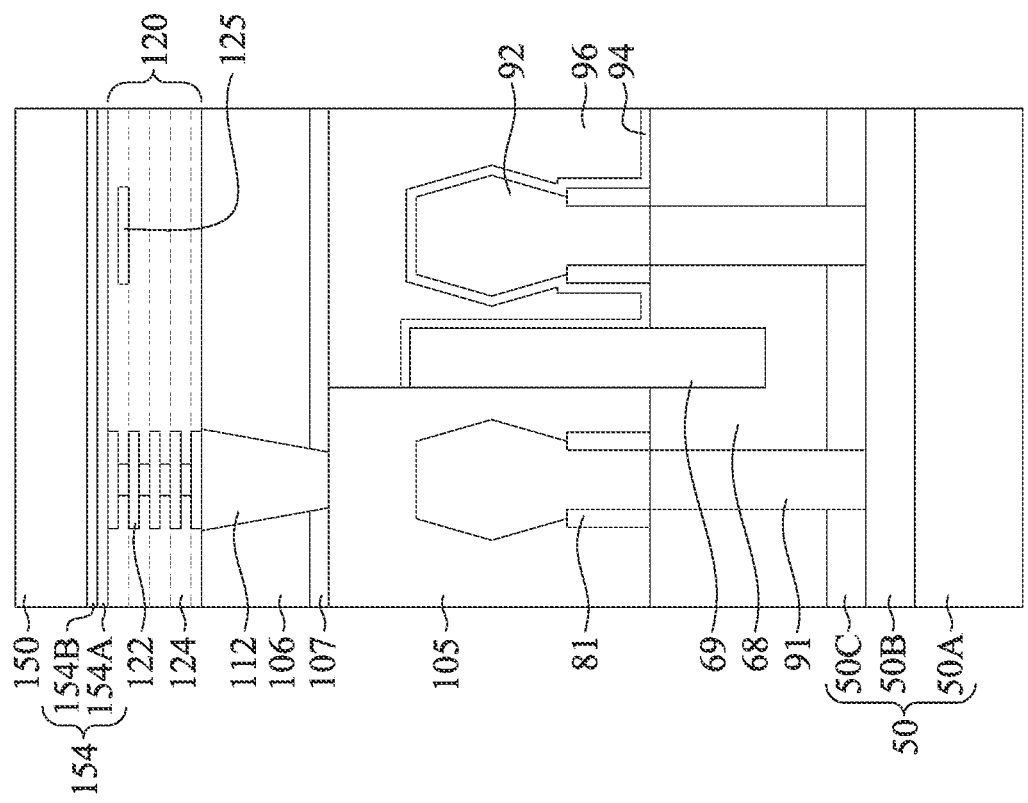
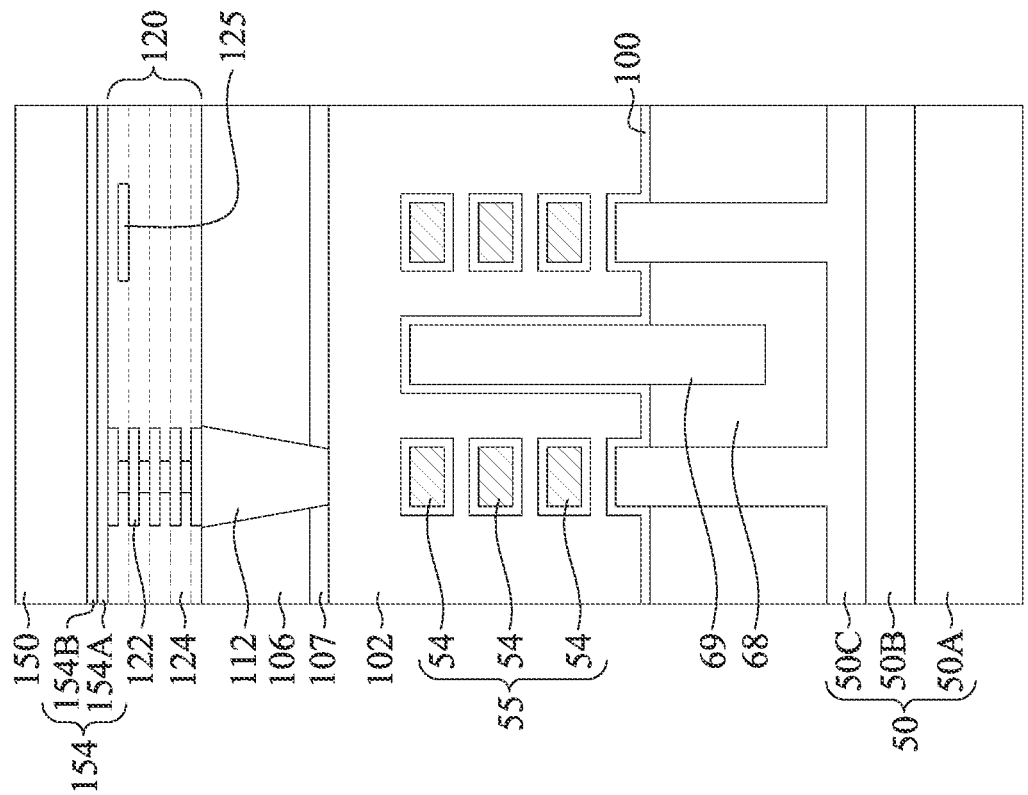

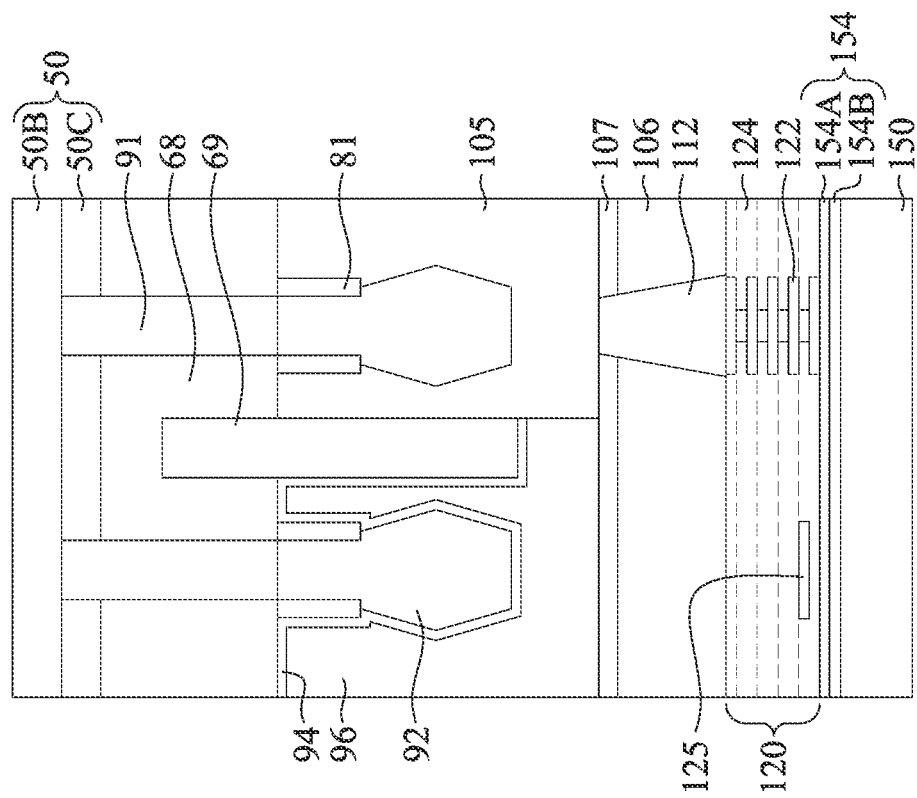
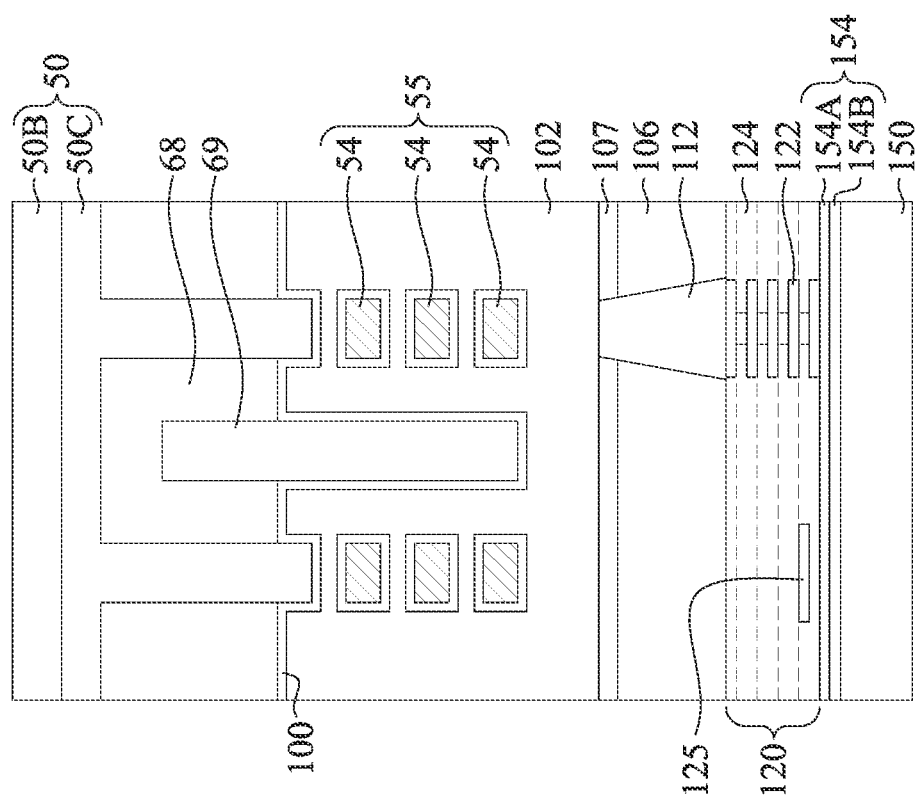

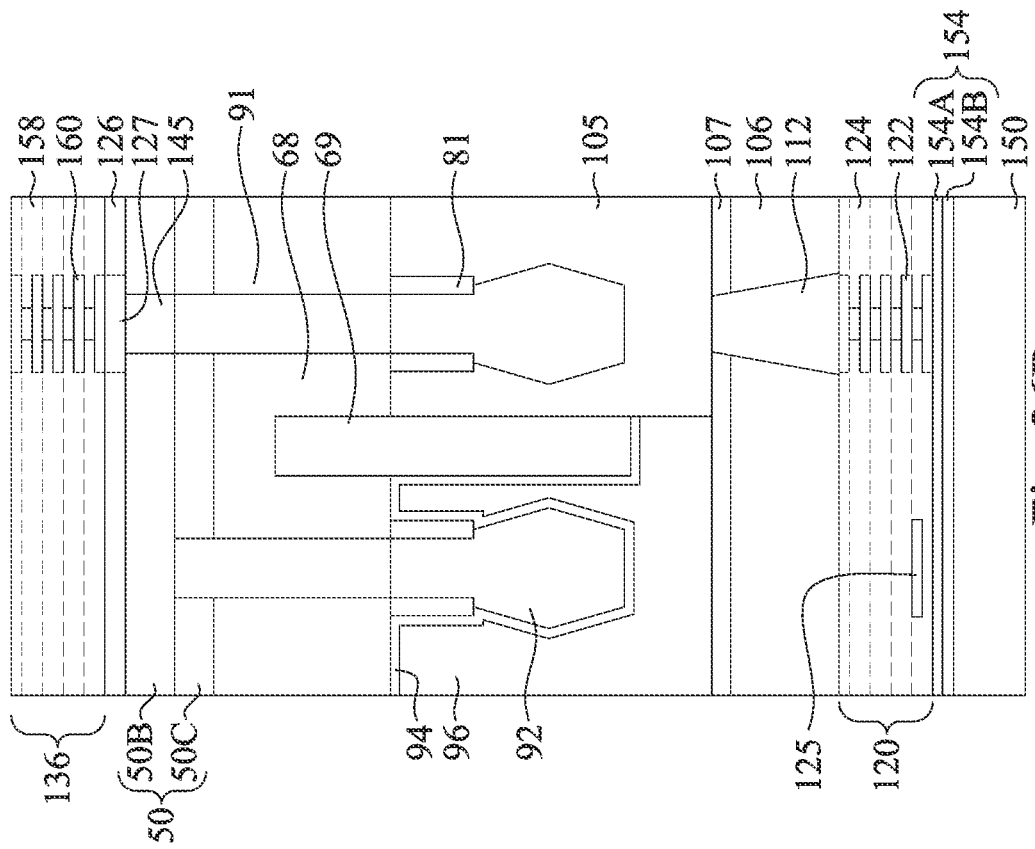
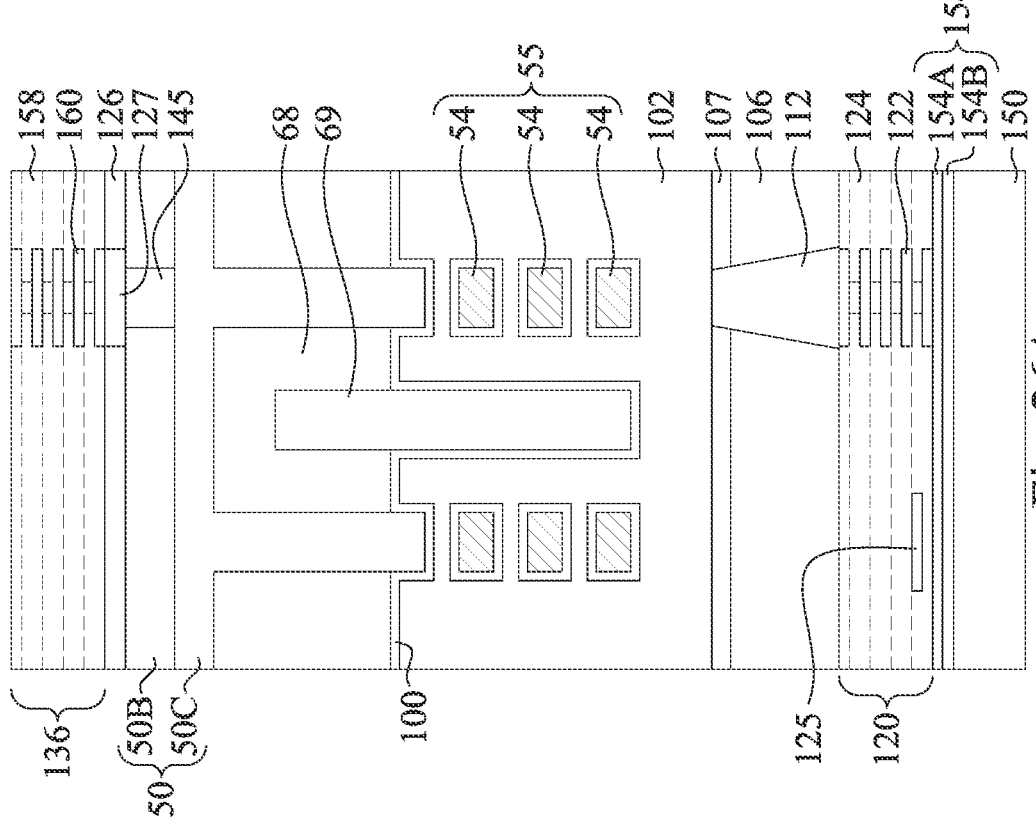
Fig. 26A
Fig. 26B

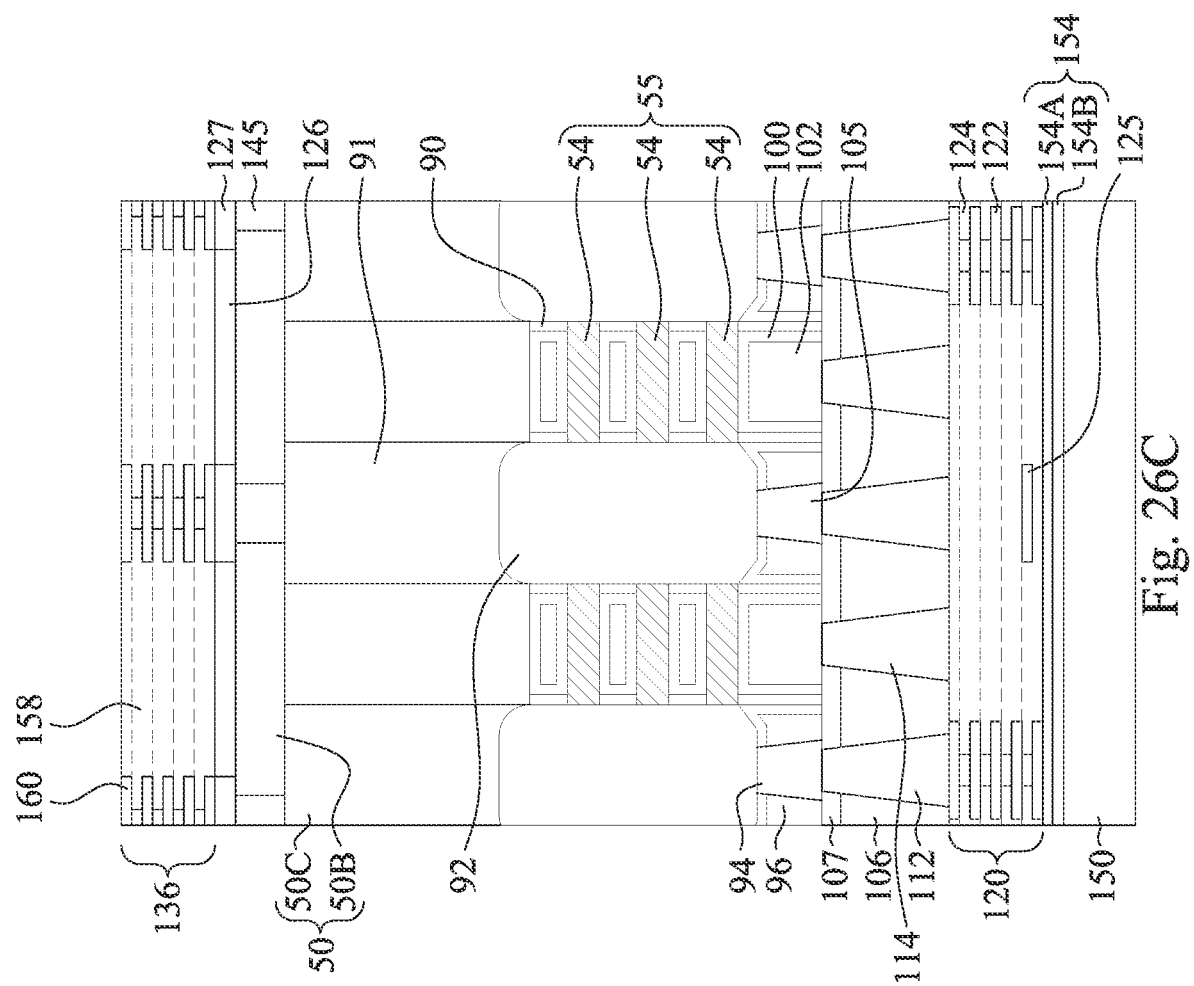

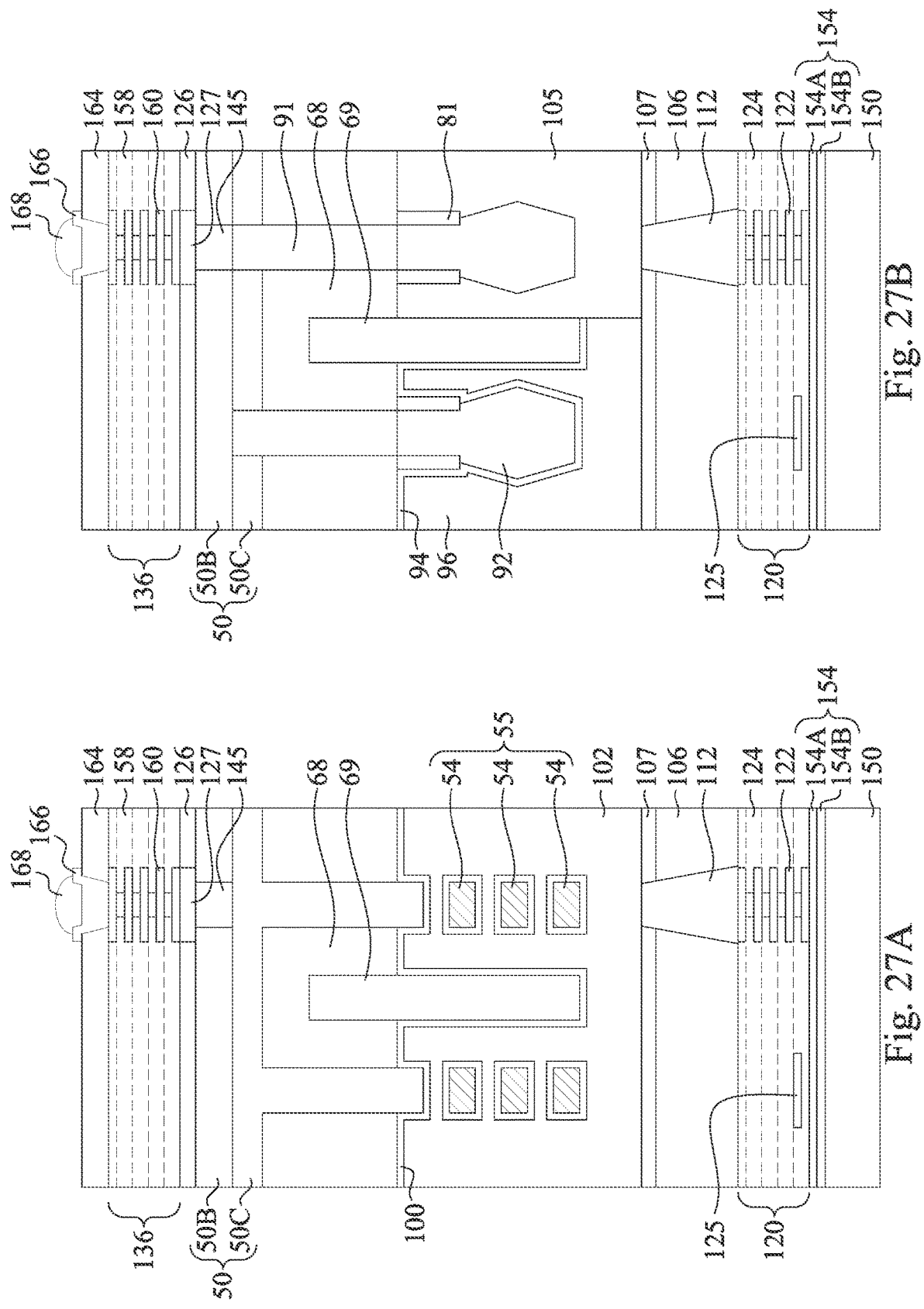

SEMICONDUCTOR DEVICES AND METHOD FOR FORMING THE SAME

PRIORITY CLAIM AND CROSS-REFERENCE

The present application is a Divisional application of U.S. application Ser. No. 17/217,868, filed on Mar. 30, 2021, which claims priority to U.S. Provisional Application Ser. No. 63/057,219, filed Jul. 27, 2020, which are herein incorporated by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 27C are cross-sectional views of intermediate stages in the manufacturing of nano-FETs, in accordance with some embodiments.

DETAILED DESCRIPTION

Figure 1:
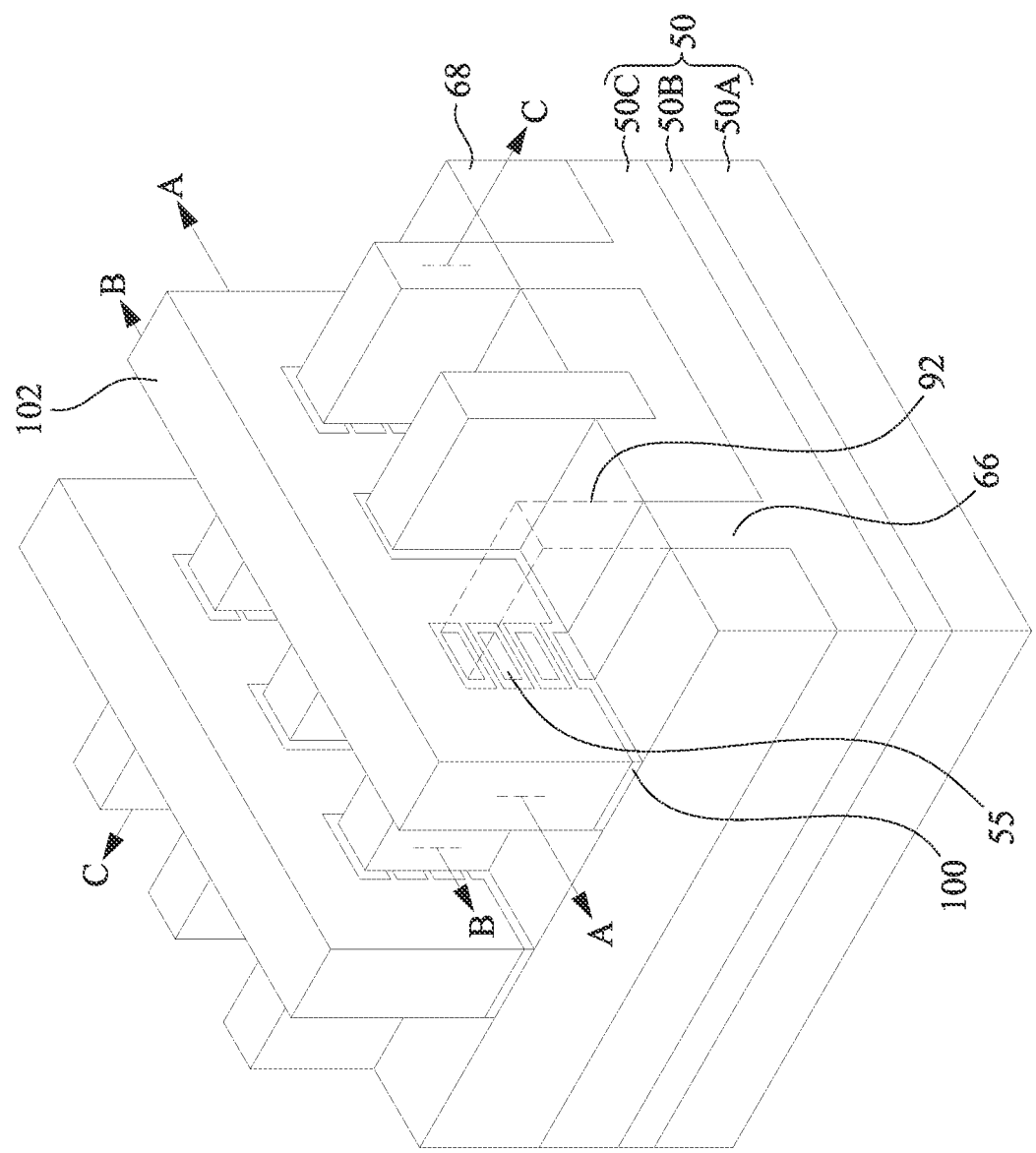
FIG. 1 illustrates an example of a nanostructure field-effect transistor (nano-FET) in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As technology nodes shrink in advanced nodes of semiconductor devices, a temperature of the devices during operation may also increase due to reduced chip area for thermal dissipation and increased transistor density. Various embodiments provide thermal conductive paths from a device that generates heat (e.g., a transistor, resistor, or the like) to an exterior of the chip, thereby allowing for improved heat dissipation and compensating for operating temperature increases. In some embodiments, the thermal conductive paths include dummy features formed in an interconnect structure on a backside and/or front-side of a semiconductor chip.

Embodiments are described below in a particular context, a die comprising nano-FETs. Various embodiments may be applied, however, to dies comprising other types of transistors (e.g., fin field effect transistors (FinFETs), planar transistors, thin film transistors (TFTs), or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs include nanostructures 55 (e.g., nanosheets, nanowire, or the like) over fins 66 on a substrate 50 (e.g., a semiconductor substrate), wherein the nano structures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may include a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain structures 92 are disposed on the fins 66 on opposing sides of the gate dielectric layers 100 and the gate electrodes 102. The gate dielectric layers 100 and the gate electrodes 102 contribute a gate region of the transistor, the epitaxial source/drain structures 92 contribute source/drain regions of the transistor, and the nano structures 55 contribute a channel region of the transistor.

FIG. 1 further illustrates reference cross-sections that are used in later figures. Cross-section A-A is along a longitudinal axis of a gate electrode 102 and in a direction, for example, perpendicular to the direction of current flow between the epitaxial source/drain structures 92 of a nano-FET. Cross-section B-B is parallel to cross-section A-A and extends through epitaxial source/drain regions of the nano-FETs. Cross-section C-C is perpendicular to cross-section A-A and is parallel to a longitudinal axis of a fin 66 of the nano-FET and in a direction of, for example, a current flow between the epitaxial source/drain structures 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 27C are cross-sectional views of intermediate stages in the manufacturing of nano-FETs, in accordance with some embodiments. FIGS. 2-6 and 7A-27A illustrate reference cross-section A-A illustrated in FIG. 1. FIGS. 7B-27B illustrate reference cross-section B-B illustrated in FIG. 1. FIGS. 7C-27C illustrate reference cross-section C-C illustrated in FIG. 1.

Figure 2:
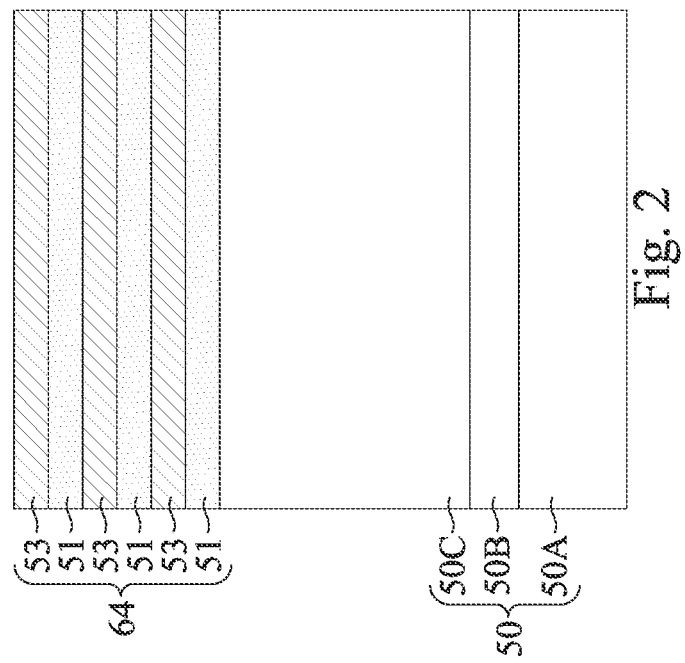

Reference is made to FIG. 2, a substrate 50 is shown. In some embodiments, the substrate 50 may be a semiconductor-on-insulator (SOI) substrate. The SOI substrate may include a buried oxide (BOX) layer formed by a process such as separation by implanted oxygen (SIMOX), and/or other suitable processes. In the example of FIG. 2, the substrate 50 is an SOI substrate including a bulk silicon layer 50A, an oxide layer 50B over the bulk silicon layer 50A, and a semiconductor layer 50C over the oxide layer 50B. The oxide layer 50B may be a buried oxide (BOX) layer. In some embodiments, the BOX layer is silicon dioxide ($SiO_2$). The semiconductor layer 50C may include silicon. The semiconductor layer 50C may be suitably doped with n-type and/or p-type dopants.

Further in FIG. 2, a multi-layer stack 64 is formed over the substrate 50. The multi-layer stack 64 includes alternating layers of first semiconductor layers 51 and second semiconductor layers 53. For purposes of illustration and as discussed in greater detail below, the first semiconductor layers 51 will be removed and the second semiconductor layers 53 will be patterned to form channel regions of nano-FETs.

The multi-layer stack 64 is illustrated as including three layers of each of the first semiconductor layers 51 and the second semiconductor layers 53 for illustrative purposes. In some embodiments, the multi-layer stack 64 may include suitable number of the first semiconductor layers 51 and the second semiconductor layers 53.

The first semiconductor layers 51 and the second semiconductor layers 53 may include different materials and/or components, such that the first semiconductor layers 51 and the second semiconductor layers 53 have different etching rates. In some embodiments, the first semiconductor layers 51 are made from SiGe. The germanium percentage (atomic percentage concentration) of the first semiconductor layers 51 is in the range between about 10 percent and about 20 percent, while higher or lower germanium percentages may be used. It is appreciated, however, that the values recited throughout the description are examples, and may be changed to different values. For example, the first semiconductor layers 51 may be $Si_{0.8}Ge_{0.2}$ or $Si_{0.9}Ge_{0.1}$, in which the proportion between Si and Ge may vary from embodiments, and the disclosure is not limited thereto. The second semiconductor layers 53 may be pure silicon layers that are free of germanium. The second semiconductor layers 53 may also be substantially pure silicon layers, for example, with a germanium percentage lower than about 1 percent. In some embodiments, the first semiconductor layers 51 have a higher germanium atomic percentage concentration than the second semiconductor layers 53. The first semiconductor layers 51 and the second semiconductor layers 53 may be formed by chemical vapor deposition (CVD), molecular beam epitaxy (MBE), or other suitable process(es). In some embodiments, the first semiconductor layers 51 and the second semiconductor layers 53 are formed by an epitaxy growth process, and thus the first semiconductor layers 51 and the second semiconductor layers 53 can also be referred to as epitaxial layers in this content.

Figure 3:
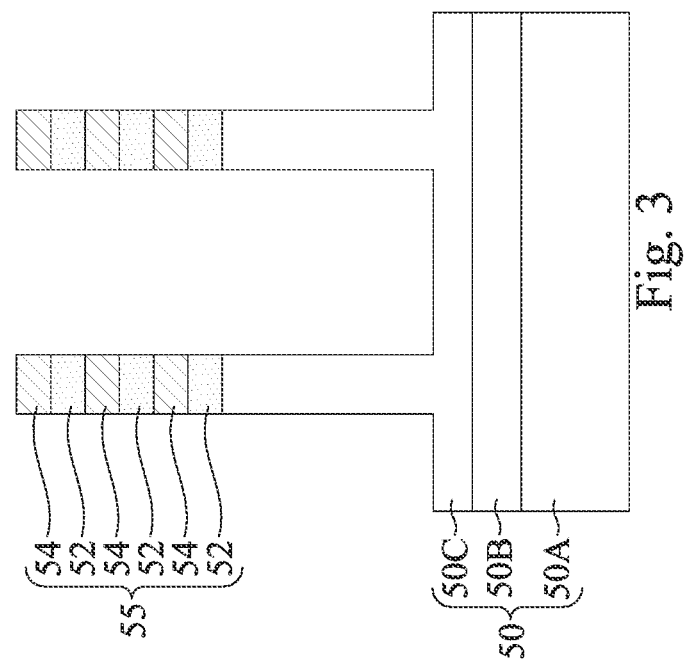

Referring now to FIG. 3, fins 66 are formed in the semiconductor layer 50C of the substrate 50 and nanostructures 55 are formed from the multi-layer stack 64 (see FIG. 2), in accordance with some embodiments. In some embodiments, the nanostructures 55 and the fins 66 may be formed by etching trenches in the multi-layer stack 64 and the semiconductor layer 50C of the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52 from the first semiconductor layers 51 and define second nanostructures 54 from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

While each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
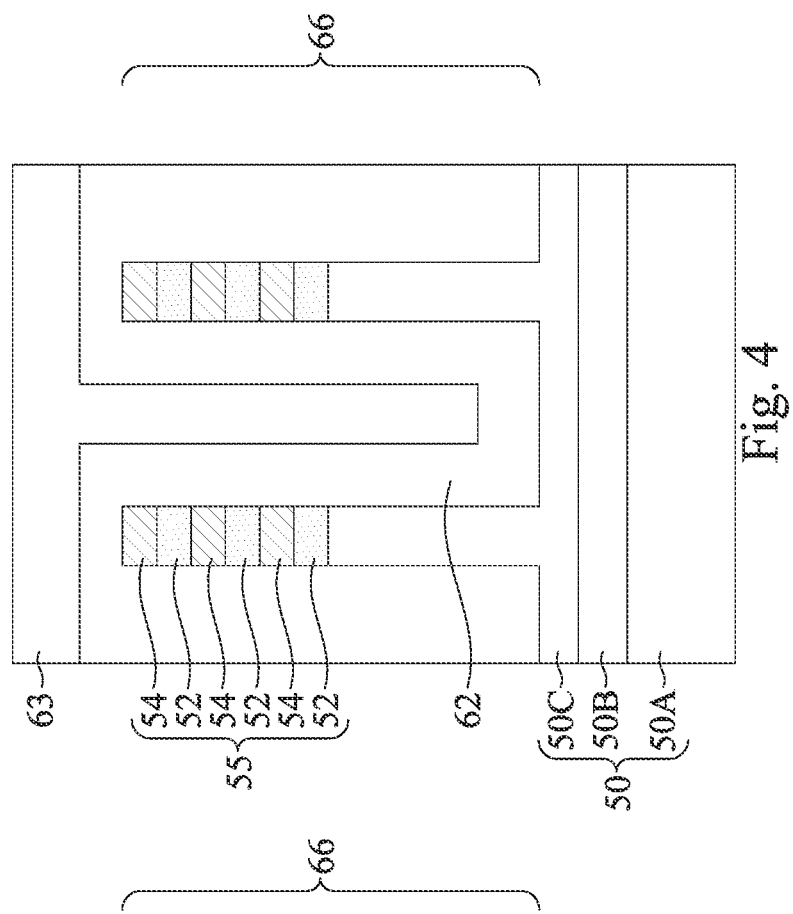

Reference is made to FIG. 4. A dielectric layer 62 and dielectric layer 63 are formed over the fins 66. In some embodiments, the dielectric layer 62 is deposited conformal to the profile of the fins 66. Afterward, the dielectric layer 63 may be deposited over the dielectric layer 62 and filling the spaces in the dielectric layer 62. In some embodiments, the dielectric layer 62 and the dielectric layer 63 may be formed by high-density plasma CVD (HDP-CVD), flowable CVD (FCVD), the like, or a combination thereof. Other insulation materials formed by any acceptable process may be used. In some embodiments, the dielectric layer 62 may include oxide, such as silicon oxide. In some embodiments, the dielectric layer 63 may include nitride, such as silicon nitride. In some embodiments, the dielectric layer 62 and dielectric layer 63 are made of different materials.

Figure 5:
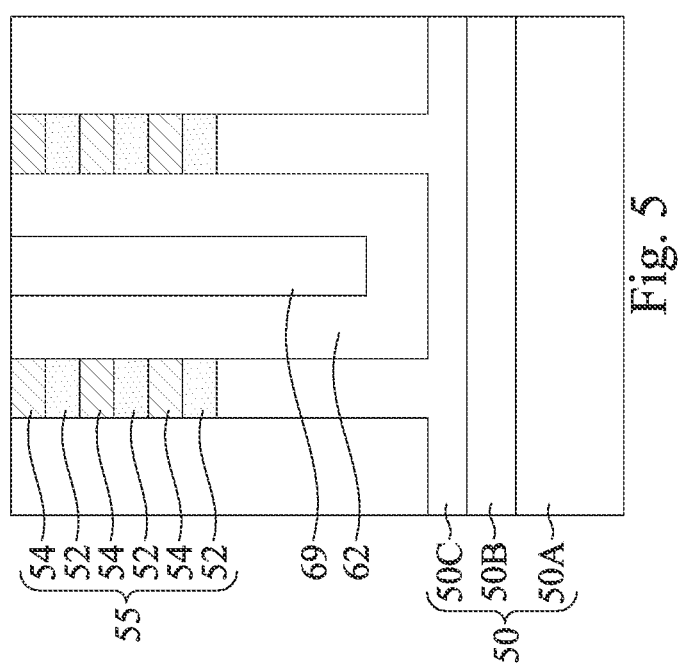

Reference is made to FIG. 5. The dielectric layer 62 and dielectric layer 63 are planarized, so as to level top surfaces of the dielectric layer 62 and dielectric layer 63. In some embodiments, the dielectric layer 62 and dielectric layer 63 may be planarized using a CMP process. The remaining portion of the dielectric layer 63 is referred to as dielectric fin 69. In some embodiments, the dielectric fin 69 may also be referred to as dummy fin.

Figure 6:
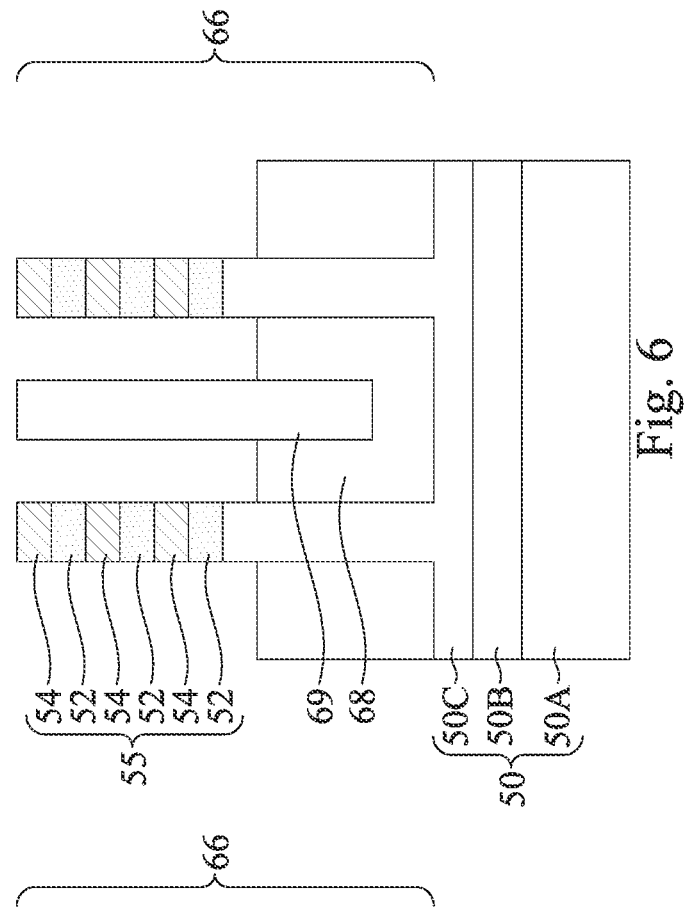

Reference is made to FIG. 6. The dielectric layer 62 is etched back to form shallow trench isolation (STI) regions 68 adjacent the fins 66. In some embodiments, the etch back process is chosen to selectively etch the dielectric layer 62 without substantially etching the dielectric fin 69, which allows for the dielectric fin 69 protruding from the STI regions 68 after the etch back process is completed. Thus, the STI region 68 may wrap around a lower portion of the dielectric fin 69, while leaving an upper portion of the dielectric fin 69 exposed. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the STI regions 68 (e.g., etches the material of the STI regions 68 at a faster rate than the material of the fins 66, the nanostructures 55, and the dielectric fin 69). For example, an oxide removal using, for example, dilute hydrofluoric (dHF) acid may be used.

Reference is made to FIGS. 7A to 7C. Dummy gates 76 and dummy gate dielectrics 71 are formed over the substrate 50 and crossing the fins 66 and the dielectric fin 69. In some embodiments, patterned masks 78 may be formed over the dummy gates 76. The dummy gate dielectrics 71 may be, for example, silicon oxide, silicon nitride, a combination thereof, or the like, and may be deposited or thermally grown according to acceptable techniques. The dummy gates 76 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gates 76 and the dummy gate dielectrics 71 may be formed by, for example, depositing a dummy dielectric layer and a dummy gate layer over the substrate, forming the patterned masks 78 over the dummy gate layer, and then performing a patterning process to the dummy dielectric layer and the dummy gate layer by using the patterned masks 78 as an etching mask. In some embodiments, the dummy gates 76 may be deposited by physical vapor deposition (PVD), CVD, sputter deposition, or other techniques for depositing the selected material. In some embodiments, the dummy gate dielectrics 71 may be formed by thermal oxidation, such that the dummy gate dielectrics 71 may be formed only on the exposed surfaces of the nanostructure 55. That is, the surfaces of the STI region 68 and the dielectric fin 69 are free from coverage of the dummy gate dielectrics 71. The patterned masks 78 may include, for example, silicon nitride, silicon oxynitride, or the like.

Figure 8A:
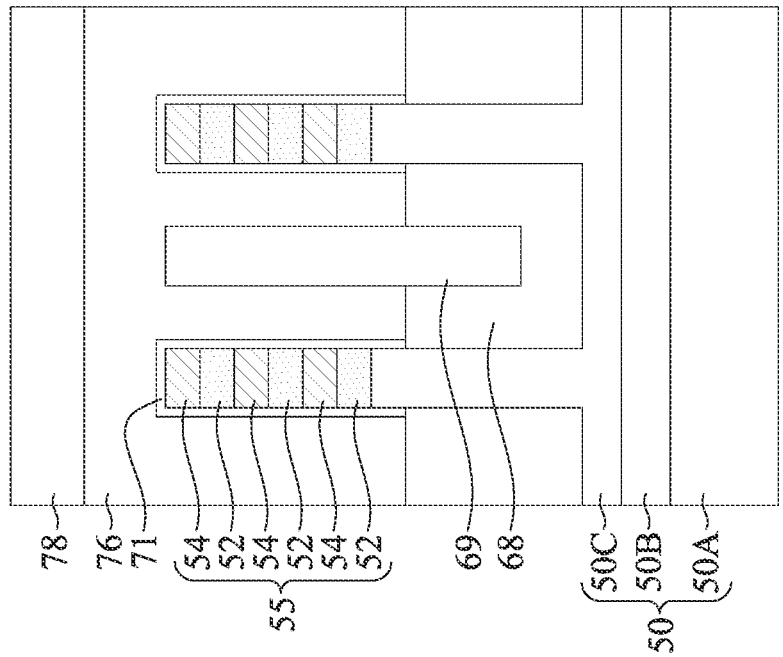
Figure 8B:
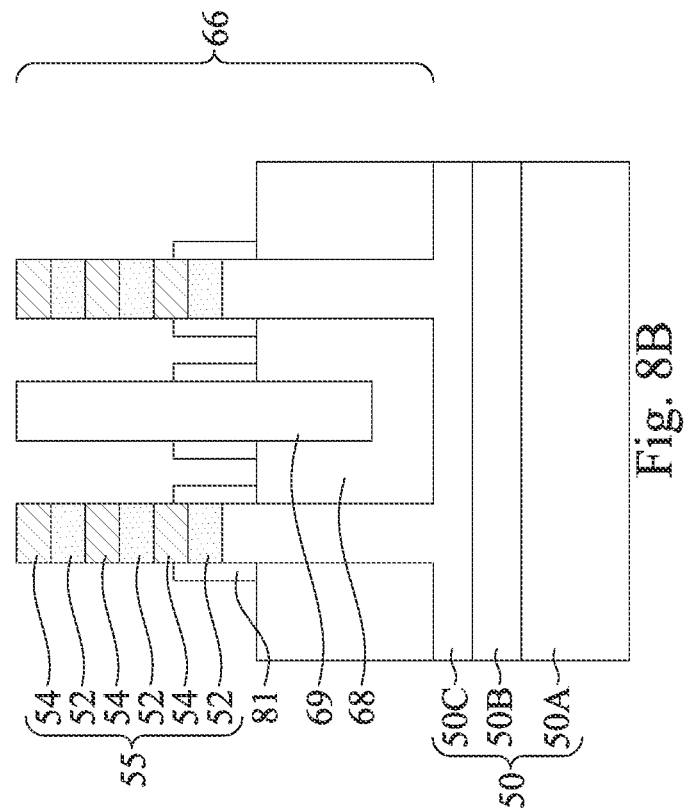

Reference is made to FIGS. 8A to 8C. Spacers 81 are formed on opposite sidewalls of the dummy gates 76, opposite sidewalls of the fins 66, and opposite sidewalls of the dielectric fin 69. In some embodiments, the spacers 81 may be formed by, for example, depositing a spacer layer blanket over the substrate, and subsequently performing an anisotropic etching process to remove horizontal portions of the spacer layer, such that vertical portions of the spacer layer remain on sidewalls of the dummy gates 76, the fins 66, and the dielectric fin 69. The spacers 81 may be formed of silicon oxide, silicon nitride, silicon oxynitride, combinations thereof, using techniques such as thermal oxidation or deposited by CVD, ALD, or the like.

Figure 9C:
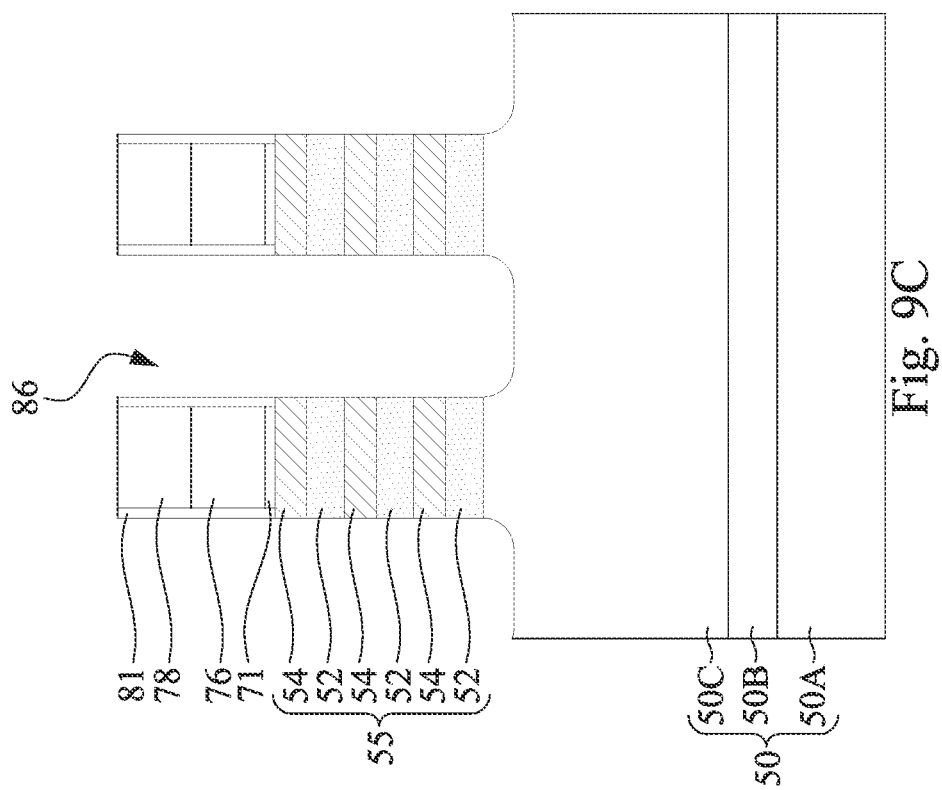

Reference is made to FIGS. 9A to 9C. First recesses 86 are formed in the fins 66, the nanostructures 55, and the semiconductor layer 50C of the substrate 50, in accordance with some embodiments. The first recesses 86 may extend through the first nanostructures 52 and the second nanostructures 54, and into the semiconductor layer 50C of the substrate 50. As illustrated in FIG. 9B, top surfaces of the STI regions 68 may be level with bottom surfaces of the first recesses 86. In various embodiments, the fins 66 may be etched such that bottom surfaces of the first recesses 86 are below the top surfaces of the STI regions 68. The first recesses 86 may be formed by etching the fins 66, the nanostructures 55, and the semiconductor layer 50C of the substrate 50 using anisotropic etching processes, such as RIE, NBE, or the like. The spacers 81 and the patterned masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10C:
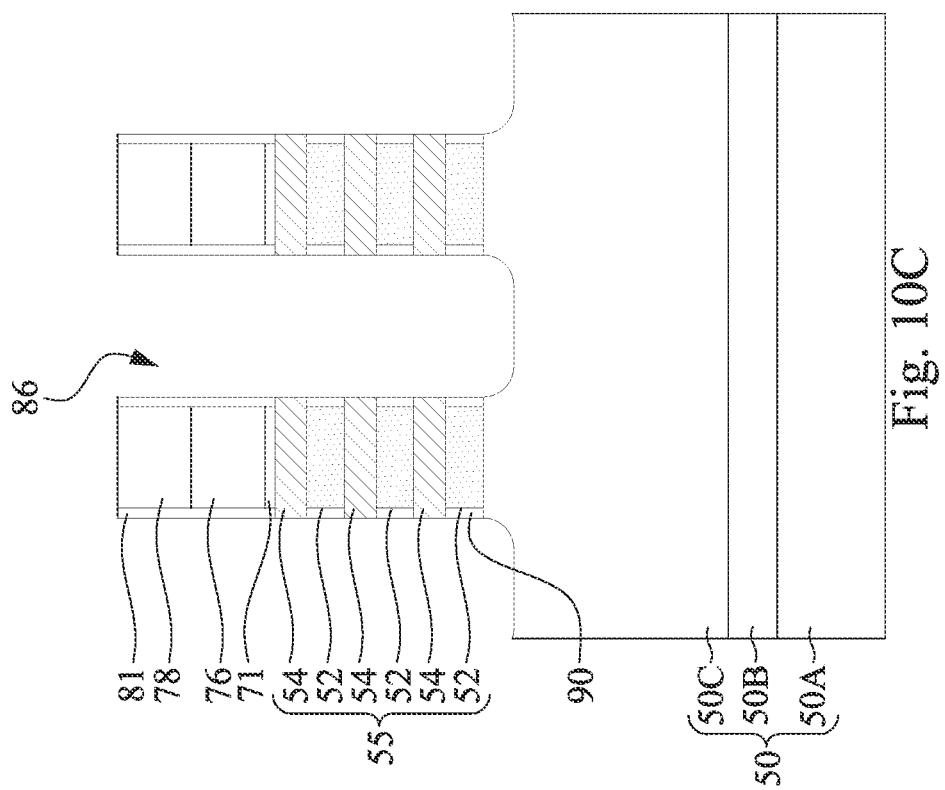

Reference is made to FIGS. 10A to 10C. Portions of the first nanostructures 52 exposed by the first recesses 86 are etched to form sidewall recesses, and then inner spacers 90 are formed in the sidewall recesses. In some embodiments, the sidewalls of the first nanostructures 52 may be etched using isotropic etching processes, such as wet etching or the like. In some embodiments in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

The inner spacers 90 may be deposited by a conformal deposition process, such as CVD, ALD, or the like. The inner spacer layer may include a material such as silicon nitride or silicon oxynitride, although any suitable material, such as low-dielectric constant (low-k) materials having a k-value less than about 3.5, may be utilized. The inner spacers 90 may be formed by, for example, depositing an inner spacer layer blanket over the substrate 50 and filling the sidewall recesses of the first nanostructures 52, and then performing an anisotropic etching to remove unwanted portions of the inner spacer layer. Although outer sidewalls of the inner spacers 90 are illustrated as being flush with sidewalls of the second nanostructures 54, the outer sidewalls of the inner spacers 90 may extend beyond or be recessed from sidewalls of the second nanostructures 54.

Figure 11A:
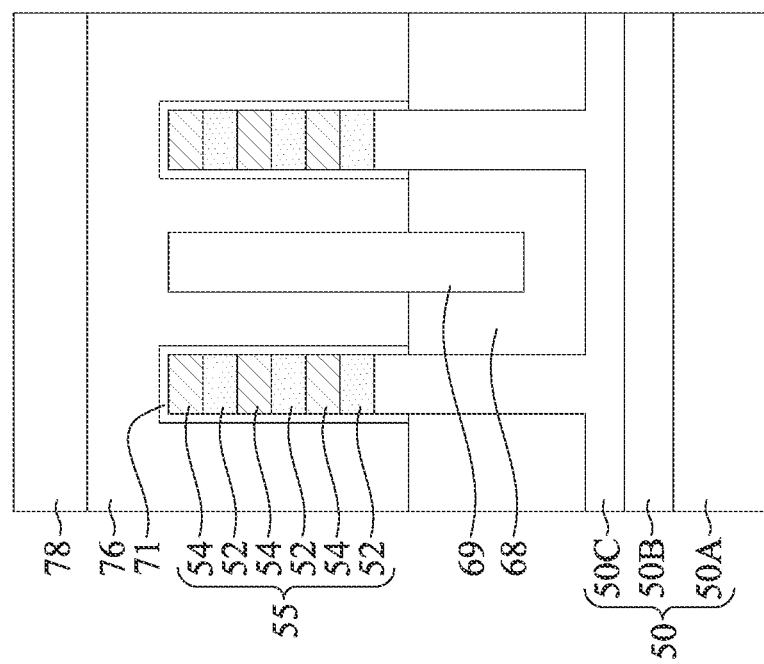
Figure 11B:
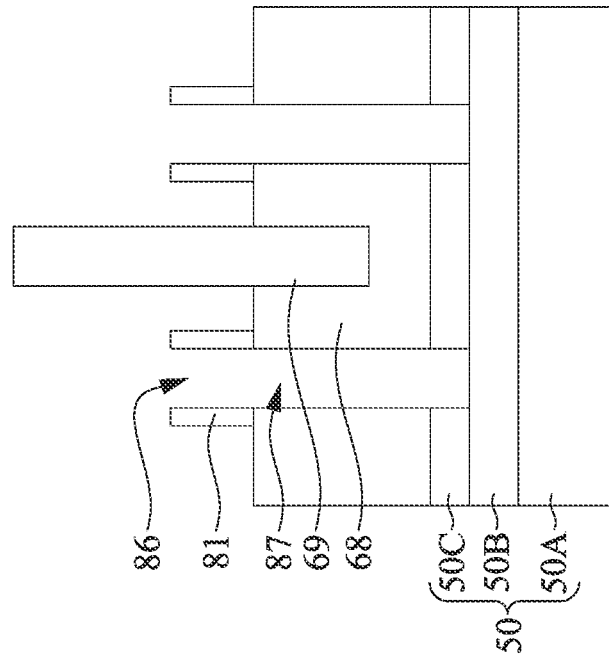

Reference is made to FIGS. 11A to 11C. Second recesses 87 are formed in the semiconductor layer 50C of the substrate 50. In some embodiments, the second recesses 87 may be deep enough to expose the oxide layer 50B of the substrate 50. In some embodiments, the second recesses 87 can be formed in the semiconductor layer of the substrate 50 using, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 12A:
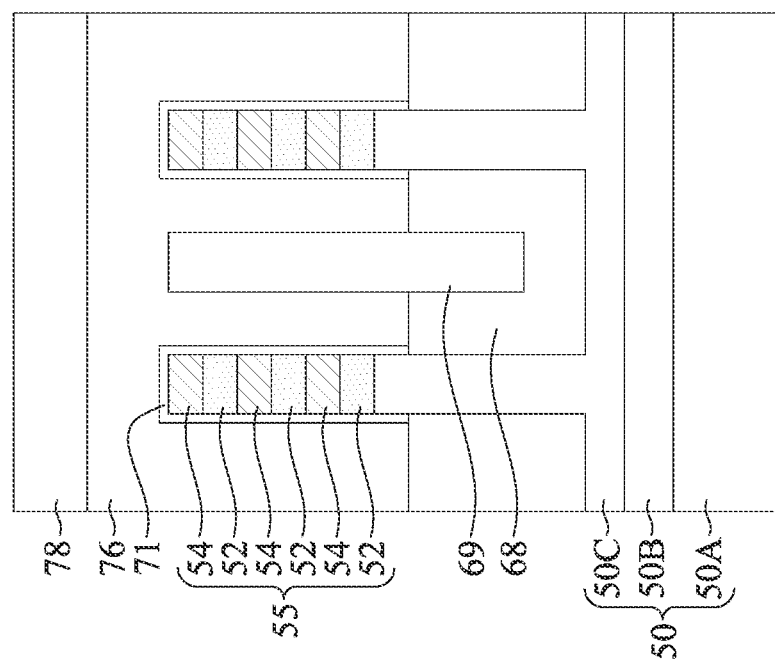
Figure 12B:
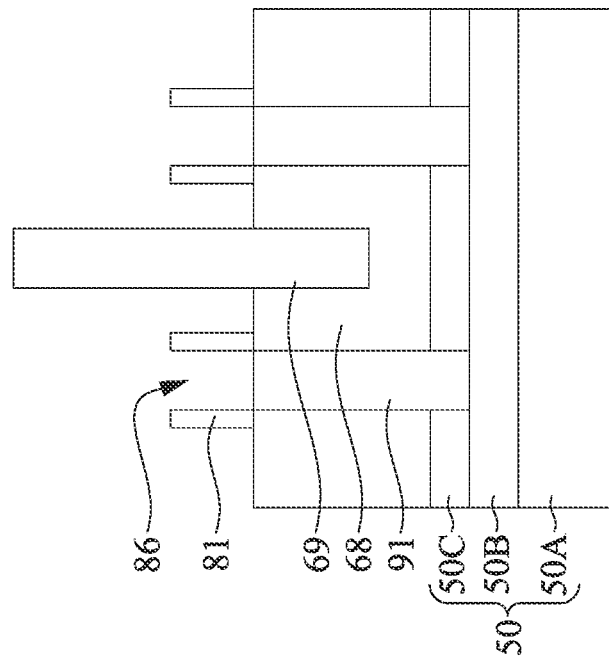
Figure 12C:
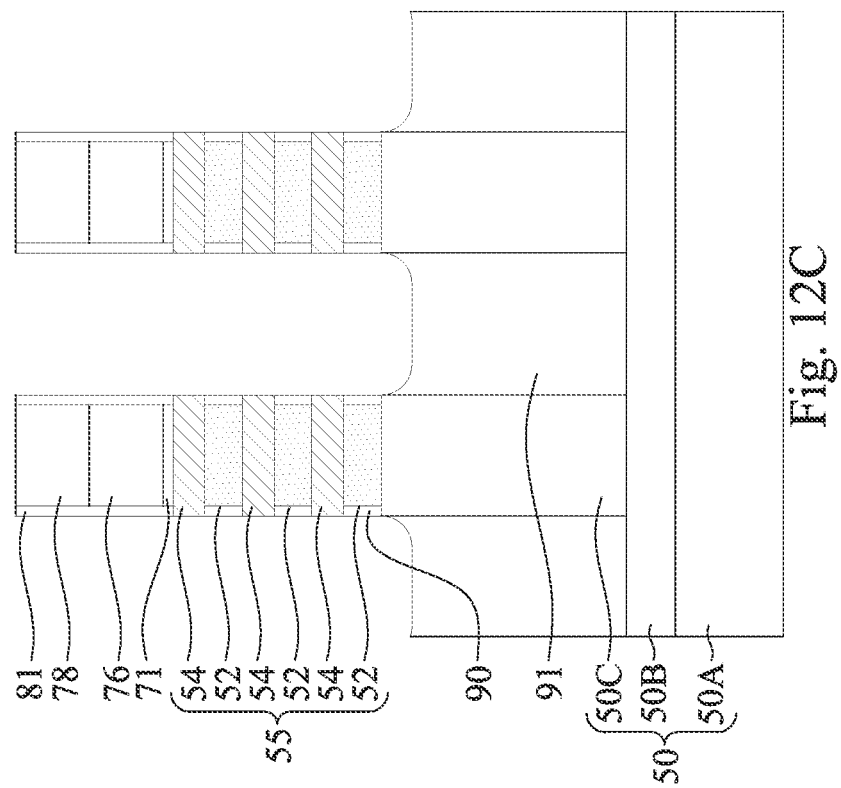

Reference is made to FIGS. 12A to 12C. Epitaxial plugs 91 are formed in the second recesses 87. In some embodiments, the epitaxial plugs 91 are in physical contact with the oxide layer 50B of the substrate 50. In some embodiments, an epitaxial growth process is performed to grow an epitaxial material in the second recesses 87 until the epitaxial material builds up epitaxial plugs 91 filling the second recesses 87. The epitaxial plugs 91 may include a different composition or different material than the semiconductor layer 50C of substrate 50. For example, the semiconductor layer 50C of the substrate 50 is Si and the epitaxial plugs 91 are SiGe. In some embodiments, the epitaxial plugs 91 are doped with suitable dopant (e.g., heavily n-type dopant or p-type dopant) to act as a backside conductive plug electrically connecting subsequently formed epitaxial source/drain structures to a backside interconnect structure.

In some embodiments where the epitaxial plugs 91 are made of SiGe, in order to prevent SiGe from being inadvertently formed on end surfaces of the second nanostructures 54, the epitaxial plugs 91 can be grown in a bottom-up fashion, in accordance with some embodiments of the present disclosure. By way of example and not limitation, the epitaxial plugs 91 can be grown by an epitaxial deposition/partial etch process, which repeats the epitaxial deposition/partial etch process at least once. Such repeated deposition/partial etch process is also called a cyclic deposition-etch (CDE) process. In some other embodiments, the epitaxial plugs 91 may be formed by, for example, depositing an epitaxial material filling the first recesses 86 and the second recesses 87, and then etching back the epitaxial material to form the epitaxial plugs 91.

Figure 13A:
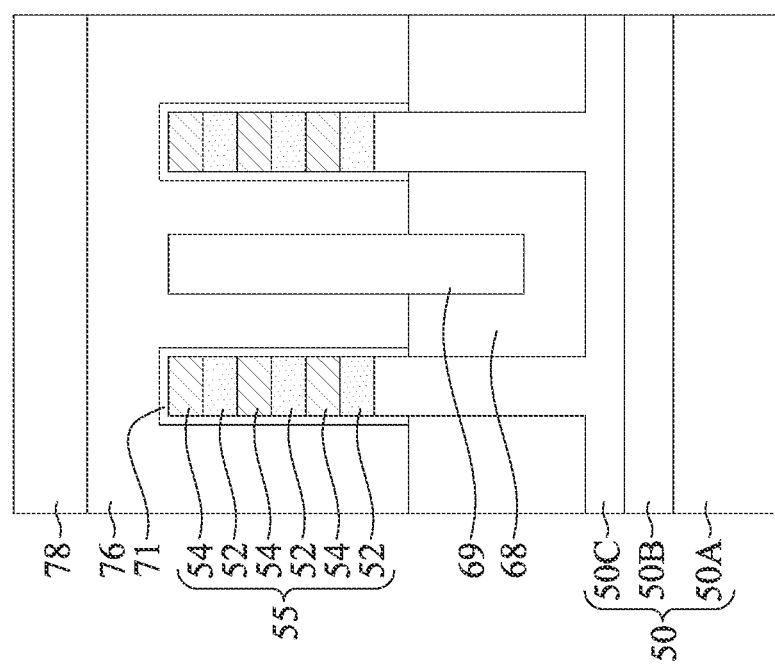
Figure 13B:
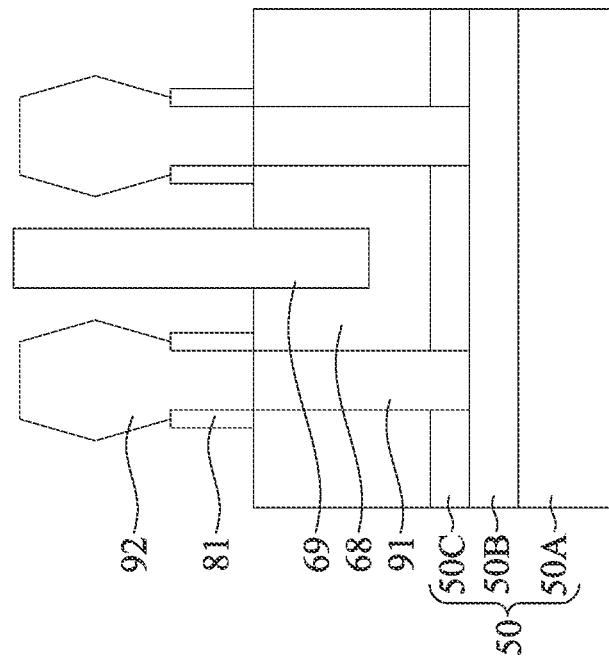
Figure 13C:
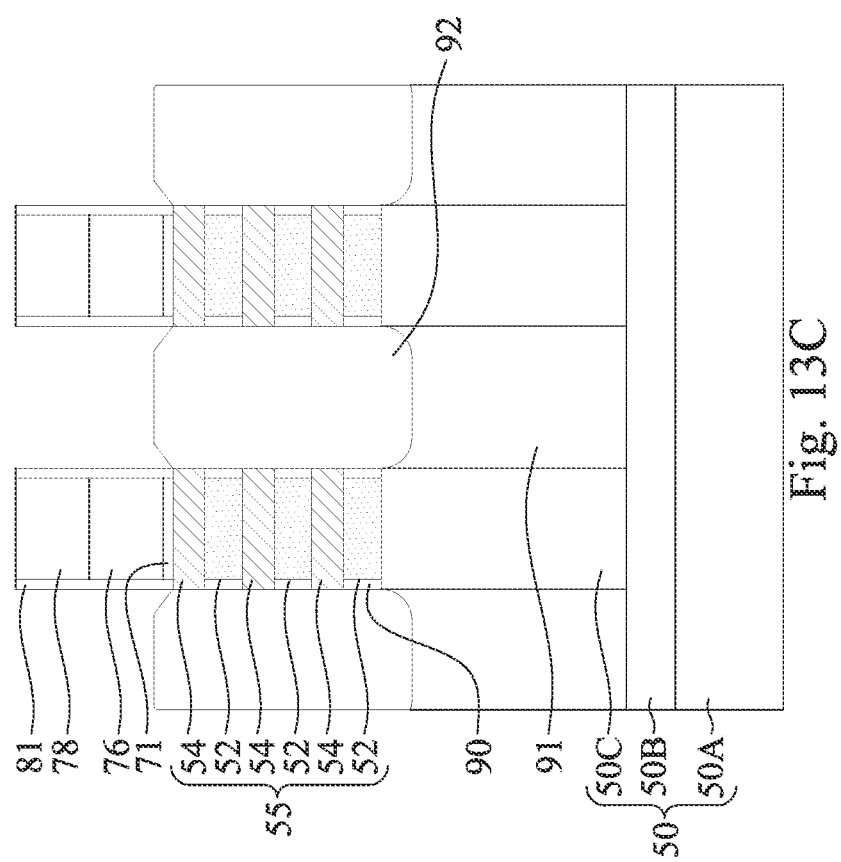

Reference is made to FIGS. 13A to 13C, epitaxial source/drain structures 92 are formed in the first recesses 86. In some embodiments, the epitaxial source/drain structures 92 may exert stress on the second nanostructures 54, thereby improving performance. As illustrated in FIG. 13C, the epitaxial source/drain structures 92 are formed in the first recesses 86 such that each dummy gate 76 is disposed between respective neighboring pairs of the epitaxial source/drain structures 92. In some embodiments, the spacers 81 are used to separate the epitaxial source/drain structures 92 from the dummy gates 76 and the inner spacers 90 are used to separate the epitaxial source/drain structures 92 from the first nanostructures 52 by an appropriate lateral distance so that the epitaxial source/drain structures 92 do not short out with subsequently formed gates of the resulting nano-FETs. In some embodiments, the epitaxial source/drain structures 92 include p-type dopants such as boron for formation of p-type FETs. In other embodiments, the epitaxial source/drain structures 92 include n-type dopants such as phosphorus for formation of n-type FETs.

Reference is made to FIGS. 14A to 14C. A first interlayer dielectric (ILD) 96 is deposited over the structure illustrated in FIGS. 13A to 13C, respectively. In some embodiments, a CMP process may be performed to the first ILD 96 until the top surfaces of the dummy gates 76 are exposed. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain structures 92, and the spacers 81. The CESL 94 may extend along sidewalls and top surface of the dielectric fin 69. The CESL 94 may include a dielectric material, such as, silicon nitride, silicon oxide, silicon oxynitride, or the like, having a different etch rate than the material of the overlying first ILD 96.

Figure 15C:
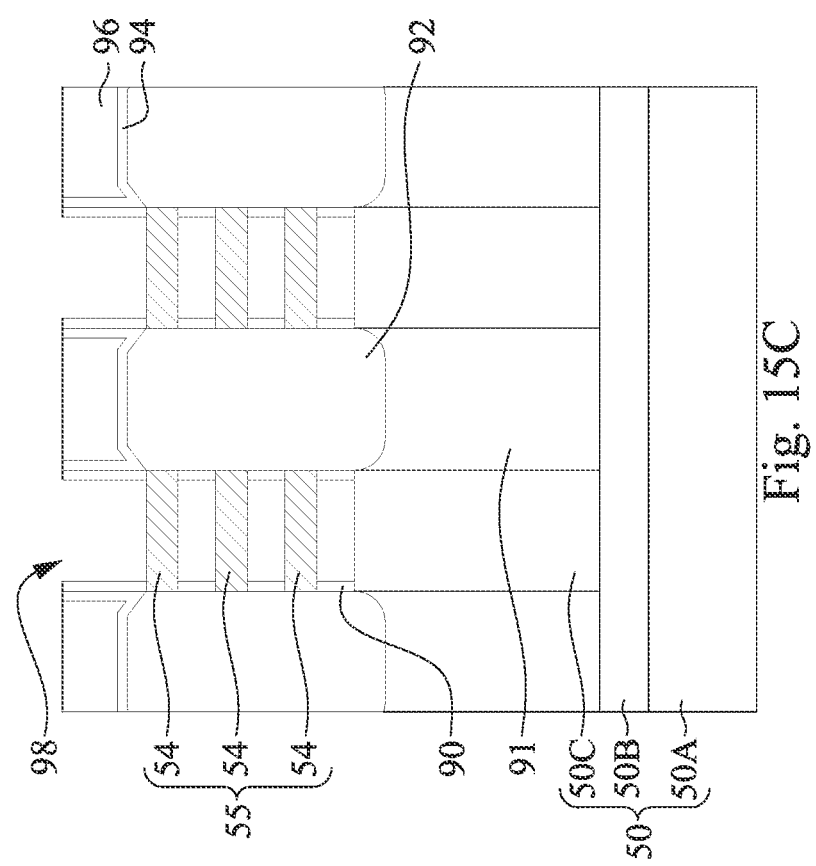

Reference is made to FIGS. 15A to 15C. The dummy gates 76 and the dummy gate dielectrics 71 are removed in one or more etching steps, so that third recesses 98 are formed. In some embodiments, the dummy gates 76 and the dummy gate dielectrics 71 may be removed by an anisotropic dry etch process. For example, the etching process may include a dry etch process using reaction gas(es) that selectively etch the dummy gates 76 at a faster rate than the first ILD 96 or the spacers 81. Each third recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain structures 92. During the removal, the dummy gate dielectrics 71 may be used as etch stop layers when the dummy gates 76 are etched. The dummy gate dielectrics may then be removed after the removal of the dummy gates 76.

Next, the first nanostructures 52 are removed to extend the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54 include, e.g., Si or SiC, tetramethylammonium hydroxide (TMAH), ammonium hydroxide ($NH_4OH$), or the like may be used to remove the first nanostructures 52.

Figure 16B:
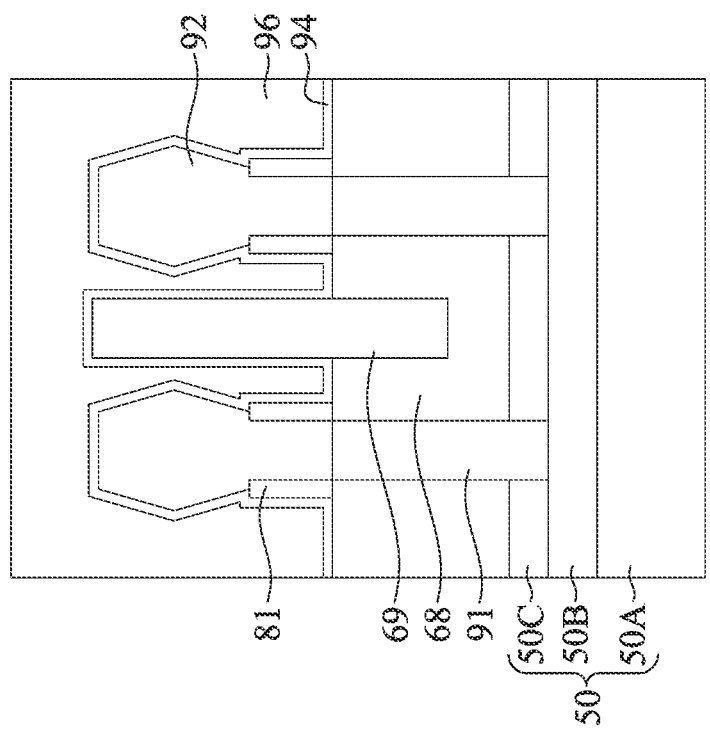
Figure 16A:
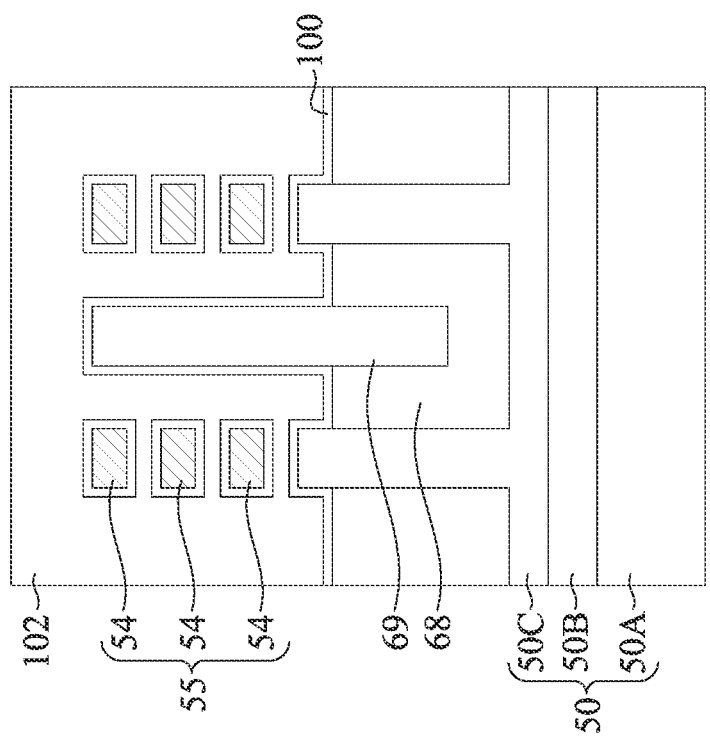
Figure 16C:
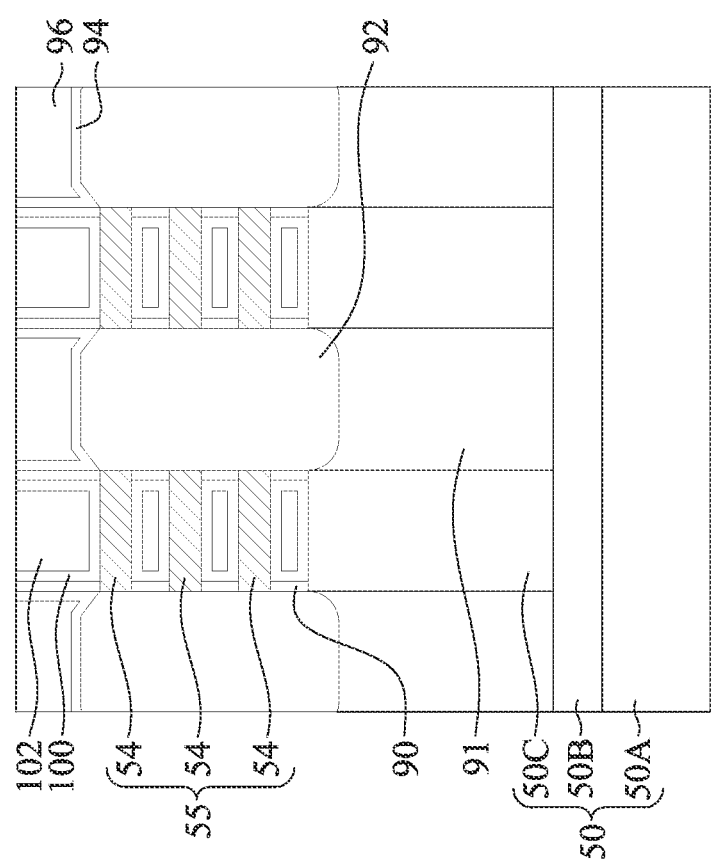

Reference is made to FIGS. 16A to 16C. Gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54.

In accordance with some embodiments, the gate dielectric layers 100 may include one or more dielectric layers, such as an oxide, a metal oxide, the like, or combinations thereof. For example, in some embodiments, the gate dielectrics may include a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 16A to 16C, the gate electrodes 102 may include any number of liner layers, any number of work function tuning layers, and a fill material.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Reference is made to FIGS. 17A to 17C. Contact openings 104 are formed in the first ILD 96 to expose the epitaxial source/drain structures 92. In some embodiments, the openings 104 may be formed by, for example, forming a mask layer, such as a photoresist layer, over the first ILD 96, patterning the mask layer to form openings in the mask layer, etching the first ILD 96 through the openings of the mask layer, and then removing the mask layer. As shown in the cross-section of FIG. 17B, in some embodiments, an epitaxial source/drain structure 92 (on the right side) is covered by the first ILD 96 after the contact openings 104 are formed. In such embodiments, one sidewall of the dielectric fin 69 may be exposed by the opening 104, while the other one sidewall and the top surface of the dielectric fin 69 may be covered by the first ILD 96.

Figure 18A:
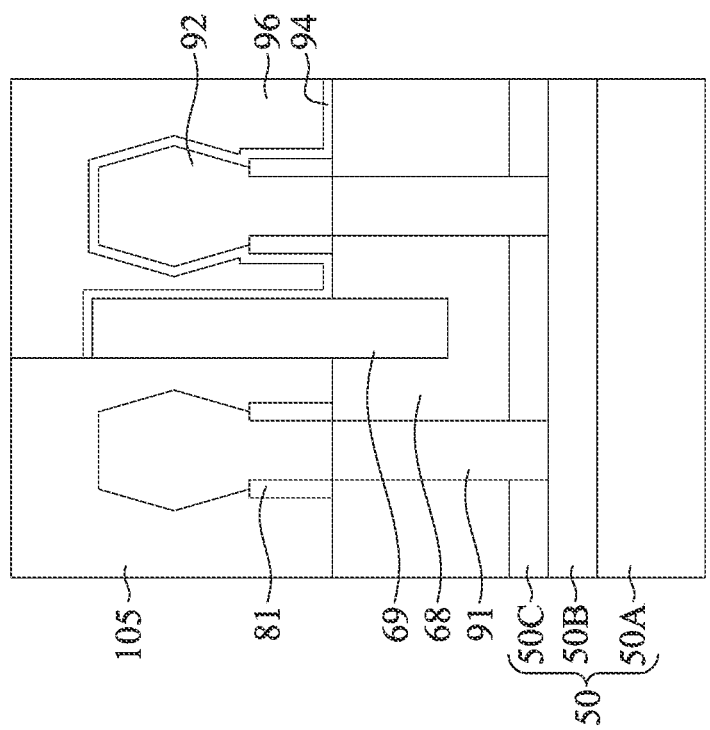
Figure 18B:
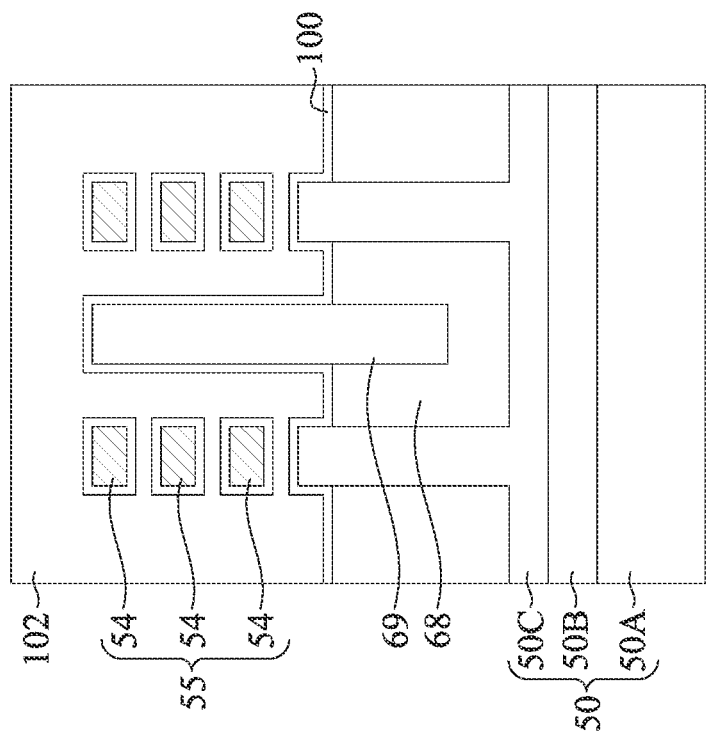
Figure 18C:
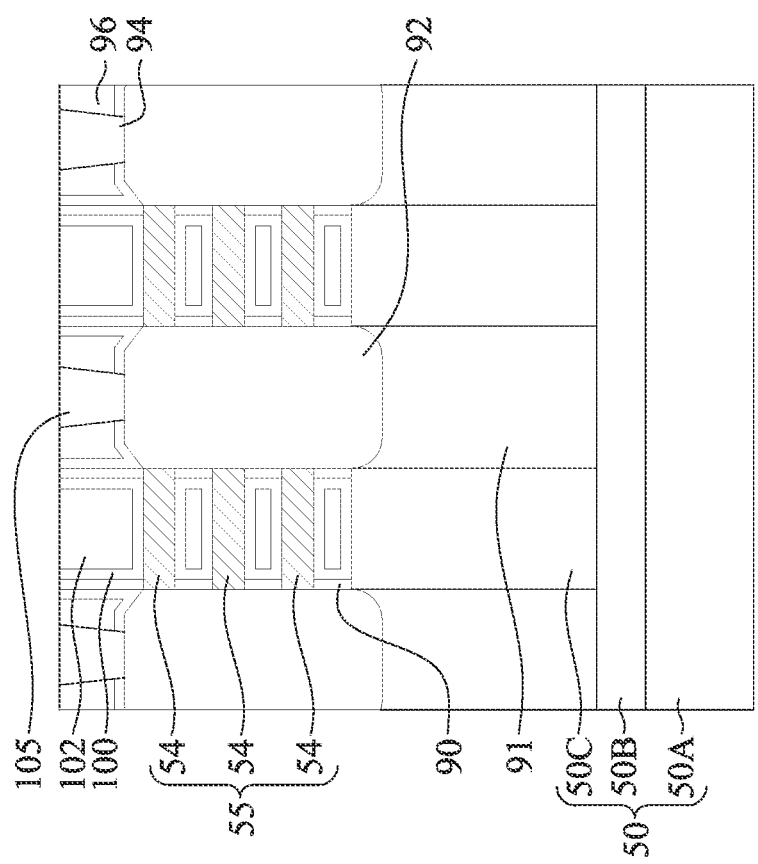

Reference is made to FIGS. 18A to 18C. Source/drain contacts 105 are formed in the contact openings 104, respectively. In some embodiments, the source/drain contacts 105 may be formed by, for example, depositing one or more conductive materials in the contact openings 104, and performing a CMP process to remove excess conductive materials until the top surface of the first ILD 96 is exposed. The contacts 105 may include one or more layers, such as barrier layers, diffusion layers, and fill materials. In some embodiments, the contacts each may include a barrier layer made of titanium, titanium nitride, tantalum, tantalum nitride, or the like, and a conductive material made of copper, a copper alloy, silver, gold, tungsten, cobalt, aluminum, nickel, or the like.

In some embodiments, prior to forming the source/drain contacts 105, silicide layers (not shown) may be formed over the epitaxial source/drain structures 92 exposed by the openings 104. In some embodiments, the silicide layers are formed by first depositing a metal (not shown) capable of reacting with the semiconductor materials of the underlying epitaxial source/drain structures 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain structures 92, then performing a thermal anneal process to form the silicide layers. The unreacted portions of the deposited metal are then removed, e.g., by an etching process.

Figure 19B:
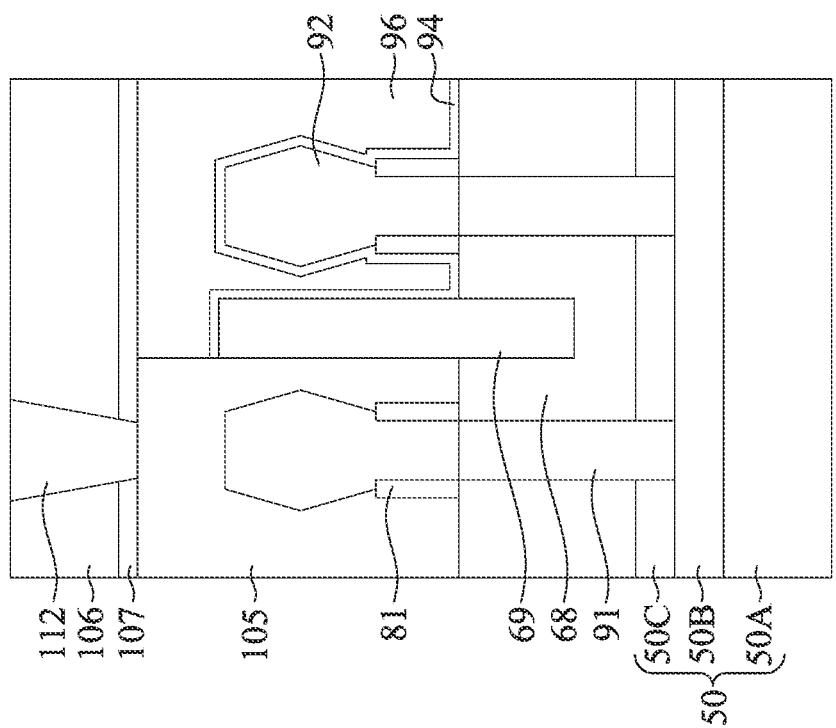
Figure 19A:
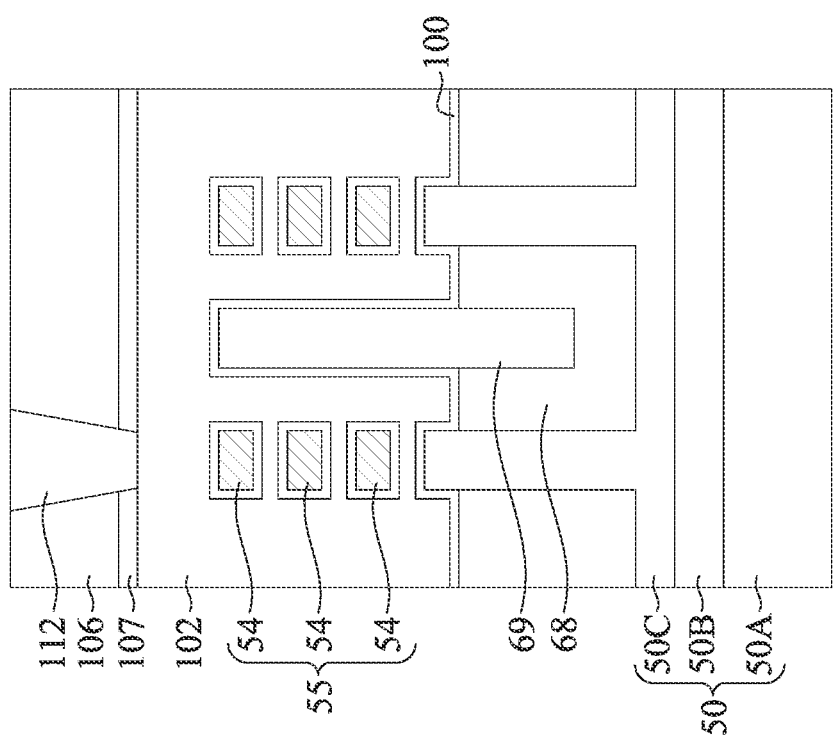
Figure 19C:
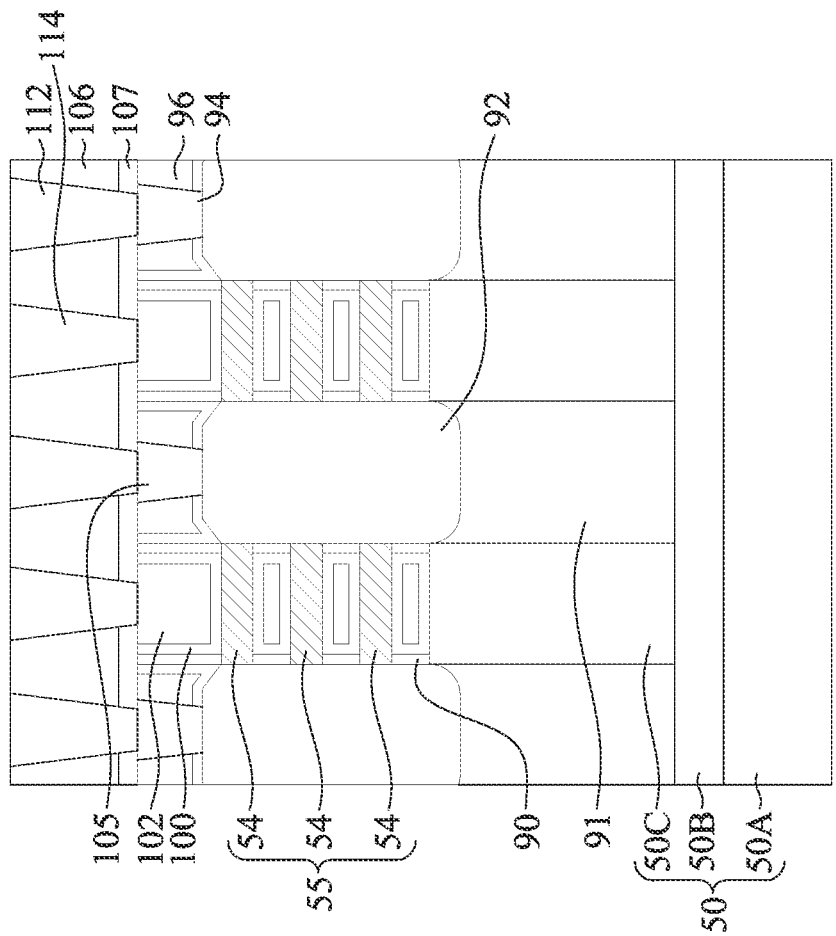

Reference is made to FIGS. 19A to 19C. An etch stop layer (ESL) 107 is formed over the first ILD 96, a second ILD 106 is formed over the ESL 107, and source/drain vias 112 and gate contacts 114 are formed extending through the second ILD 106 and the ESL 107 to the source/drain contacts 105 and the gate electrodes 102, respectively. In some embodiments, the source/drain vias 112 and gate contacts 114 may be formed by, for example, patterning the second ILD 106 and the ESL 107 to form openings, depositing one or more conductive materials in the openings, and performing a CMP process to remove excess conductive materials until the top surface of the second ILD 106 is exposed. The source/drain vias 112 and gate contacts 114 may include one or more layers, such as barrier layers, diffusion layers, and fill materials. In some embodiments, the contacts each may include a barrier layer made of titanium, titanium nitride, tantalum, tantalum nitride, or the like, and a conductive material made of copper, a copper alloy, silver, gold, tungsten, cobalt, aluminum, nickel, or the like.

Figure 20B:
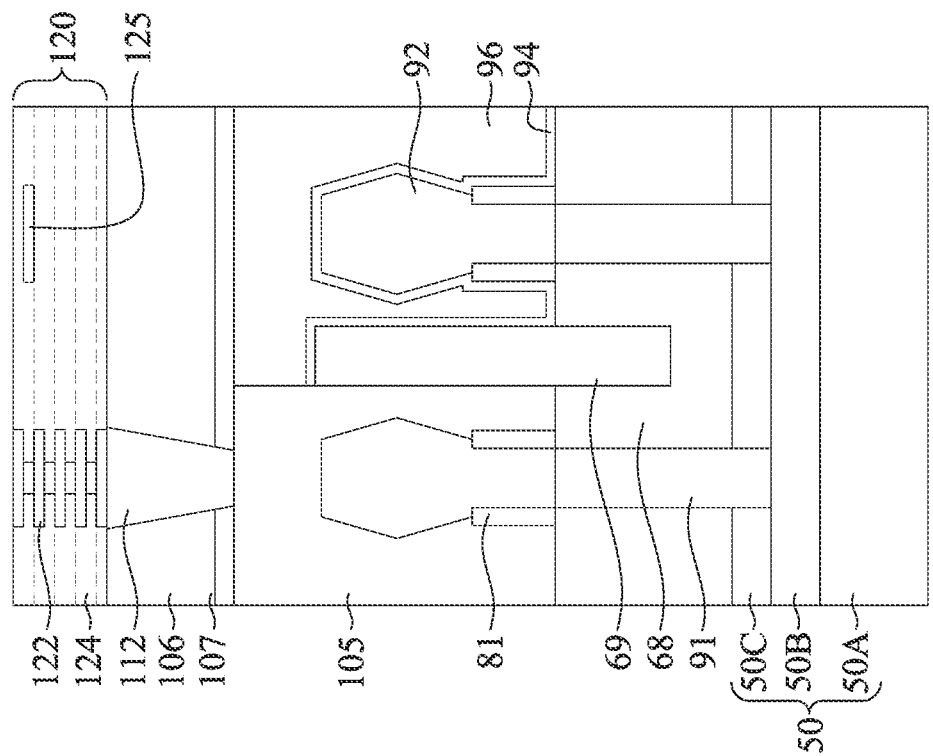
Figure 20A:
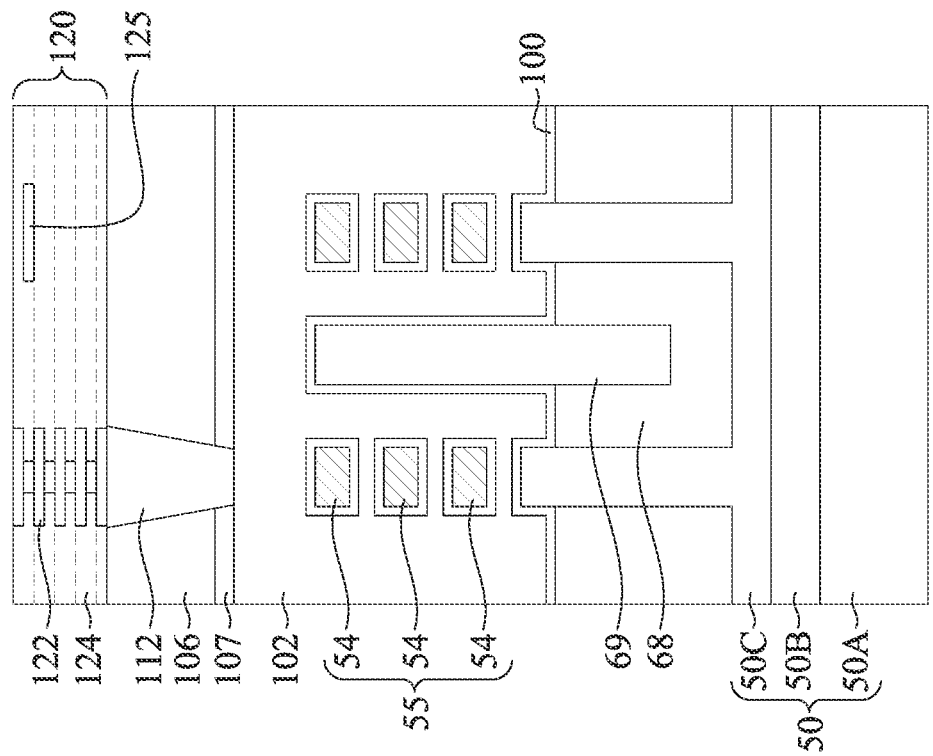
Figure 20C:
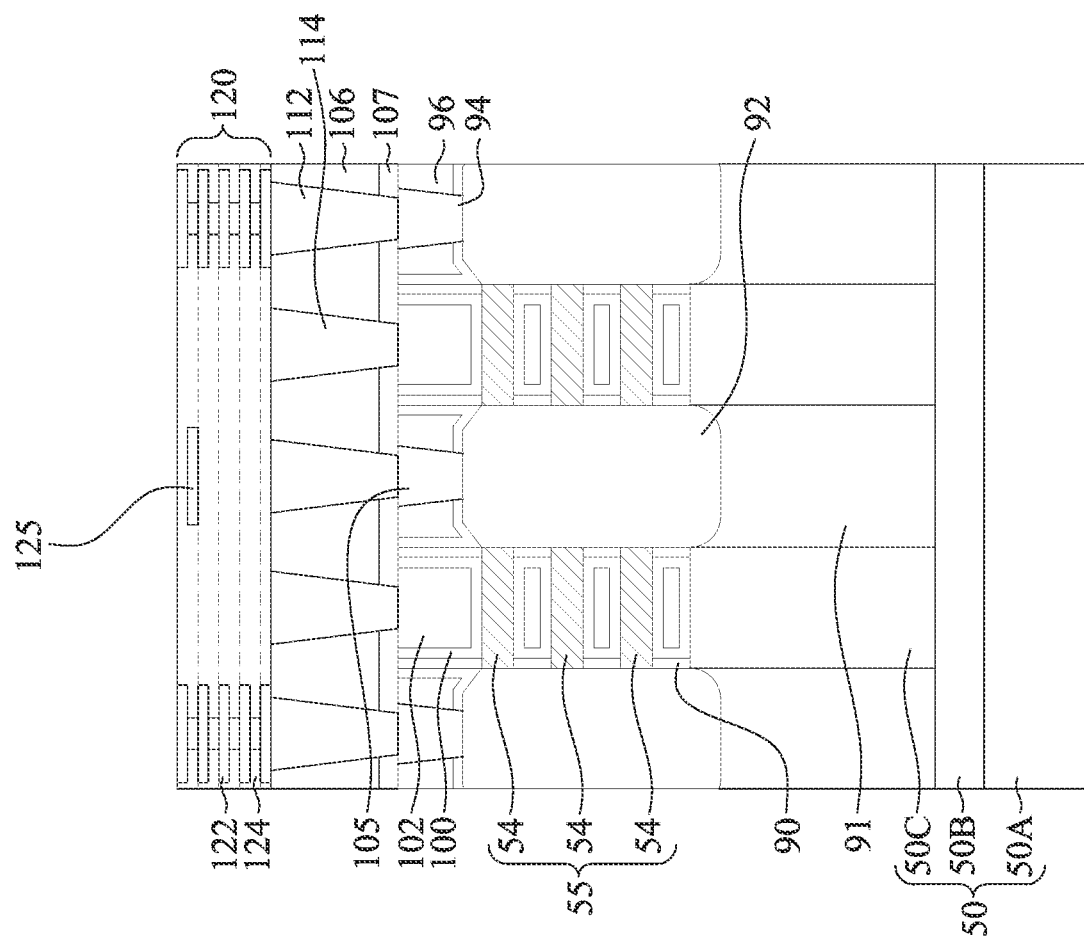

Reference is made to FIGS. 20A to 20C. An interconnect structure 120 is formed over the second ILD 106. The interconnect structure 120 may also be referred to as a front-side interconnect structure because it is formed on a front-side of the substrate 50.

The interconnect structure 120 may include one or more layers of conductive features 122 formed in one or more stacked dielectric layers 124. Each of the stacked dielectric layers 124 may include a dielectric material, such as a low-k dielectric material, an extra low-k (ELK) dielectric material, or the like. The dielectric layers 124 may be deposited using an appropriate process, such as, CVD, ALD, PVD, PECVD, or the like.

Conductive features 122 may include conductive lines and conductive vias interconnecting the layers of conductive lines. The conductive vias may extend through respective ones of the dielectric layers 124 to provide vertical connections between layers of conductive lines. The conductive features 122 may be formed through any acceptable process, such as, a damascene process, a dual damascene process, or the like.

For example, the conductive features 122 may be formed using a damascene process in which a respective dielectric layer 124 is patterned utilizing a combination of photolithography and etching techniques to form trenches corresponding to the desired pattern of the conductive features 122. An optional diffusion barrier and/or optional adhesion layer may be deposited and the trenches may then be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the conductive features 122 may be formed by depositing a seed layer of copper or a copper alloy, and filling the trenches by electroplating. A chemical mechanical planarization (CMP) process or the like may be used to remove excess conductive material from a surface of the respective dielectric layer 124 and to planarize the surface for subsequent processing.

In some embodiments, a high resistance (HiR) resistor 125 may be formed in the interconnect structure 120. For example, the HiR resistor 125 is formed of a high resistance material, e.g. Titanium nitride (TiN) or Tantalum nitride (TaN).

In FIGS. 20A to 20C, five layers of conductive features 122 and dielectric layers 124 are illustrated. However, it should be appreciated that the interconnect structure 120 may include any number of conductive features disposed in any number of dielectric layers. The interconnect structure 120 may be electrically connected to gate contacts 114 and source/drain vias 112 to form functional circuits. In some embodiments, the functional circuits formed by the interconnect structure 120 may include logic circuits, memory circuits, image sensor circuits, or the like.

Figure 21C:
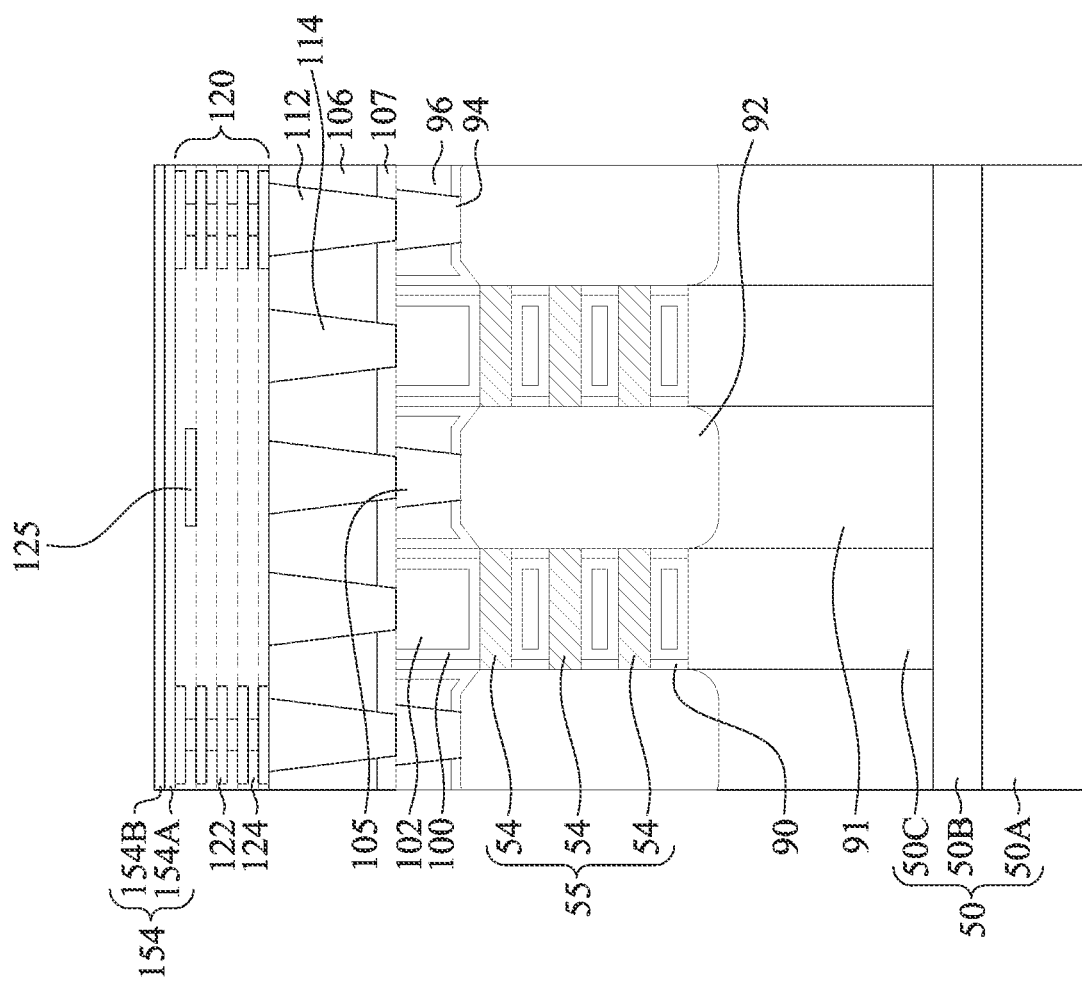

Reference is made to FIGS. 21A to 21C. A bonding layer 154 is formed over the interconnect structure 120. In some embodiments, the bonding layer 154 is a thermal conductive layer, and thus can be interchangeably referred to as thermal conductive layer 154 in this content. In some embodiments, the bonding layer 154 is an insulating material, which provides electrical isolation. In some embodiments, the bonding layer 154 is formed on the interconnect structure 120 by a suitable process, such as ALD, CVD, or spin coating.

The bonding layer 154 may include a material having thermal conductivity higher than that of the dielectric layers 124 of the interconnect structure 120, and may be higher than that of the carrier substrate (e.g., carrier substrate 150) to be bonded later. In some embodiments, the bonding layer 154 includes a material having thermal conductivity greater than about 0.39 W/m*K, such as from about 25 W/m*K to about than 290 W/m*K. In some embodiments, the bonding layer 154 may include a material such as aluminum nitride (AlN) or aluminum oxide ($Al_2O_3$). For example, the thermal conductivity of AlN is in a range from about 280 W/m*K to about 290 W/m*K, such as 285 W/m*K. The thermal conductivity of $Al_2O_3$ is in a range from about 25 W/m*K to about 35 W/m*K, such as 30 W/m*K.

In some embodiments, the bonding layer 154 may include a first layer 154A and a second layer 154B, in which the first layer 154A is between the interconnect structure 120 and the second layer 154B. In some embodiments, the first layer 154A is made of AlN, and the second layer 154B is made of $Al_2O_3$, and thus the first layer 154A has a higher thermal conductivity than the second layer 154B. In alternative embodiments, the first layer 154A is made of $Al_2O_3$, and the second layer 154B is made of AlN, and thus the first layer 154A has a lower thermal conductivity than the second layer 154B.

In some embodiments, the thickness of the bonding layer 154 is in a range from about 2000 Å to about 10000 Å. In some embodiments, the thickness of the first layer 154A of the bonding layer 154 is in a range from about 2000 Å to about 10000 Å, and the thickness of the second layer 154B of the bonding layer 154 is in a range from about A to about 500 Å. If the thickness of the bonding layer 154 is too low, the bonding layer 154 may not be sufficient to improve thermal management capability for wafer stacking or die stacking and/or to improve thermal dissipation. On the other hand, if the thickness of the bonding layer 154 is too large, manufacturing cost is increased without significant advantage.

In some embodiments, the bonding layer 154 may be a single-layer structure. That is, the bonding layer 154 may include only one of the first layer 154A and the second layer 154B. For example, the bonding layer 154 may be a single layer of AlN, or may be a single layer of $Al_2O_3$.

In some other embodiments, the bonding layer 154 may include a material such as SiC, SiN, SiCN, boron nitride (BN), diamond, diamond-like carbon (DLC), graphene oxide, graphite, or other suitable material. The material of the thermal conductive layer 154 may be monocrystalline or polycrystalline.

Figure 22C:
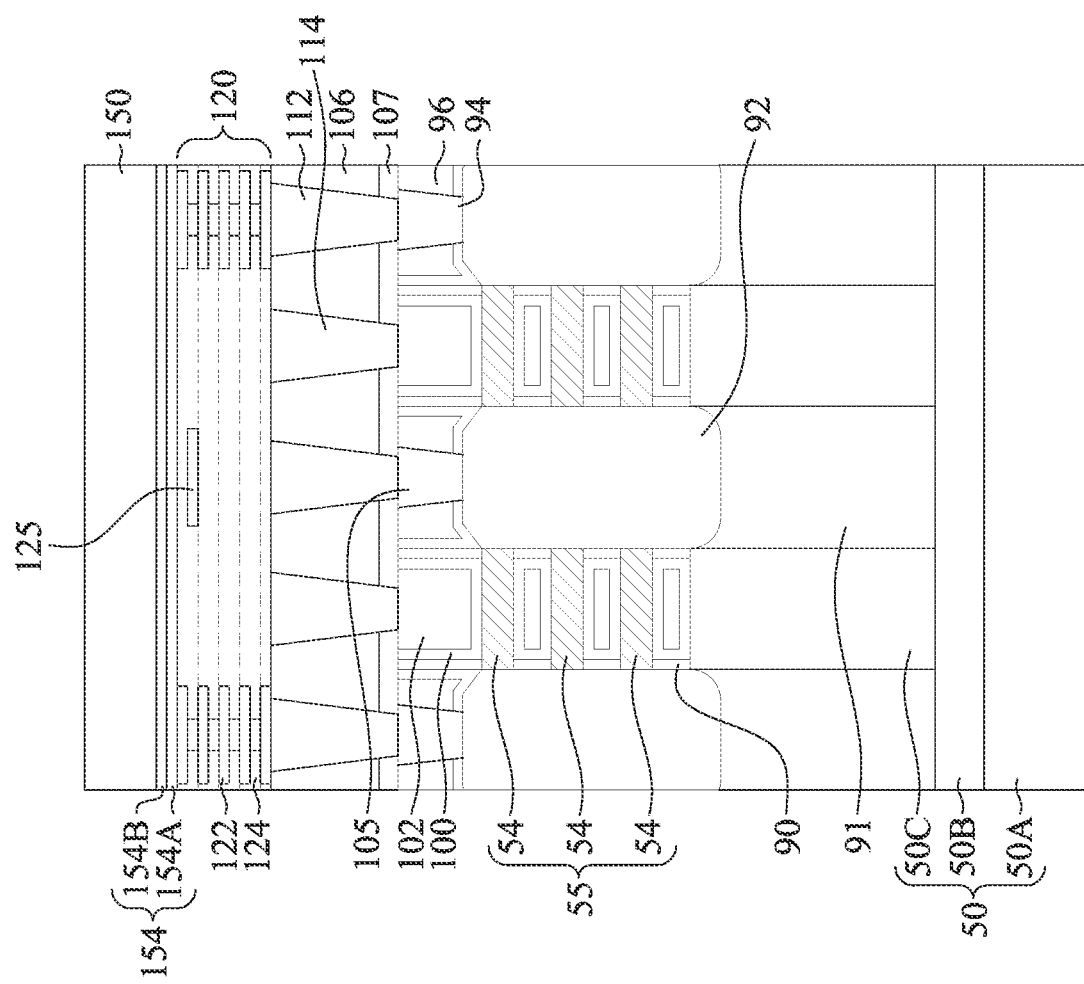

Reference is made to FIGS. 22A to 22C. A carrier substrate 150 is bonded to the bonding layer 154. Stated another way, the carrier substrate 150 is bonded to the interconnect structure 120 via the bonding layer 154. The carrier substrate 150 may be a glass carrier substrate, a ceramic carrier substrate, a semiconductor substrate (e.g., a silicon substrate), a wafer (e.g., a silicon wafer), or the like. The carrier substrate 150 may provide structural support during subsequent processing steps and in the completed device. The carrier substrate 150 be substantially free of any active or passive devices. In some embodiments, the thickness of the carrier substrate 150 is in a range from about 500 Å to about 5000 Å.

In various embodiments, the carrier substrate 150 may be bonded to the interconnect structure 120 using a suitable technique. In some embodiments, the bonding process may further include applying a surface treatment to the bonding layer 154. The surface treatment may include a plasma treatment. The plasma treatment may be performed in a vacuum environment. After the plasma treatment, the surface treatment may further include a cleaning process (e.g., a rinse with deionized water, or the like) that may be applied to the bonding layer 154. The carrier substrate 150 is then aligned with the interconnect structure 120 and the two are pressed against each other to initiate a pre-bonding of the carrier substrate 150 to the interconnect structure 120. The pre-bonding may be performed at room temperature (between about 21 degrees and about 25 degrees). After the pre-bonding, an annealing process may be applied by for example, heating the interconnect structure 120 and the carrier substrate 150 to a temperature of about 200° C. to about 400° C.

Figure 23C:
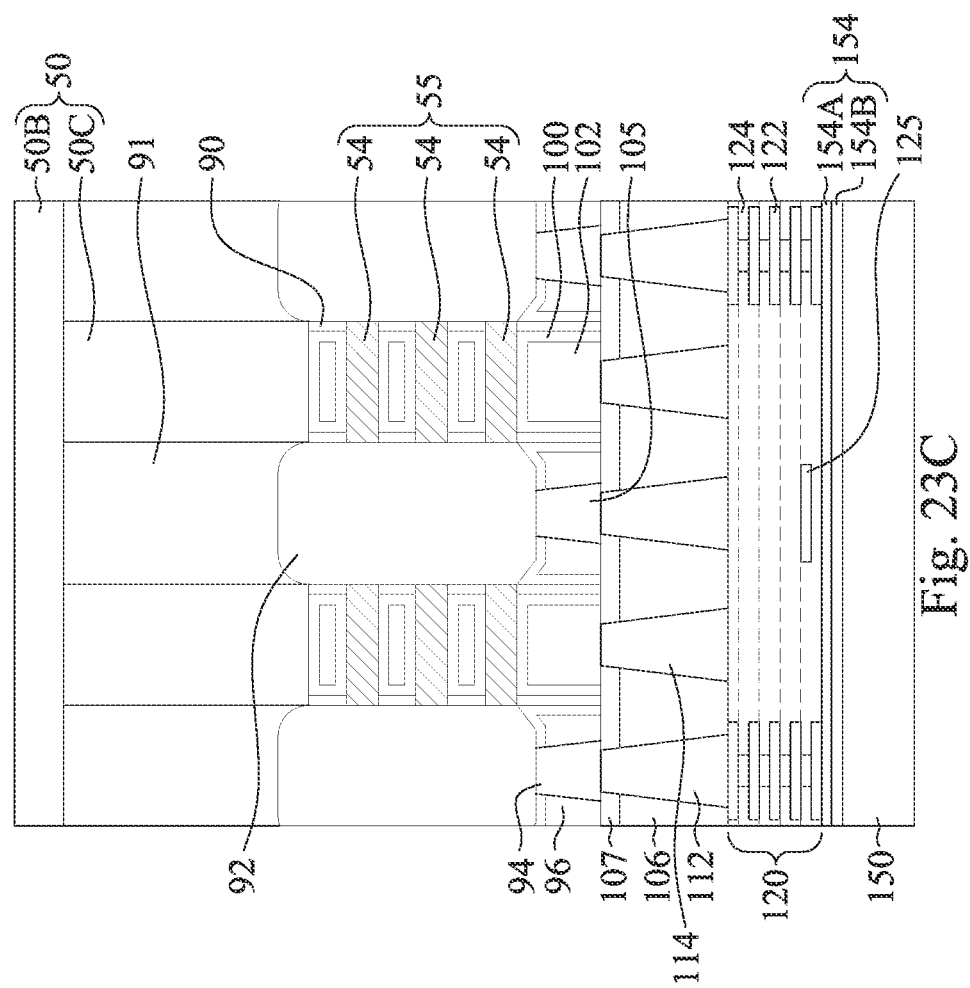

Reference is made to FIGS. 23A to 23C. After the carrier substrate 150 is bonded to the interconnect structure 120, the device may be flipped such that a backside of the substrate 50 faces upwards. The backside of the substrate 50 may refer to a side opposite to the front-side of the substrate 50 on which the device layer (e.g., layer including a transistor) is formed. Next, a CMP process is performed on the backside of the substrate 50. In some embodiments, the CMP process is controlled to remove the bulk silicon layer 50A of the substrate 50 until the oxide layer 50B of the substrate 50 is exposed.

Figure 24A:
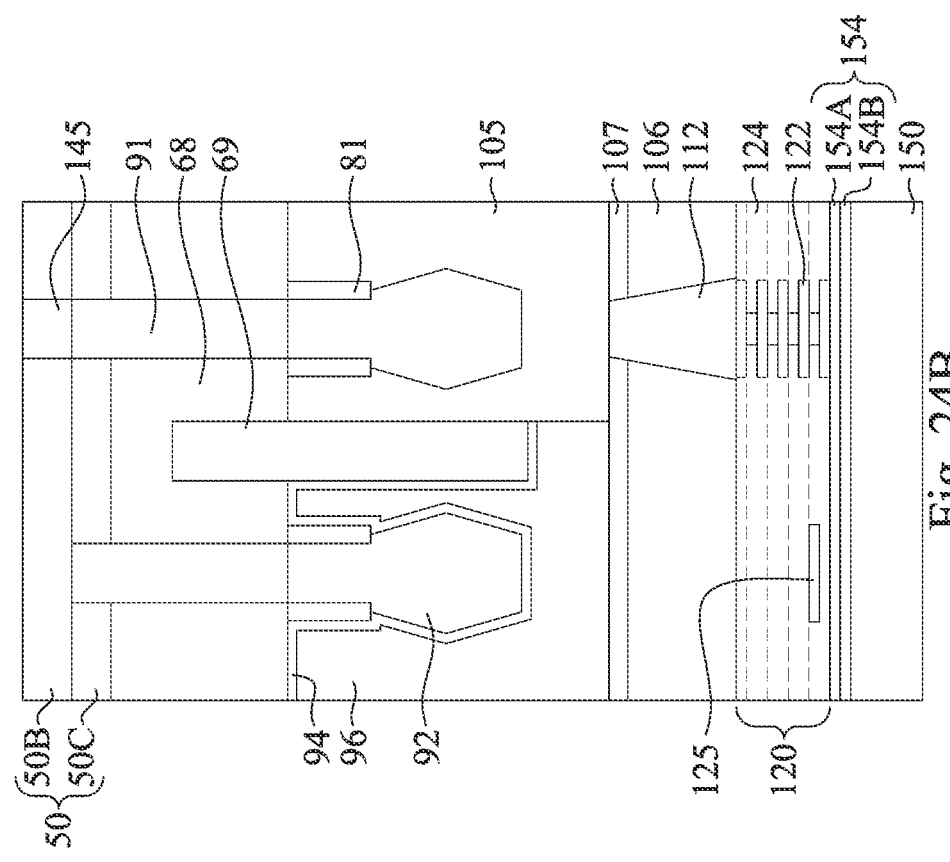
Figure 24B:
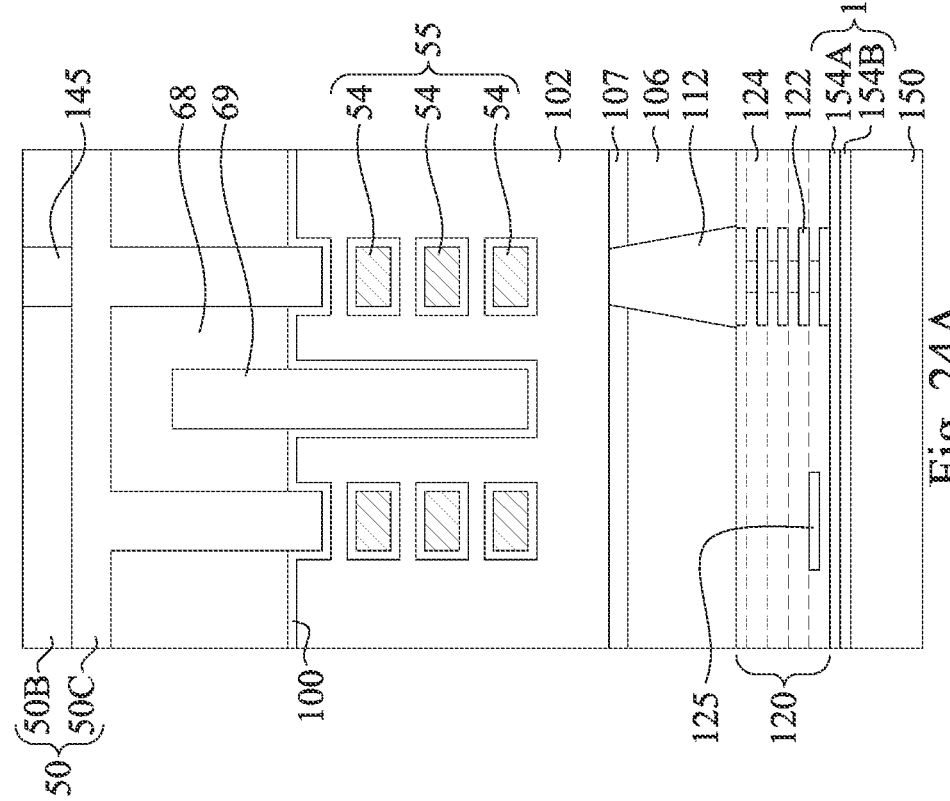
Figure 24C:
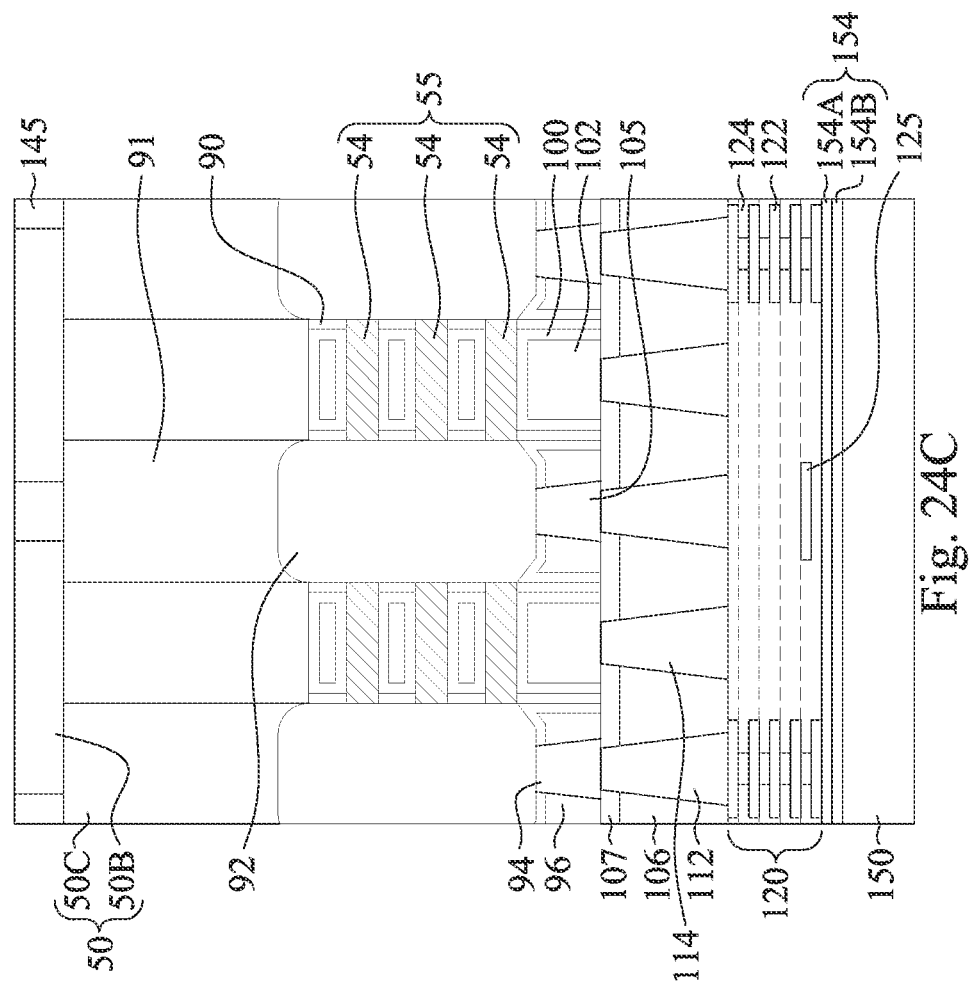

Reference is made to FIGS. 24A to 24C. Conductive vias 145 are formed in the oxide layer 50B of the substrate 50. In some embodiments, the conductive vias 145 are in physical contact with the epitaxial plugs 91, respectively. In some embodiments, the conductive vias 145 may be formed by, for example, patterning the oxide layer 50B of the substrate 50 to form openings that expose the epitaxial plugs 91, depositing a conductive material over the oxide layer 50B and filling the openings in the oxide layer and then performing a CMP process to remove excess conductive material until the oxide layer 50B is exposed. In some embodiments, the conductive vias 145 may include copper, silver, gold, tungsten, aluminum, combinations thereof, or the like. In some embodiments, the conductive vias 145 may also be referred to as backside vias.

Figure 25B:
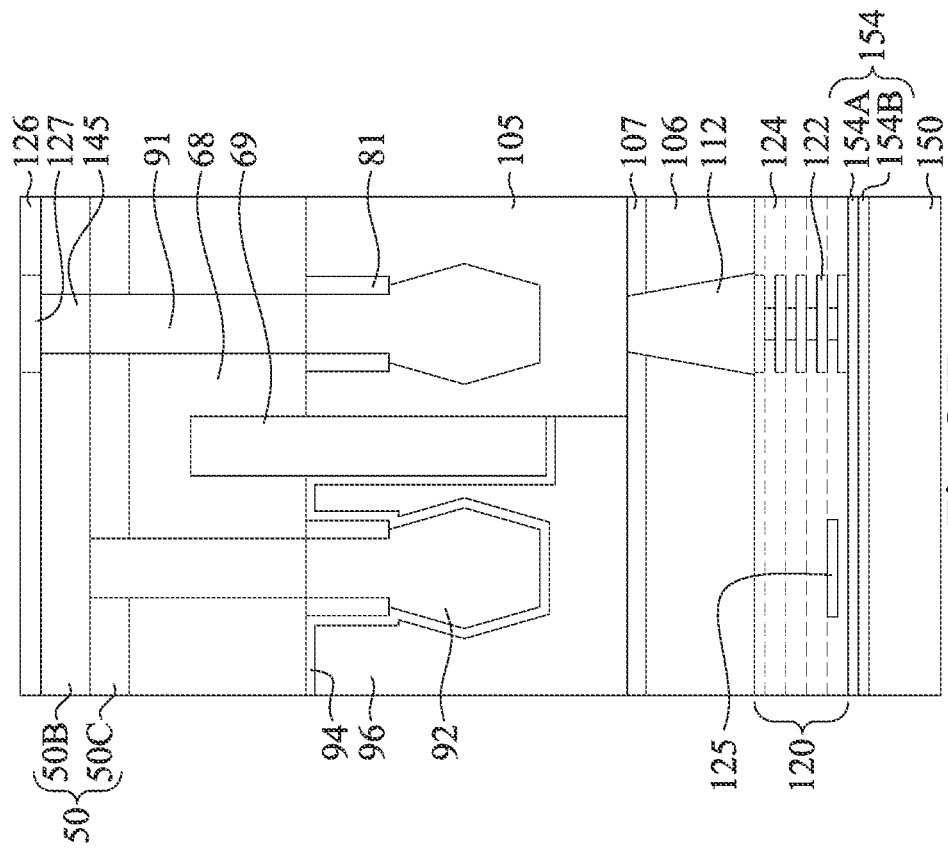
Figure 25A:
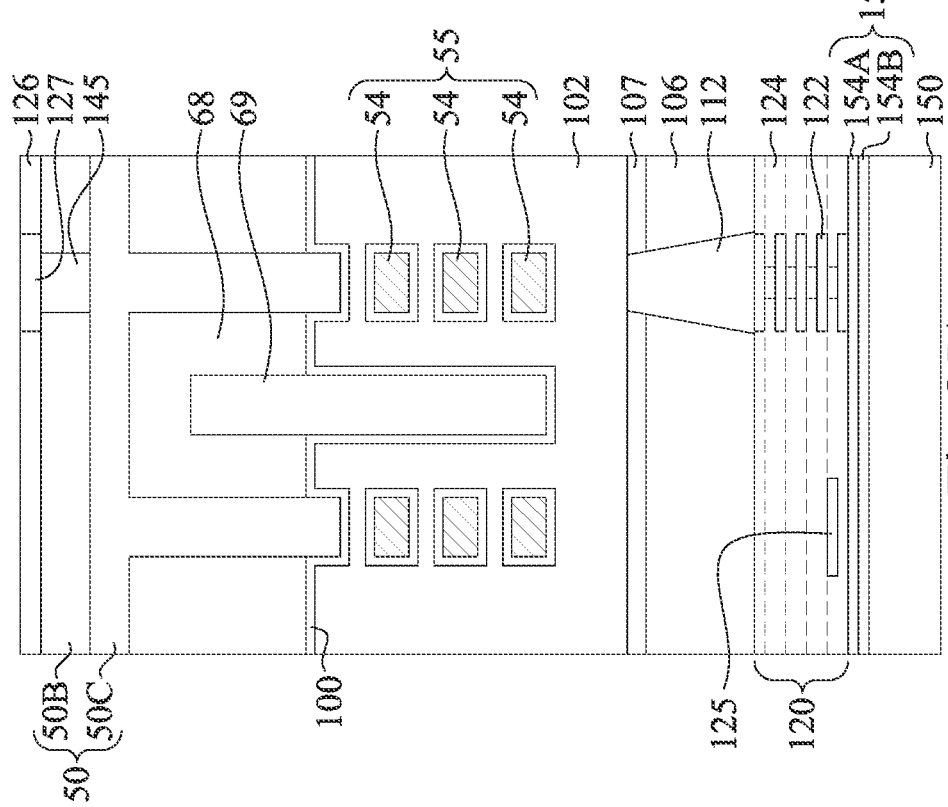
Figure 25C:
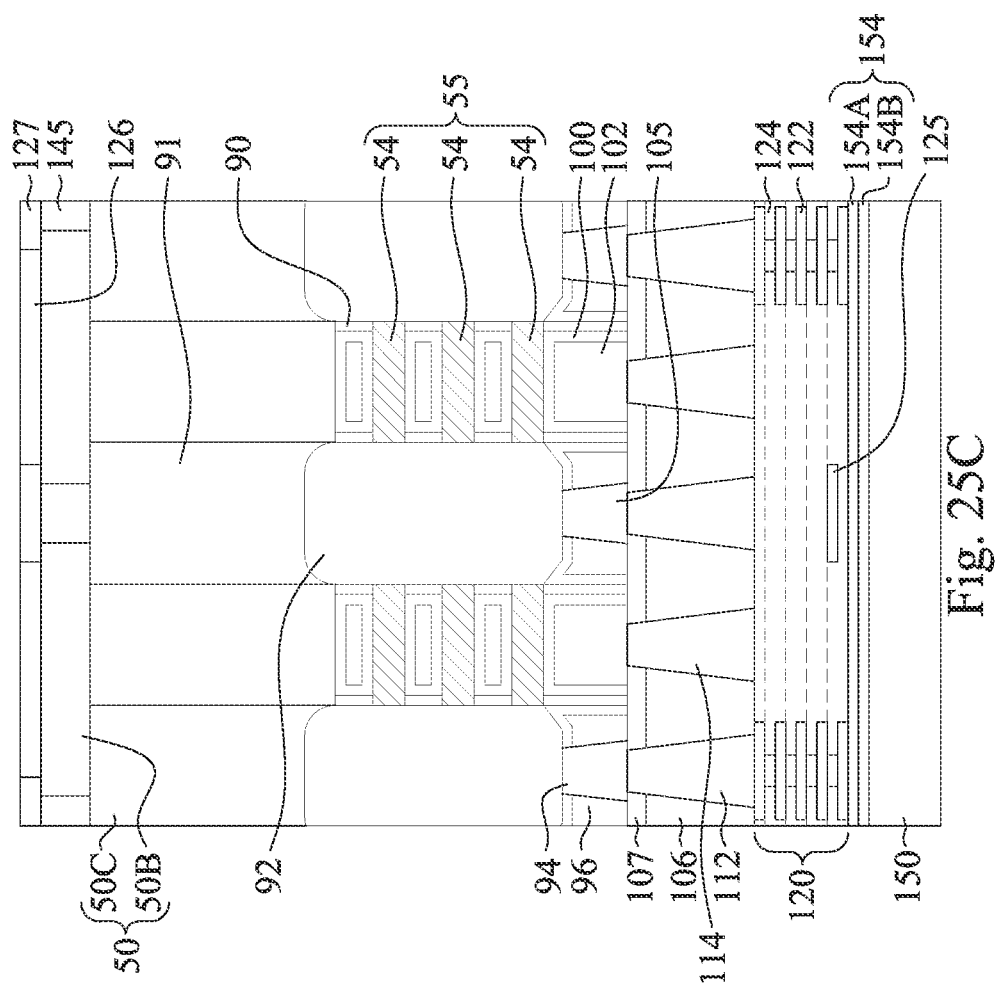

Reference is made to FIGS. 25A to 25C. A dielectric layer 126 is deposited on the oxide layer 50B of the substrate 50, and conductive pads 127 are formed in the dielectric layer 126. In some embodiments, the dielectric layer 126 may be formed by depositing a dielectric material over the oxide layer 50B, and optionally performing a CMP process to thin down the dielectric material. The conductive pads 127 may be formed by, for example, patterning the dielectric layer 126 to form openings, depositing a conductive material in the openings, and then performing a CMP process to remove excess conductive material until the top surface of the dielectric layer 126 is exposed. In some embodiments, the dielectric layer 126 may include phospho-silicate glass (PSG), boro-silicate glass (BSG), boron-doped phospho-silicate glass (BPSG), undoped silicate glass (USG), or the like. In some embodiments, the conductive pads 127 may include copper, silver, gold, tungsten, aluminum, combinations thereof, or the like.

Reference is made to FIGS. 26A to 26C. An interconnect structure 136 is formed over the dielectric layer 126. The interconnect structure 136 may also be referred to as a back-side interconnect structure because it is formed on a front-side of the substrate 50. In some embodiments, the interconnect structure 136 may include one or more layers of conductive features 160 formed in one or more stacked dielectric layers 158. The conductive features 160 and the dielectric layers 158 may be similar to the conductive features 122 and the dielectric layers 124 of the interconnect structure 120, and thus relevant details will not be repeated for simplicity.

Figure 27C:
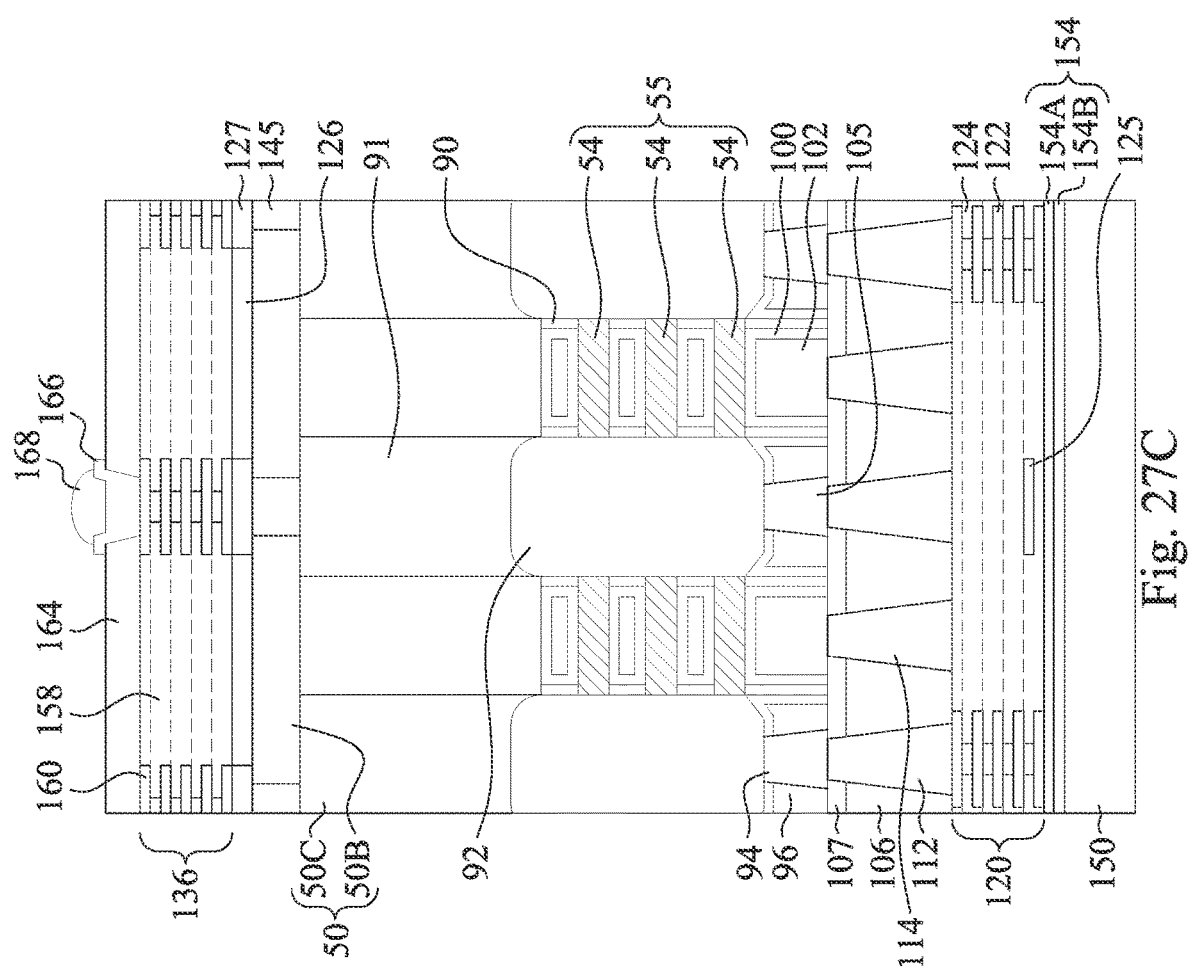

Reference is made to FIGS. 27A to 27C. A passivation layer 164, UBMs 166, and external connectors 168 are formed over the interconnect structure 136. The passivation layer 164 may include polymers such as PBO, polyimide, BCB, or the like. Alternatively, passivation layer 164 may include non-organic dielectric materials such as silicon oxide, silicon nitride, silicon carbide, silicon oxynitride, or the like. The passivation layer 164 may be deposited by, for example, CVD, PVD, ALD, or the like.

UBMs 166 are formed through the passivation layer 164 to the conductive features 140 in the interconnect structure 136, and external connectors 168 are formed on the UBMs 166. The UBMs 166 may comprise one or more layers of copper, nickel, gold, or the like, which are formed by a plating process, or the like. External connectors 168 (e.g., solder balls) are formed on the UBMs 166. The formation of external connectors 168 may include placing solder balls on the exposed portions of UBMs 166 and then reflowing the solder balls. In alternative embodiments, the formation of external connectors 168 includes performing a plating step to form solder regions over the topmost conductive feature 140 and then reflowing the solder regions. The UBMs 166 and the external connectors 168 may be used to provide input/output connections to other electrical components, such as, other device dies, redistribution structures, printed circuit boards (PCBs), motherboards, or the like. The UBMs 166 and the external connectors 168 may also be referred to as backside input/output pads that may provide signal, supply voltage, and/or ground connections to the nano-FETs described above.

The UBMs 166 and the external connectors 168 may be thermally connected to the device layer 115 and/or the conductive lines 134 (e.g., power rails) by the dummy features 142. Thus, the dummy features 142 may help thermally conduct heat away from the active devices and/or the conductive lines 134 through the backside interconnect structure 136 to an exterior of the semiconductor die. In some embodiments, the carrier substrate 150 is absent from the backside interconnect structure 136.

Figure 28A:
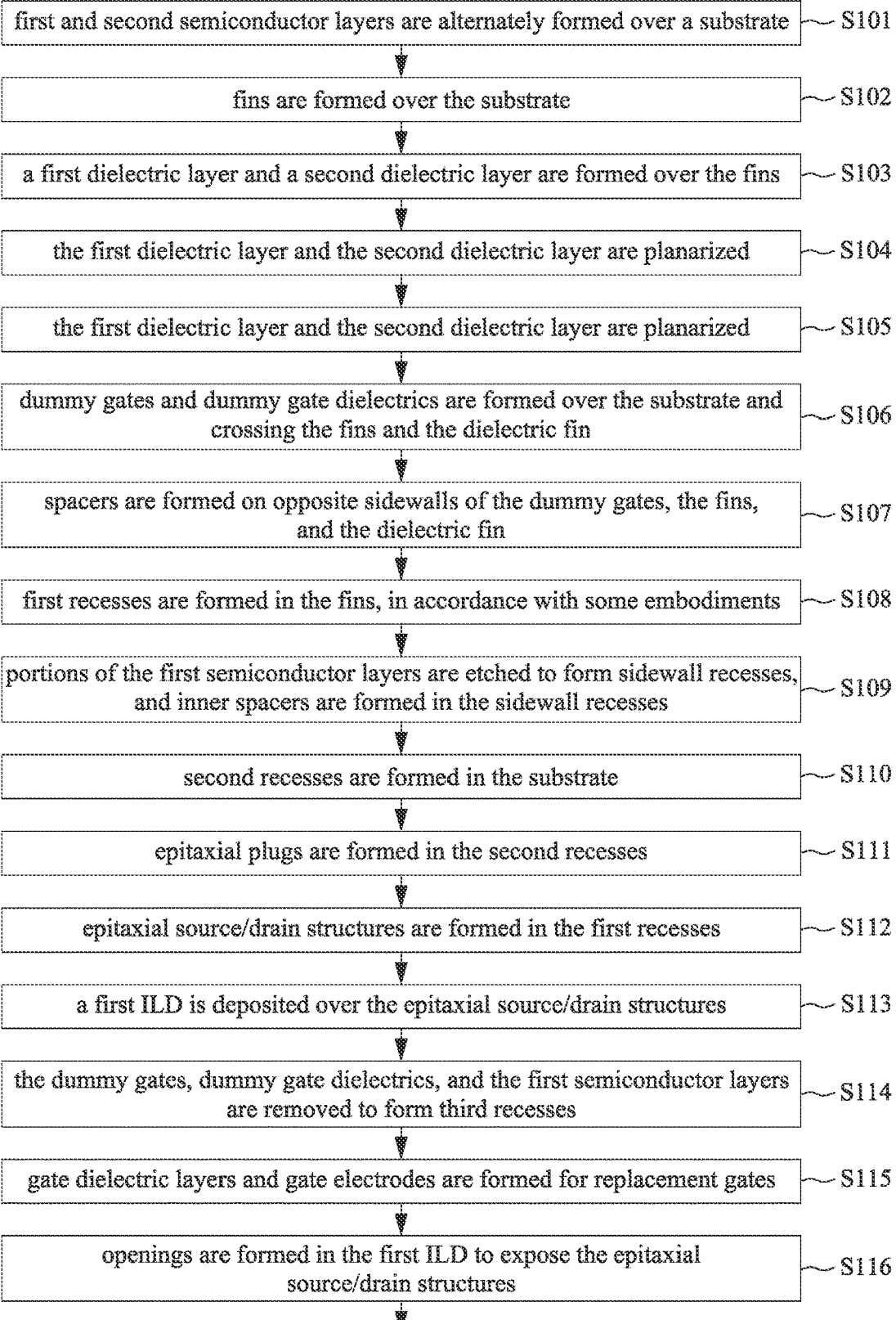
FIGS. 28A and 28B illustrate a method of forming a nano-FETs in accordance with some embodiments of the present disclosure.
Figure 28B:
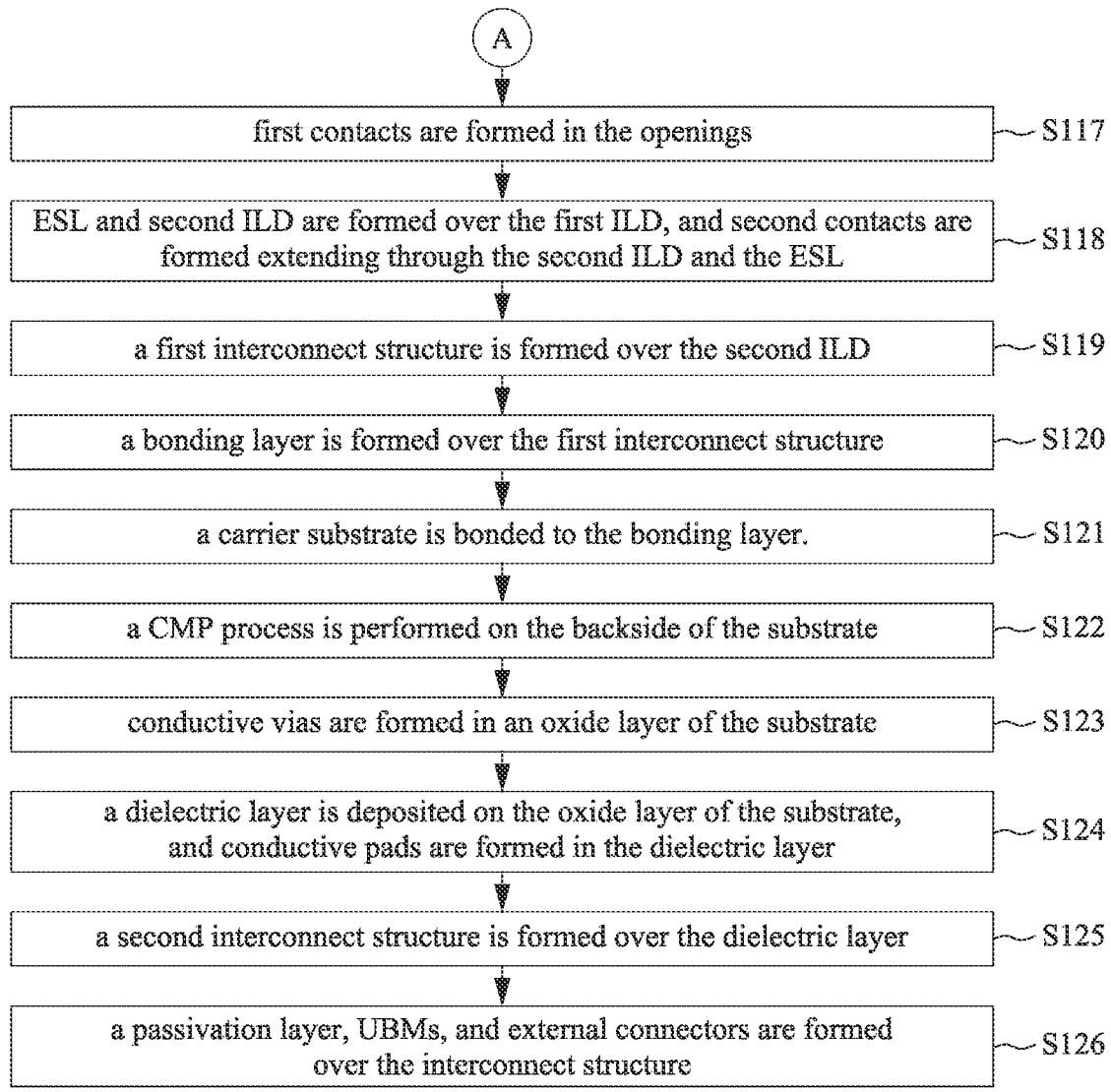

FIGS. 28A and 28B illustrate a method M1 of forming a nano-FETs in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At step S101, first and second semiconductor layers are alternately formed over a substrate. FIG. 2 illustrates a cross-sectional view of some embodiments corresponding to act in step S101.

At step S102, fins are formed over the substrate. FIG. 3 illustrates a cross-sectional view of some embodiments corresponding to act in step S102.

At step S103, a first dielectric layer and a second dielectric layer are formed over the fins. FIG. 4 illustrates a cross-sectional view of some embodiments corresponding to act in step S103.

At step S104, the first dielectric layer and the second dielectric layer are planarized. FIG. 5 illustrates a cross-sectional view of some embodiments corresponding to act in step S104.

At step S105, the first dielectric layer is etched back to form dielectric fin. FIG. 6 illustrates a cross-sectional view of some embodiments corresponding to act in step S105.

At step S106, dummy gates and dummy gate dielectrics are formed over the substrate and crossing the fins and the dielectric fin. FIGS. 7A to 7C illustrate cross-sectional views of some embodiments corresponding to act in step S106.

At step S107, spacers are formed on opposite sidewalls of the dummy gates, the fins, and the dielectric fin. FIGS. 8A to 8C illustrate cross-sectional views of some embodiments corresponding to act in step S107.

At step S108, first recesses are formed in the fins, in accordance with some embodiments. FIGS. 9A to 9C illustrate cross-sectional views of some embodiments corresponding to act in step S108.

At step S109, portions of the first semiconductor layers are etched to form sidewall recesses, and inner spacers are formed in the sidewall recesses. FIGS. 10A to 10C illustrate cross-sectional views of some embodiments corresponding to act in step S109.

At step S110, second recesses are formed in the substrate. FIGS. 11A to 11C illustrate cross-sectional views of some embodiments corresponding to act in step S110.

At step S111, epitaxial plugs are formed in the second recesses. FIGS. 12A to 12C illustrate cross-sectional views of some embodiments corresponding to act in step S111.

At step S112, epitaxial source/drain structures are formed in the first recesses. FIGS. 13A to 13C illustrate cross-sectional views of some embodiments corresponding to act in step S112.

At step S113, a first ILD is deposited over the epitaxial source/drain structures. FIGS. 14A to 14C illustrate cross-sectional views of some embodiments corresponding to act in step S113.

At step S114, the dummy gates, dummy gate dielectrics, and the first semiconductor layers are removed to form third recesses. FIGS. 15A to 15C illustrate cross-sectional views of some embodiments corresponding to act in step S114.

At step S115, gate dielectric layers and gate electrodes are formed for replacement gates. FIGS. 16A to 16C illustrate cross-sectional views of some embodiments corresponding to act in step S115.

At step S116, openings are formed in the first ILD to expose the epitaxial source/drain structures. FIGS. 17A to 17C illustrate cross-sectional views of some embodiments corresponding to act in step S116.

At step S117, first contacts are formed in the openings. FIGS. 18A to 18C illustrate cross-sectional views of some embodiments corresponding to act in step S117.

At step S118, ESL and second ILD are formed over the first ILD, and second contacts are formed extending through the second ILD and the ESL. FIGS. 19A to 19C illustrate cross-sectional views of some embodiments corresponding to act in step S118.

At step S119, a first n interconnect structure is formed over the second ILD. FIGS. 20A to 20C illustrate cross-sectional views of some embodiments corresponding to act in step S119.

At step S120, a bonding layer is formed over the first interconnect structure. FIGS. 21A to 21C illustrate cross-sectional views of some embodiments corresponding to act in step S120.

At step S121, a carrier substrate is bonded to the bonding layer. FIGS. 22A to 22C illustrate cross-sectional views of some embodiments corresponding to act in step S121.

At step S122, a CMP process is performed on the backside of the substrate. FIGS. 23A to 23C illustrate cross-sectional views of some embodiments corresponding to act in step S122.

At step S123, conductive vias are formed in an oxide layer of the substrate. FIGS. 24A to 24C illustrate cross-sectional views of some embodiments corresponding to act in step S123.

At step S124, a dielectric layer is deposited on the oxide layer of the substrate, and conductive pads are formed in the dielectric layer. FIGS. 25A to 25C illustrate cross-sectional views of some embodiments corresponding to act in step S124.

At step S125, a second interconnect structure is formed over the dielectric layer. FIGS. 26A to 26C illustrate cross-sectional views of some embodiments corresponding to act in step S125.

At step S126, a passivation layer, UBMs, and external connectors are formed over the interconnect structure. FIGS. 27A to 27C illustrate cross-sectional views of some embodiments corresponding to act in step S126.

Figure 29A:
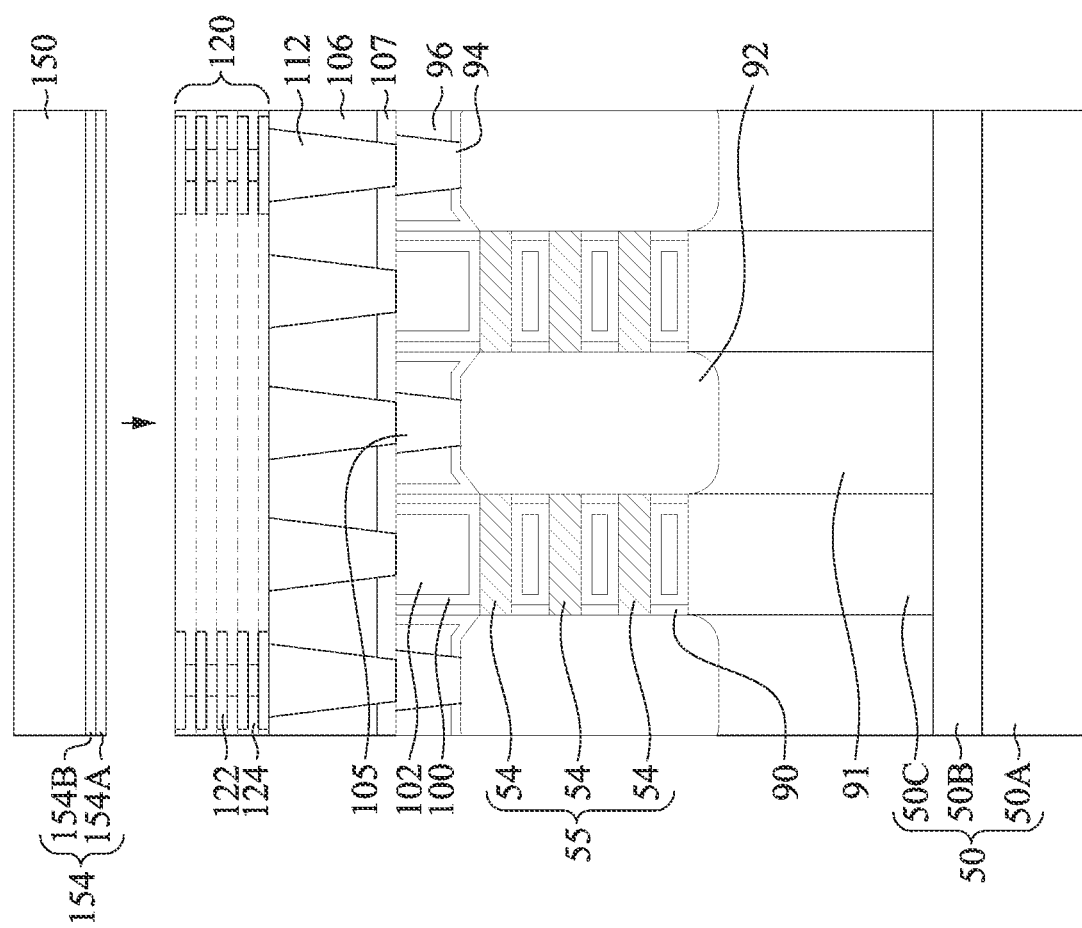
FIGS. 29A and 29B are cross-sectional views of intermediate stages in the manufacturing of nano-FETs, in accordance with some embodiments.
Figure 29B:
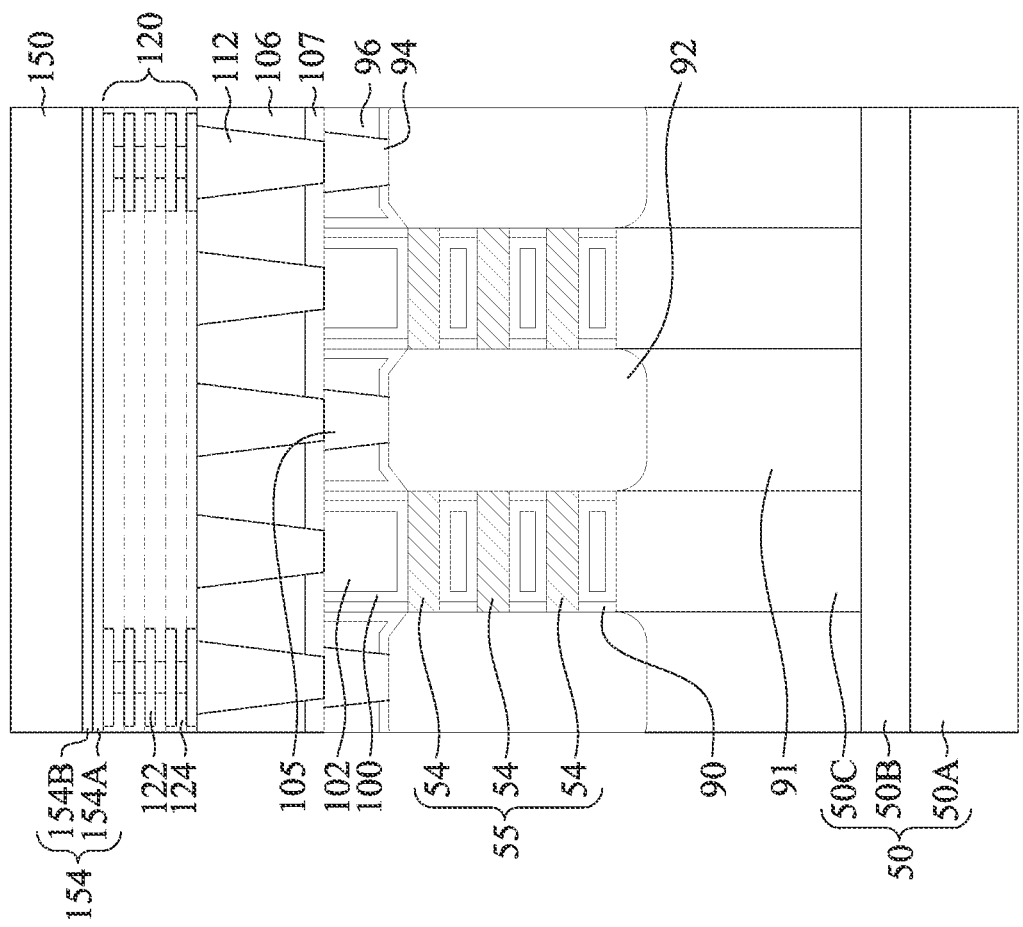

FIGS. 29A and 29B are cross-sectional views of intermediate stages in the manufacturing of nano-FETs, in accordance with some embodiments. Some elements of FIGS. 29A to 29B are similar to those described with respect to FIGS. 2 to 27C, such elements are labeled the same and details will not be repeated for simplicity. FIGS. 29A and 29B illustrate embodiments of bonding the interconnect structure 120 and carrier substrate 150.

Different from the embodiments of FIGS. 2 to 27C, in FIG. 29A, the bonding layer 154 is formed over the carrier substrate 150 before bonding the interconnect structure 120 and carrier substrate 150. That is, the surface of the interconnect structure 120 (e.g., the outmost dielectric layer 124 and the outmost conductive features 122) is free from coverage of a material of the bonding layer 154 before the bonding process.

Similarly, the bonding layer 154 may include a first layer 154A and a second layer 154B, in which the first layer 154A is between the carrier substrate 150 and the second layer 154B. In some embodiments, the first layer 154A is made of AlN, and the second layer 154B is made of $Al_2O_3$, and thus the first layer 154A has a higher thermal conductivity than the second layer 154B. In alternative embodiments, the first layer 154A is made of $Al_2O_3$, and the second layer 154B is made of AlN, and thus the first layer 154A has a lower thermal conductivity than the second layer 154B.

The interconnect structure 120 is bonded to the bonding layer 154, and the resulting structure is shown in FIG. 29B. Stated another way, the interconnect structure 120 is bonded to the carrier substrate 150 via the bonding layer 154. It is noted that the structure of FIG. 29B may undergo the processes described in FIGS. 23A to 27C, and relevant details will not be repeated for simplicity.

Figure 30A:
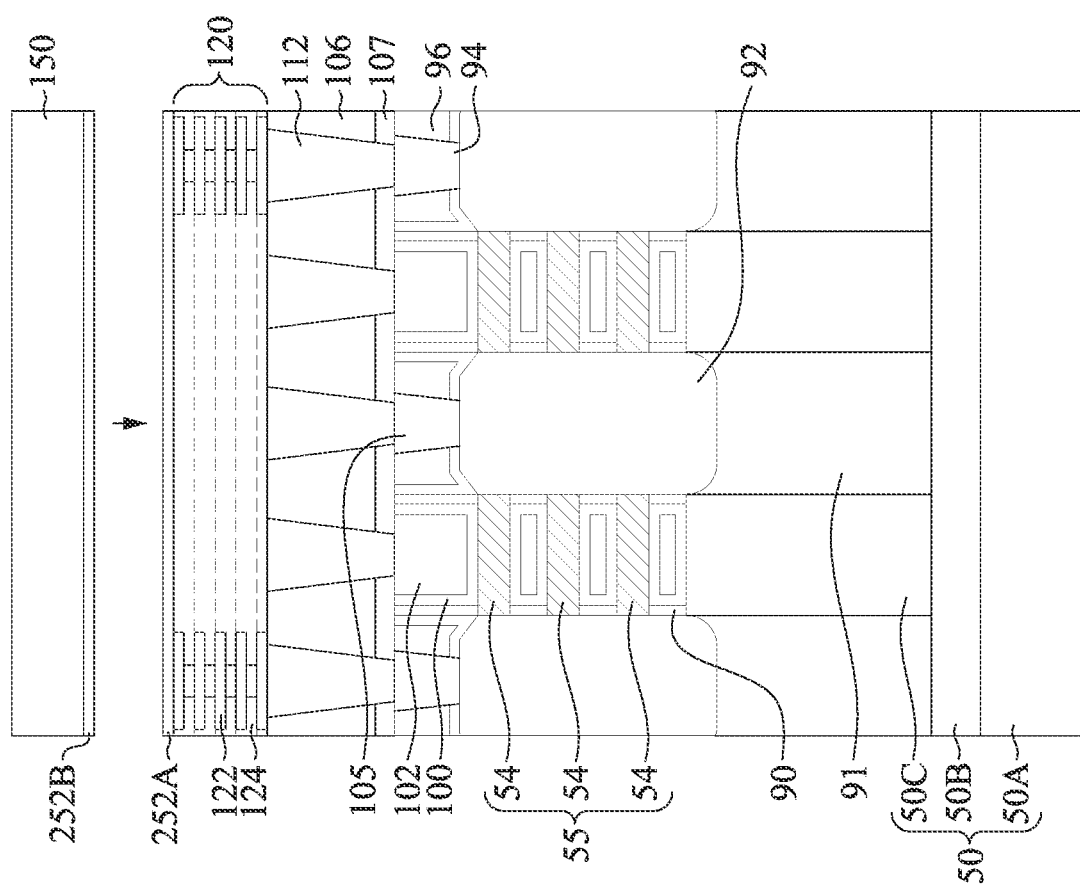
FIGS. 30A and 30B are cross-sectional views of intermediate stages in the manufacturing of nano-FETs, in accordance with some embodiments.
Figure 30B:
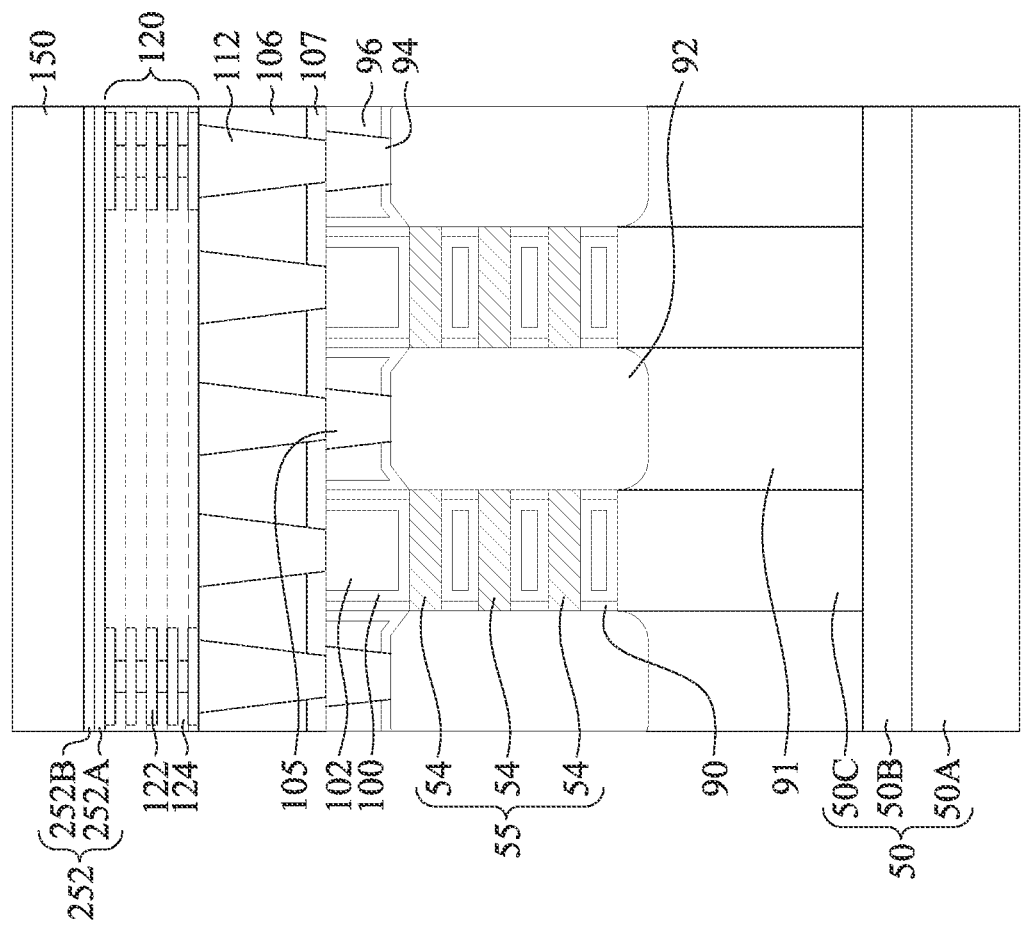

FIGS. 30A and 30B are cross-sectional views of intermediate stages in the manufacturing of nano-FETs, in accordance with some embodiments. Some elements of FIGS. 30A to 30B are similar to those described with respect to FIGS. 2 to 27C, such elements are labeled the same and details will not be repeated for simplicity. FIGS. 30A and 30B illustrate embodiments of bonding the interconnect structure 120 and carrier substrate 150.

In FIG. 30A, a first bonding layer 252A is formed on the carrier substrate 150 and a second bonding layer 252B is formed on the interconnect structure 120, respectively. In some embodiments, the first bonding layer 252A and the second bonding layer 252B may include a material such as aluminum nitride (AlN) or aluminum oxide (Al2O3). In some embodiments, the first bonding layer 252A and the second bonding layer 252B may include the same material. For example, the first bonding layer 252A and the second bonding layer 252B may both be made of AlN or both be made of Al2O3. On the other hand, the first bonding layer 252A and the second bonding layer 252B may include the different materials. For example, the first bonding layer 252A may be made of AlN, and the second bonding layer 252B may be made of Al2O3, and thus the first bonding layer 252A has a higher thermal conductivity than the second bonding layer 252B. Alternatively, the first bonding layer 252A may be made of AlN, and the second bonding layer 252B may be made of Al2O3, and thus the first bonding layer 252A has a higher thermal conductivity than the second bonding layer 252B.

Next, the first bonding layer 252A is bonded to the second bonding layer 252B, and the resulting structure is shown in FIG. 30B. Stated another way, the interconnect structure 120 is bonded to the carrier substrate 150 via the first bonding layer 252A and the second bonding layer 252B. In some embodiments, the first bonding layer 252A and the second bonding layer 252B may be collectively referred to as a composite bonding layer 252. It is noted that the structure of FIG. 30B may undergo the processes described in FIGS. 23A to 27C, and relevant details will not be repeated for simplicity.

Figure 31A:
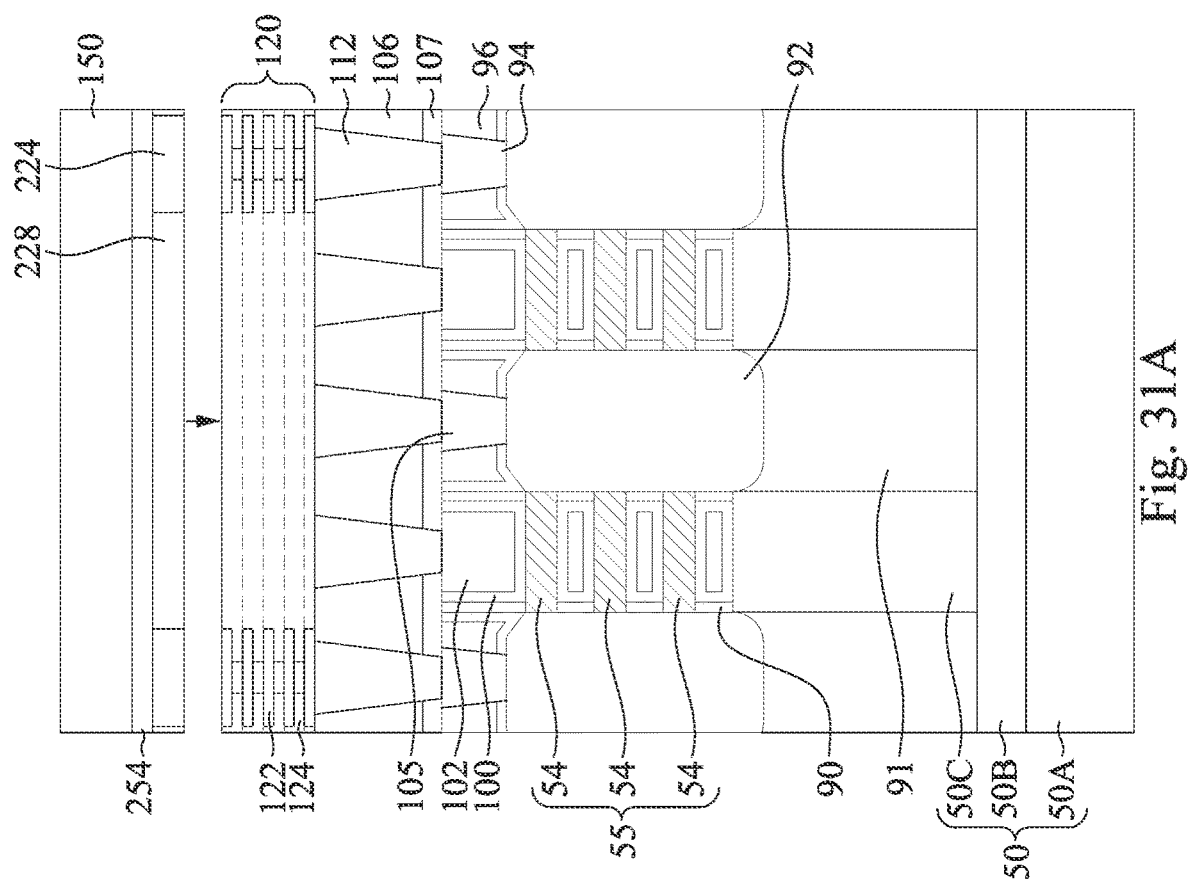
FIGS. 31A and 31B are cross-sectional views of intermediate stages in the manufacturing of nano-FETs, in accordance with some embodiments.
Figure 31B:
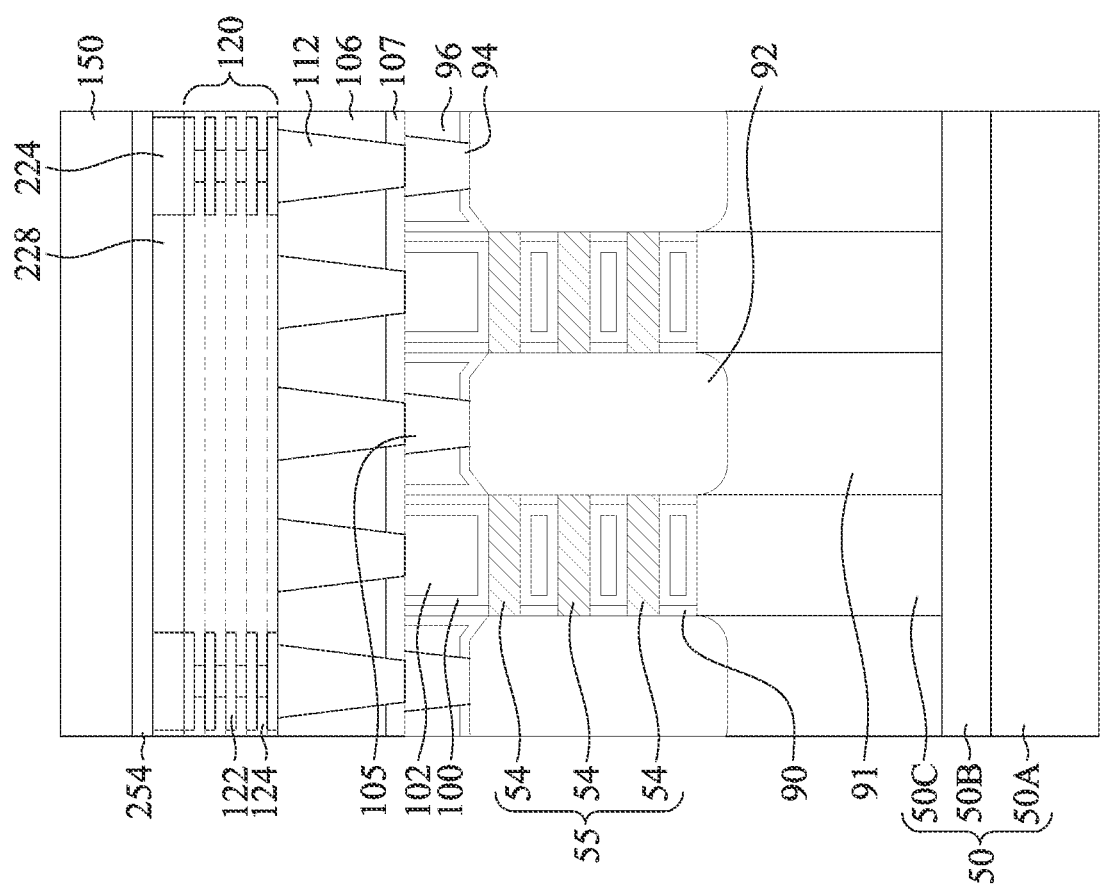

FIGS. 31A and 31B are cross-sectional views of intermediate stages in the manufacturing of nano-FETs, in accordance with some embodiments. Some elements of FIGS. 31A to 31B are similar to those described with respect to FIGS. 2 to 27C, such elements are labeled the same and details will not be repeated for simplicity. FIGS. 31A and 31B illustrate embodiments of bonding the interconnect structure 120 and carrier substrate 150.

In FIG. 31A, a thermal conductive layer 254 is formed on a surface of the carrier substrate 150 before the bonding process. In some embodiments, the thermal conductive layer 254 may be similar to the bonding layer 154 as discussed with respect to FIGS. 2 to 27C, and thus relevant details will not be repeated for simplicity. In some embodiments, the thickness of the thermal conductive layer 254 is in a range from about 50 Å to about 500 Å.

Next, a dielectric layer 228 is formed over the thermal conductive layer 254, and bond pads 224 are formed in the dielectric layer 128. In some embodiments, the dielectric layer 228 may include phospho-silicate glass (PSG), boro-silicate glass (BSG), boron-doped phospho-silicate glass (BPSG), undoped silicate glass (USG), or the like. In some embodiments, the bond pads 224 may include copper, silver, gold, tungsten, aluminum, combinations thereof, or the like. In some embodiments, the thermal conductive layer 254 has a higher thermal conductivity than the dielectric layer 228. In some embodiments, the dielectric layer 228 is thicker than the thermal conductive layer 254. For example, the thickness of the dielectric layer 228 is in a range from about 3000 Å to about 8000 Å.

Next, the dielectric layer 228 and the bond pads 224 are bonded to the interconnect structure 120 using hybrid bonding, and the resulting structure is shown in FIG. 31B. Stated another way, the interconnect structure 120 is bonded to the carrier substrate 150 via the dielectric layer 228, the bond pads 224, and the thermal conductive layer 254. In some embodiments, the hybrid bonding is performed such that the dielectric layer 228 is fusion bonded to the outmost dielectric layer 124 of the interconnect structure 120, and the bond pads 224 are directly bonded to the conductive features 122 with a metal-to-metal bond. It is noted that the structure of FIG. 31B may undergo the processes described in FIGS. 23A to 27C, and relevant details will not be repeated for simplicity.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that by employing a thermal conductive material as a bonding layer between a device substrate and a carrier substrate, which will improve thermal dissipation and electrical migration. In one embodiment, a simulation result shows that when applying the thermal conductive bonding layer, a temperature of a high resistance (HiR) resistor in an interconnect structure can be reduced from about 45.8° C. to about 37.5° C., which achieves at least about 18% improvement.

In some embodiments of the present disclosure, a method includes forming a transistor over a front side of a substrate, in which the transistor comprises a channel region, a gate region over the channel region, and source/drain regions on opposite sides of the gate region; forming a front-side interconnect structure over the transistor, wherein the front-side interconnect structure includes a dielectric layer and conductive features; and bonding the front-side interconnect structure to a carrier substrate via a bonding layer, in which the bonding layer is between the front-side interconnect structure and the carrier substrate, and the bonding layer has a higher thermal conductivity than the dielectric layer of the front-side interconnect structure.

In some embodiments of the present disclosure, a method includes forming a fin over a front side of a substrate; forming a gate structure and source/drain structures over the fin; forming a front-side interconnect structure over the transistor; forming a thermal conductive layer over a carrier substrate; forming a dielectric layer and bonding pads over the thermal conductive layer, in which the thermal conductive layer has a higher thermal conductivity than the dielectric layer; bonding the dielectric layer and the bonding pads to the front-side interconnect structure; and forming a backside interconnect structure over a back side of the substrate.

In some embodiments of the present disclosure, a semiconductor device includes a substrate, a transistor, a front-side interconnect structure, a thermal conductive layer, a carrier substrate, and a backside interconnect structure. The transistor is over the substrate, the transistor includes a channel region, a gate structure over the channel region, and source/drain structures on opposite sides of the gate structure. The front-side interconnect structure is over the transistor and a front side of the substrate. The carrier substrate is over the first interconnect structure. The thermal conductive layer is between the first interconnect structure and the carrier substrate, in which the thermal conductive layer has a thermal conductivity. The backside interconnect structure is over a backside of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a transistor over a front side of the substrate, the transistor comprises a channel region, a gate structure over the channel region, and source/drain structures on opposite sides of the gate structure;
a front-side interconnect structure over the transistor, wherein the front-side interconnect structure comprises a high resistance (HiR) resistor, and the HiR resistor is made of titanium nitride (TiN) or tantalum nitride (TaN);
a thermal conductive layer over the front-side interconnect structure, wherein the thermal conductive layer is made of an aluminum-containing material, and wherein the thermal conductive layer interfaces with a conductive feature of the front-side interconnect structure; and
a backside interconnect structure over a backside of the substrate.

2. The semiconductor device of claim 1, wherein the thermal conductive layer comprises a first layer in contact with the front-side interconnect structure, and a second layer over the first layer, and a thermal conductivity of a bulk material of the first layer is different from a thermal conductivity of a bulk material of the second layer.

3. The semiconductor device of claim 1, wherein the thermal conductive layer comprises a first layer in contact with the front-side interconnect structure, and a second layer over the first layer, and a thermal conductivity of a bulk material of the first layer is lower than a thermal conductivity of a bulk material of the second layer.

4. The semiconductor device of claim 1, wherein the thermal conductive layer comprises aluminum oxide or aluminum nitride.

5. The semiconductor device of claim 1, wherein the thermal conductive layer comprises a first layer in contact with the front-side interconnect structure, and a second layer over the first layer, and the first layer comprises aluminum nitride and the second layer comprises aluminum oxide.

6. The semiconductor device of claim 1, further comprising a carrier substrate over the thermal conductive layer.

7. A semiconductor device, comprising:
a substrate;
a transistor over a front side of the substrate, the transistor comprises a channel region, a gate structure over the channel region, and source/drain structures on opposite sides of the gate structure;
a front-side interconnect structure over the transistor, wherein the front-side interconnect structure comprises a high resistance (HiR) resistor, and the HiR resistor is made of titanium nitride (TiN) or tantalum nitride (TaN);
a bonding layer over the front-side interconnect structure, wherein the bonding layer comprises:
a first layer interfacing with a conductive feature of the front-side interconnect structure; and
a second layer in contact with the first layer, wherein the first layer is made of aluminum nitride, and the second layer is made of aluminum oxide; and
a backside interconnect structure over a back side of the substrate.

8. The semiconductor device of claim 7, further comprising a carrier substrate over the bonding layer.

9. The semiconductor device of claim 8, wherein the carrier substrate is made of a semiconductor material.

10. The semiconductor device of claim 7, wherein a thermal conductivity of a bulk material of the first layer is in a range from about 280 W/m*K to about 290 W/m*K.

11. A semiconductor device, comprising:
a substrate;
a transistor over a front side of the substrate, the transistor comprises a channel region, a gate structure over the channel region, and source/drain structures on opposite sides of the gate structure;
a front-side interconnect structure over the transistor, wherein the front-side interconnect structure comprises a high resistance (HiR) resistor, and the HiR resistor is made of titanium nitride (TiN) or tantalum nitride (TaN);
a bonding layer over the front-side interconnect structure, wherein the bonding layer is made of a metal-containing material; and
a carrier substrate over the bonding layer.

12. The semiconductor device of claim 11, further comprising a backside interconnect structure over a back side of the substrate.

13. The semiconductor device of claim 11, wherein the bonding layer comprises an aluminum oxide layer and an aluminum nitride layer.

14. The semiconductor device of claim 13, wherein the aluminum oxide layer is in contact with the carrier substrate.

15. The semiconductor device of claim 13, wherein the aluminum nitride layer is in contact with the front-side interconnect structure.

16. The semiconductor device of claim 11, wherein the bonding layer comprises:
a first layer, wherein a thickness of the first layer is in a range from about 2000 Å to about 10000 Å; and
a second layer over the first layer, wherein a thickness of the second layer is in a range from about 50 Å to about 500 Å.

17. The semiconductor device of claim 16, wherein the first layer is made of aluminum nitride layer and the second layer is made of aluminum oxide layer.

18. The semiconductor device of claim 11, wherein the HiR resistor is higher than a bottom surface of the front-side interconnect structure and is lower than a top surface of the front-side interconnect structure.

19. The semiconductor device of claim 11, wherein the HiR resistor has a bar-shape cross-sectional profile and vertically overlaps one of the source/drain structures of the transistor.

20. The semiconductor device of claim 1, wherein the HiR resistor has a bar-shape cross-sectional profile and vertically overlaps one of the source/drain structures of the transistor or of the transistor.

\* \* \* \* \*